(12) United States Patent
Kim et al.

(10) Patent No.: US 8,304,824 B2
(45) Date of Patent: Nov. 6, 2012

(54) SEMICONDUCTOR DEVICE COMPRISING BURIED WORD LINES

(75) Inventors: Hui-Jung Kim, Seoul (KR); Yong-Chul Oh, Suwon-si (KR); Hyun-Woo Chung, Seoul (KR); Hyun-Gi Kim, Hwaseong-si (KR); Kang-Uk Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 226 days.

(21) Appl. No.: 12/719,493

(22) Filed: Mar. 8, 2010

(65) Prior Publication Data

US 2011/0068384 A1  Mar. 24, 2011

(30) Foreign Application Priority Data

Sep. 24, 2009  (KR) .......................... 10-2009-0090560

(51) Int. Cl.
*H01L 27/108* (2006.01)
*H01L 29/94* (2006.01)

(52) U.S. Cl. ................. 257/302; 257/306; 257/E27.084
(58) Field of Classification Search .................. 257/330, 257/331, 296, 302, 306, 334, 329, 268
See application file for complete search history.

(56) References Cited

U.S. PATENT DOCUMENTS

2008/0173936 A1* 7/2008 Yoon et al. .................. 257/329
2009/0108318 A1* 4/2009 Yoon et al. .................. 257/306

FOREIGN PATENT DOCUMENTS

| JP | 11-054728 | 2/1998 |
| KR | 10-015012 | 6/1998 |
| KR | 10-0763336 | 9/2007 |

OTHER PUBLICATIONS

English Abstract for Publication No. 10-015012.
English Abstract for Publication No. 11-054728.
English Abstract for Publication No. 10-0763336.

* cited by examiner

*Primary Examiner* — Phat X Cao
*Assistant Examiner* — Nga Doan
(74) *Attorney, Agent, or Firm* — F. Chau & Associates, LLC

(57) ABSTRACT

A semiconductor device includes: an isolation layer for defining a plurality of active areas of a substrate, where the isolation layer is disposed on the substrate; a plurality of buried word lines having upper surfaces that are lower than the upper surfaces of the active areas, being surrounded by the active areas, and extending in a first direction parallel to a main surface of the substrate; a gate dielectric film interposed between the buried word lines and the active areas; and a plurality of buried bit lines having upper surfaces that are lower than the upper surfaces of the plurality of buried word lines and extending parallel to the main surface of the substrate in a second direction that differs from the first direction.

20 Claims, 53 Drawing Sheets

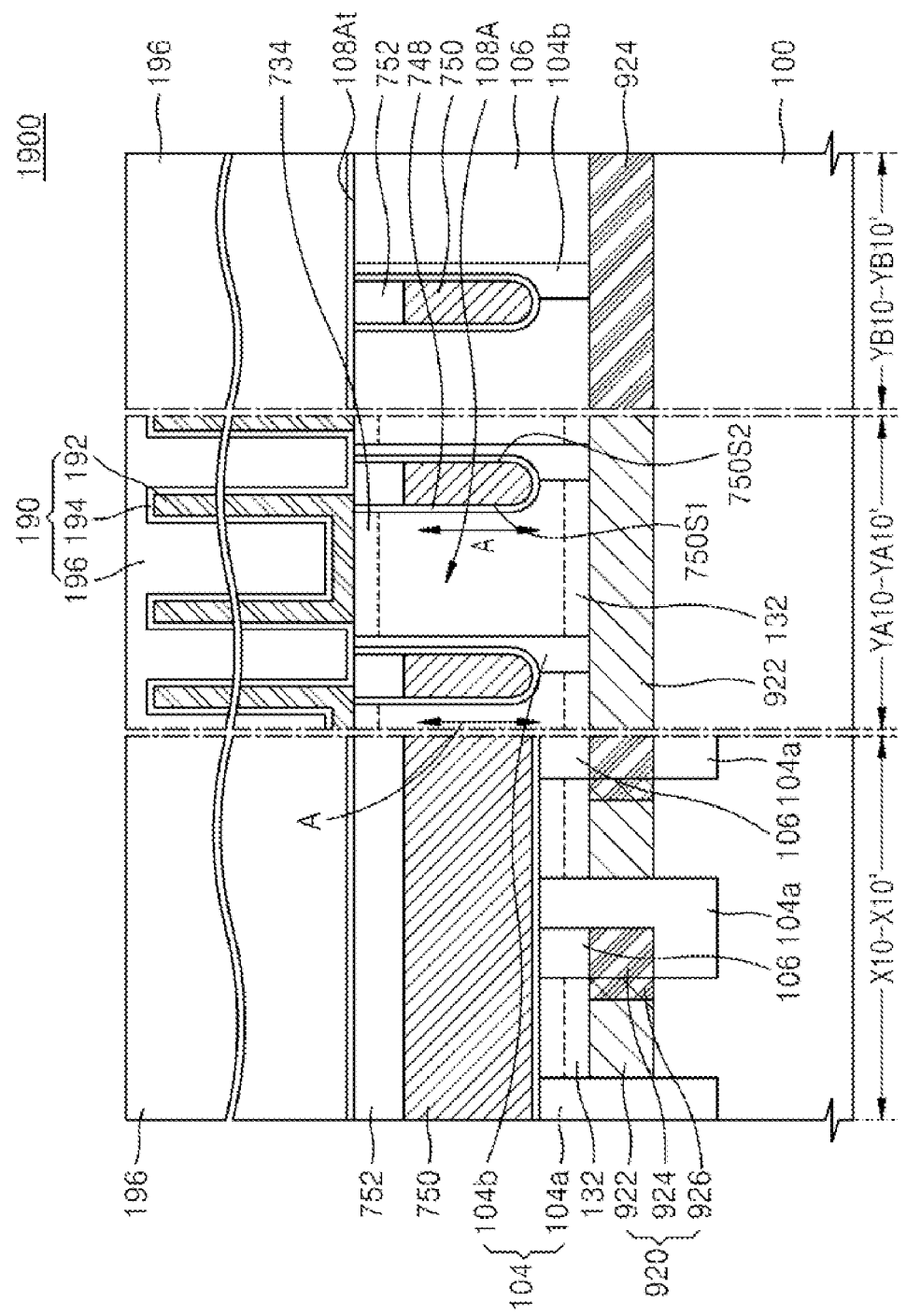

SEMICONDUCTOR DEVICE COMPRISING BURIED WORD LINES

CROSS-REFERENCE TO RELATED APPLICATION

This application claims priority under 35 U.S.C. §119 from Korean Patent Application No. 10-2009-0090560, filed on Sep. 24, 2009, in the Korean Intellectual Property Office, the contents of which are herein incorporated by reference in their entirety.

BACKGROUND

The inventive concept relates to a semiconductor device, and more particularly, to a semiconductor device including buried word lines.

As the degree of integration of semiconductor devices increases, design rule parameters for elements included in the semiconductor devices are being reduced. In particular, in semiconductor devices requiring a large number of transistors, a gate length, which is one of the design rule parameters, is being reduced and accordingly, a channel length is also being decreased. To increase an effective channel length by extending the distance between a source and a drain in a transistor of a highly-scaled semiconductor device, buried gate type transistors have been introduced. In a buried gate type transistor, a trench is formed in a substrate and a gate of the transistor is formed in the trench.

SUMMARY

Embodiments of the inventive concept provide a semiconductor device including a transistor having buried word lines which may be highly reliable and highly integrated.

Embodiments of the inventive concept provide a method of manufacturing a semiconductor device, which minimize defect generation due to short circuits between adjacent conductive layers and simplify the manufacturing process for a highly integrated device.

According to an aspect of the inventive concept, there is provided a semiconductor device including: an isolation layer for defining a plurality of active areas of a substrate, wherein the isolation layer is disposed on the substrate; a plurality of buried word lines having upper surfaces lower than the upper surfaces of the active areas, being surrounded by the active areas, and extending in a first direction parallel to a main surface of the substrate; a gate dielectric film interposed between the buried word lines and the active areas; and a plurality of buried bit lines having upper surfaces lower than the upper surfaces of the plurality of buried word lines, being parallel to the main surface of the substrate, and extending in a second direction that differs from the first direction.

The isolation layer may have a network structure comprising a plurality of first isolation portions and a plurality of second isolation portions, the plurality of first isolation portions extending in the second direction and the plurality of second isolation portions crossing the plurality of first isolation portions and extending in the first direction. The width of the first isolation portions may be greater than the width of the second isolation portions. The distance from the upper surfaces of the active areas to the lower surfaces of the first isolation portions may be greater than the distance from the upper surfaces of the active areas to the lower surfaces of the second isolation portions.

When viewed from the upper surface of the substrate, any one buried bit line of the plurality of buried bit lines may overlap the plurality of active areas arranged in a line in the second direction and the plurality of second isolation portions arranged in a line interposed between the plurality of active areas.

When viewed from the upper surface of the substrate, any one buried bit line selected from the plurality of buried bit lines may include a first bit line portion and a second bit line portion, the first bit line portion being overlapped with the plurality of active areas arranged in a line in the second direction and the plurality of second isolation portions arranged in a line interposed between the plurality of active areas, and the second bit line portion extending in the first direction from the first bit line portion and being surrounded by the first isolation portions. The first bit line portion and the second bit line portion may include materials that differ from each other.

The buried bit lines may further include a metal silicide layer interposed between the first bit line portion and the second bit line portion.

The semiconductor device may further include a first source/drain area in the active areas connected to the buried bit lines, a second source/drain area formed in an upper surface of the active areas, and a channel area formed in the active areas between the first source/drain area and the second source/drain area. The semiconductor device may further include capacitors each comprising lower electrodes formed on the substrate and electrically connected to the second source/drain area.

Both sidewalls of the buried word lines may be surrounded by the active areas. The upper surface of any one of the plurality of active areas may include a first upper surface and a second upper surface disposed at both sides of the buried word lines and spaced apart from each other, in which each of the upper surfaces of the active areas extends to the isolation layer from gate dielectric films formed on the sidewalls of the buried word lines, and the second source/drain area is formed in each of the first and second surfaces.

Each of the lower electrodes may directly contact the second source/drain area formed on the first upper surface and the second upper surface. Each of the lower electrodes may be electrically connected to the second source/drain area formed on the first upper surface and the second upper surface through conductive landing pads formed on the buried word lines.

Each of the buried word lines may include first sidewalls and second sidewalls opposite to the first side walls, the first sidewalls being surrounded by the active areas and the second sidewalls being surrounded by the isolation layer. Each of the upper surfaces of the active areas may extend to the isolation layer from gate dielectric films formed on the first sidewalls of the buried word lines.

Each of the lower electrodes may directly contact the second source/drain area on the upper surfaces of the active areas. Each of the lower electrodes may be electrically connected to the second source/drain area formed on the upper surfaces of the active areas through conductive landing pads formed on the buried word lines.

The width of the buried word lines in the second direction may be less than the width of the buried bit lines in the first direction. The width of the active areas in the first direction may be less than a repeating pitch of the plurality of buried word lines in the second direction.

The first bit line portion is an ion implantation area in the substrate into which ion impurities are implanted.

The buried bit lines may include a metal containing film extending in the first direction from the active areas and surrounded by the isolation layer.

According to another aspect of the inventive concept, there is provided a semiconductor device including: a plurality of buried word lines formed in a substrate comprising a plurality of active areas having upper surfaces lower than the upper surface of the substrate and extending parallel to a main surface of the substrate; a plurality of buried bit lines formed in the substrate having upper surfaces lower than the upper surfaces of the plurality of buried word lines and extending parallel to the main surface of the substrate in a different extending direction from the buried word lines; a first source/drain area in the active areas in contact with the plurality of buried bit lines; a second source/drain area formed on an upper surface of the active areas; and a channel area in the active areas between the first source/drain area and the second source/drain area extending perpendicular to the main surface of the substrate.

According to another aspect of the inventive concept, there is provided a method of manufacturing a semiconductor device including: forming a plurality of buried bit lines extending parallel to each other in a plurality of active areas of a substrate; and forming a plurality of buried word lines in the plurality of active areas having upper surfaces lower than the upper surface of the substrate and extending parallel to each other in a different direction from the plurality of buried bit lines.

The method may further include forming an isolation layer for defining the plurality of active areas of the substrate. Forming the plurality of buried bit lines may include forming a first ion implantation area in the substrate, forming first isolation portions passing through the first ion implantation area separating the first ion implantation area into a plurality of first bit line portions.

Forming the plurality of buried bit lines may include, after separating the first ion implantation area into the plurality of first bit line portions, removing part of the first isolation portions to form a plurality of trenches exposing parts of the plurality of first bit line portions, and forming a plurality of second bit line portions in the plurality of trenches to cover the exposed first bit line portions. The method may further include, after the plurality of second bit line portions are formed, inducing a reaction of the first bit line portion and the second bit line portions whose reaction product forms a third bit line portion between the first bit line portion and the second bit line portions.

The method may further include forming a plurality of first isolation portions extending parallel to each other in the substrate. Forming the plurality of buried bit lines may include removing parts of the plurality of first isolation portions to form a plurality of trenches exposing parts of the active areas, and forming a plurality of first bit line portions contacting the active areas at the bottom of the plurality of trenches.

The method may further include, after the plurality of first bit line portions are formed, inducing a reaction of the active areas and the first bit line portions whose reaction product forms a second bit line portion interposed between the active areas and the first bit line portions.

The method may further include, before forming the plurality of buried word lines, forming an isolation layer for defining the plurality of active areas of the substrate, and forming a plurality of first source/drain areas in the substrate. Forming the plurality of buried bit lines may include forming a first ion implantation area in the substrate, forming a second ion implantation area on the first ion implantation area in contact with the first ion implantation area, forming a plurality of first isolation portions passing through the first ion implantation area and the second ion implantation area to separate the first ion implantation area into the plurality of buried bit lines, and separate the second ion implantation area into the plurality of first source/drain areas.

Forming the isolation layer may include forming the plurality of first isolation portions extending in a direction parallel to the buried bit line and forming a plurality of second isolation portions crossing the plurality of first isolation portions and extending in a direction different from the first isolation portions.

The method may include, before forming the plurality of buried word lines, forming trenches exposing the active areas by etching parts of the active areas interposed between two adjacent second isolation portions and forming a gate dielectric film on the surface of the active areas exposed at inner walls of the trenches. Forming the plurality of buried word lines may include forming a conductive layer on the gate dielectric film to fill parts of the trenches.

Also, before forming the plurality of buried word lines, the method may include simultaneously forming trenches exposing the second isolation portions and the active areas by etching parts of the second isolation portions and the active areas and forming a gate dielectric film on the surfaces of the active areas exposed at the inner walls of the trenches. To form the plurality of buried word lines, the method may include forming a conductive layer on the gate dielectric film to fill parts of the trenches.

After forming the plurality of buried word lines, the method may include forming a plurality of second source/drain areas facing the plurality of first source/drain areas on the parts exposed on the upper surface of the substrate.

The plurality of buried word lines may be formed along both side walls thereof to face the active areas. The second source/drain areas in one active area may be formed in two areas in the substrate spaced apart from each other with the buried word lines therebetween.

Also, the method may include forming a capacitor having a lower electrode connected to each of the two spaced apart areas of the second source/drain area on the buried word lines. The lower electrode may be formed to directly contact the two spaced apart areas of the second source/drain area.

Before forming the lower electrode, the method may include forming conductive landing pads directly contacting the two spaced apart areas of the second source/drain area. The lower electrode may be formed to directly contact the conductive landing pads.

The plurality of buried word lines may be formed along one side wall to face the active areas and the other side wall to face the isolation layer. The second source/drain area in one active area may be continuously extended on the surface of the substrate.

According to another aspect of the inventive concept, there is provided a method of manufacturing a semiconductor device including: forming a first ion implantation area in a substrate; forming a second ion implantation area on the first ion implantation area in contact with the first ion implantation area; simultaneously separating the first ion implantation area into a plurality of buried bit lines and separating the second ion implantation area into a plurality of first source/drain areas by forming a plurality of first isolation portions passing through the first ion implantation area and the second ion implantation area; forming a plurality of parallel second isolation portions in the substrate crossing the plurality of first isolation portions to define a plurality of active areas in the substrate; forming a plurality of buried word lines having upper surfaces lower than the upper surface of the substrate in the plurality of active areas that extend parallel to the plurality of second isolation portions; and forming a second source/ drain area facing the plurality of first source/drain areas on the active areas exposed on the substrate.

BRIEF DESCRIPTION OF THE DRAWINGS

FIG. 10B is a cross-sectional view of the semiconductor device of FIG. 10A cut along lines X10-X10', YA10-YA10', and YB10-YB10' of FIG. 10A, respectively.

DETAILED DESCRIPTION OF EXEMPLARY EMBODIMENTS

Figure 1A:
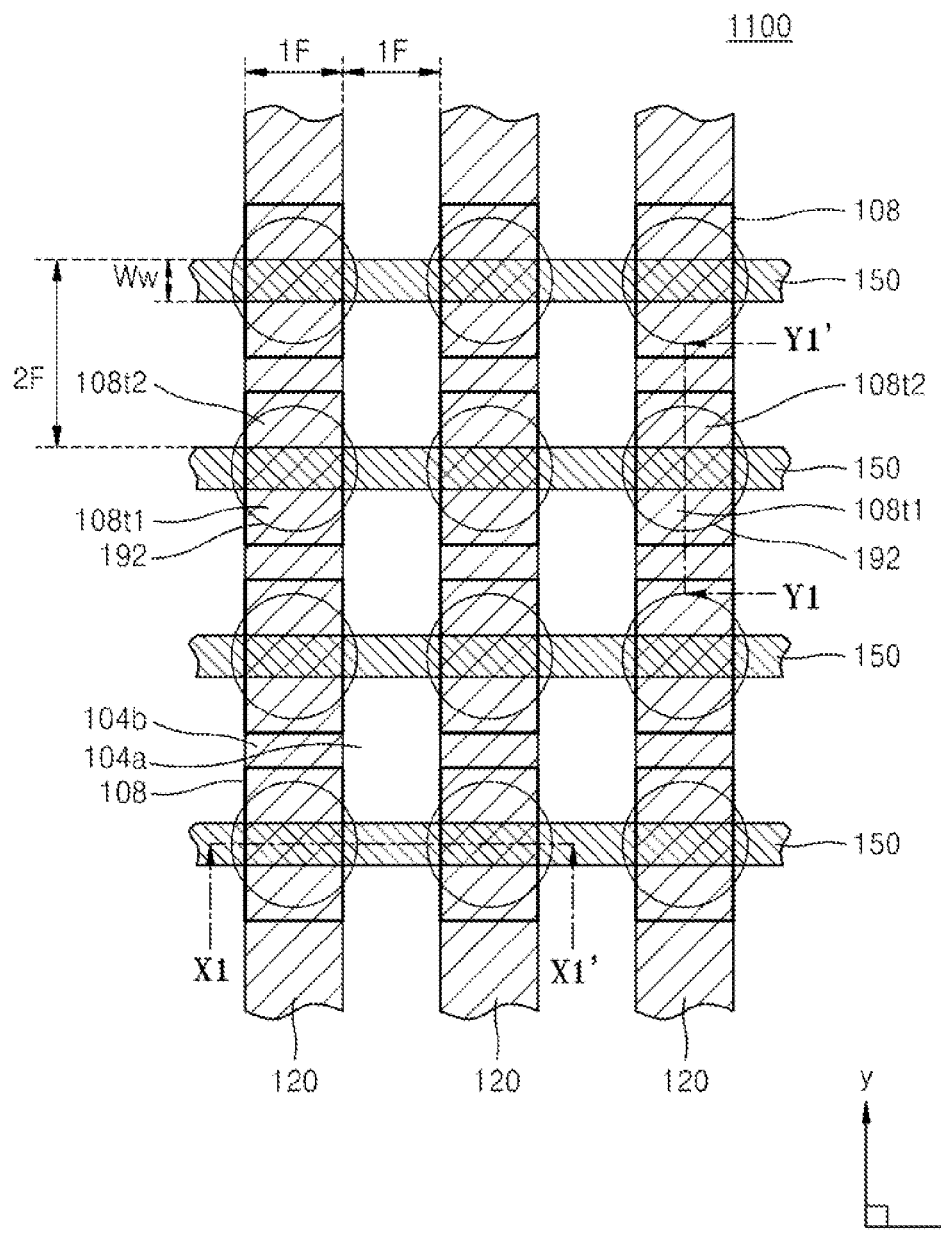
FIG. 1A illustrates a layout of a semiconductor device according to an embodiment of the inventive concept.

Hereinafter, embodiments of the inventive concept will be described in more detail with reference to the accompanying drawings. The inventive concept may, however, be embodied in many different forms and should not be construed as being limited to the embodiments set forth herein. In the drawings, like reference numerals denote like elements.

FIG. 1A illustrates a layout of a semiconductor device 1100 according to an embodiment of the inventive concept. The semiconductor device 1100 may be, for example, a dynamic random access memory (DRAM), in particular, a DRAM having a unit cell size of $4F^2$. Here, 1F denotes a minimum feature size.

Figure 1B:
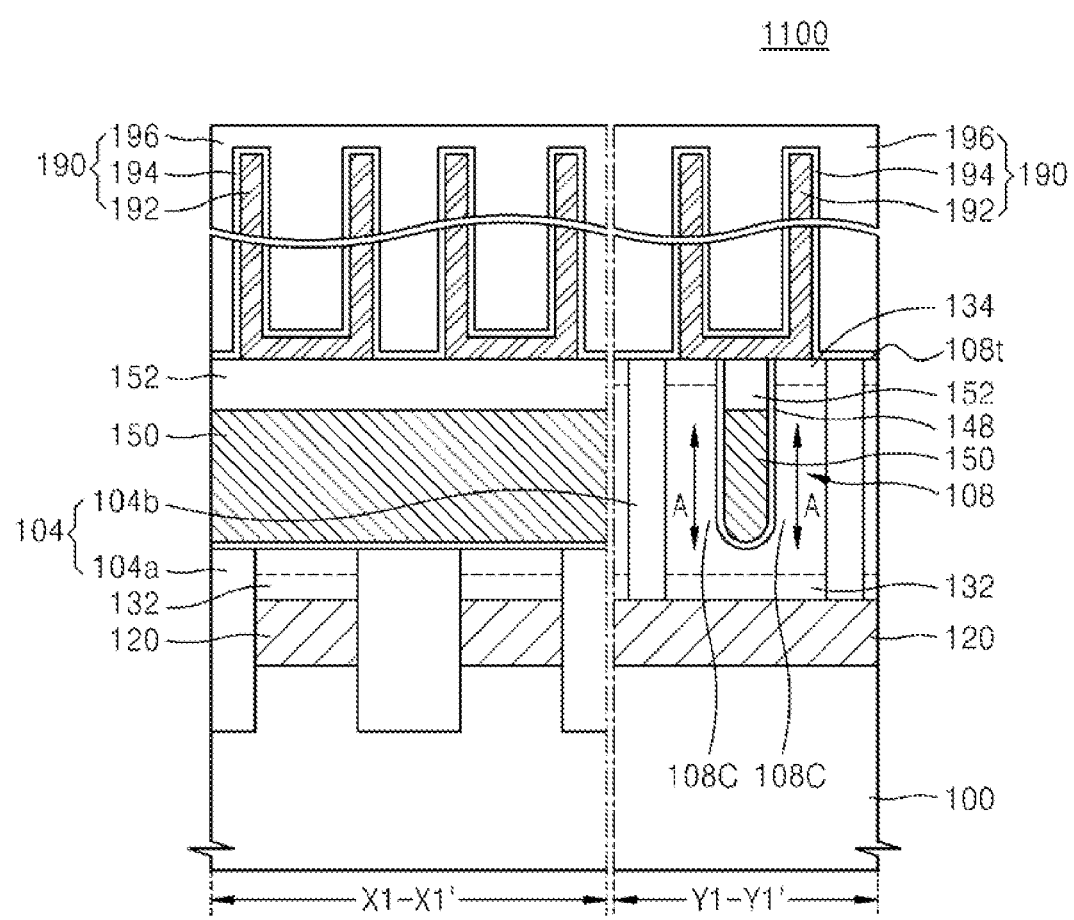
FIG. 1B is a cross-sectional view of the semiconductor device of FIG. 1A cut along lines X1-X1' and Y1-Y1' of FIG. 1A, respectively.

FIG. 1B is a cross-sectional view of the semiconductor device 1100 of FIG. 1A along cut lines X1-X1' and Y1-Y1' of FIG. 1A, respectively.

Referring to FIGS. 1A and 1B, the semiconductor device 1100 according to a current embodiment includes a substrate 100, a plurality of active areas 108 formed on the substrate 100, and an isolation layer 104 for defining the plurality of active areas 108. The substrate 100 may be formed of, for example, a semiconductor such as silicon (Si).

In the substrate 100, a plurality of buried word lines 150 whose upper surfaces are lower than an upper surface 108t of the active areas 108 extend in a first direction, such as a horizontal direction ('x' direction in FIG. 1A) that is parallel to a main surface of the substrate 100. In FIGS. 1A and 1B, sidewalls and lower surfaces of the plurality of buried word lines 150 are each surrounded by the active areas 108.

A gate dielectric film 148 is interposed between the buried word lines 150 and the active area 108.

Figure 2A:
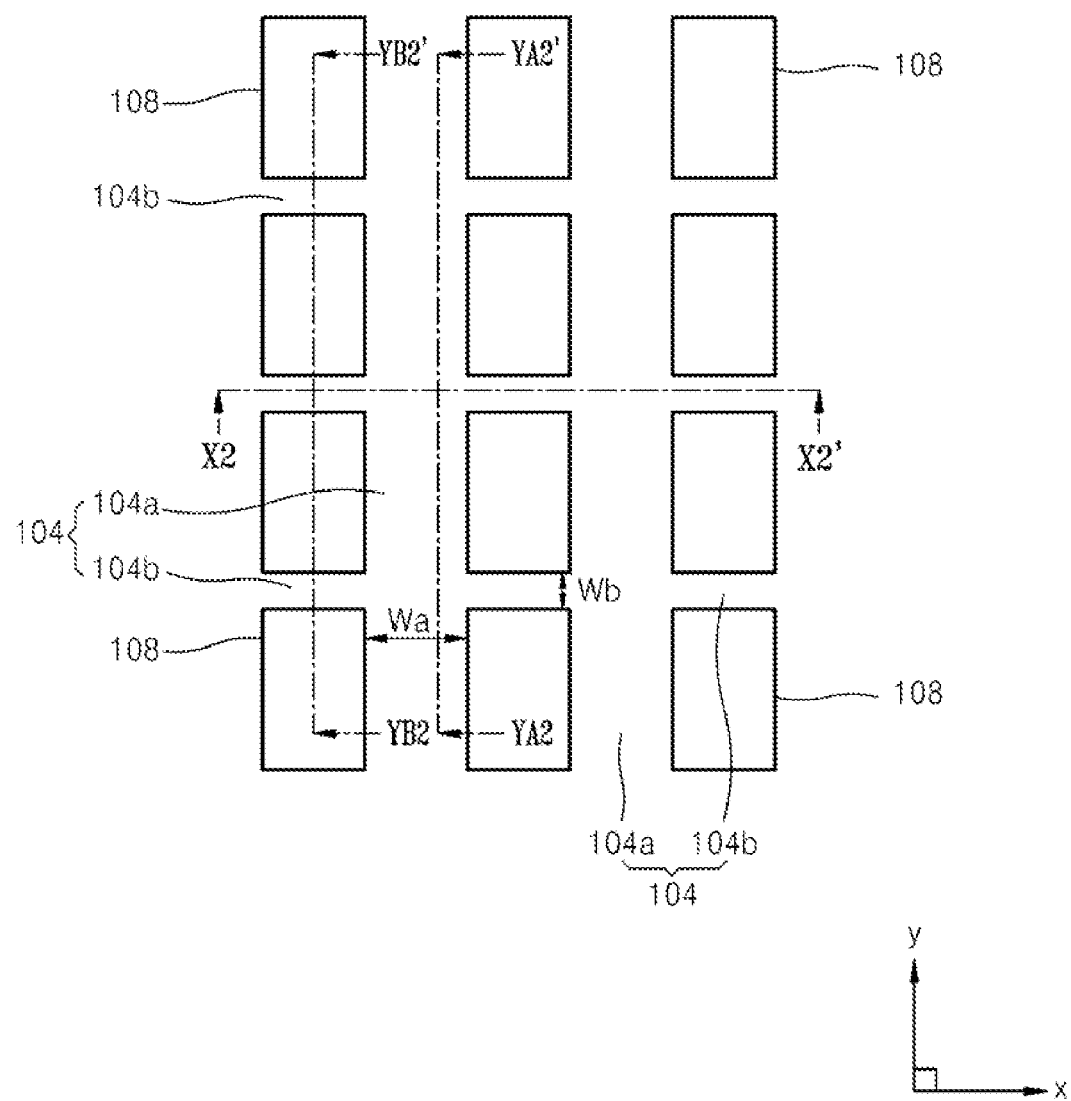
FIG. 2A is a plan view of an isolation layer illustrated in FIGS. 1A and 1B.
Figure 2B:
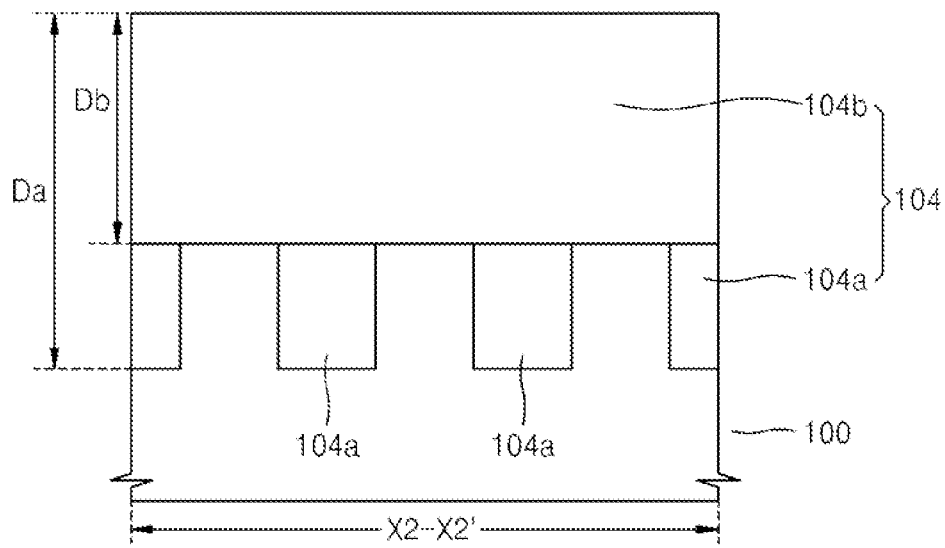
FIG. 2B is a cross-sectional view of the isolation layer cut along a line X2-X2' of FIG. 2A.
Figure 2C:
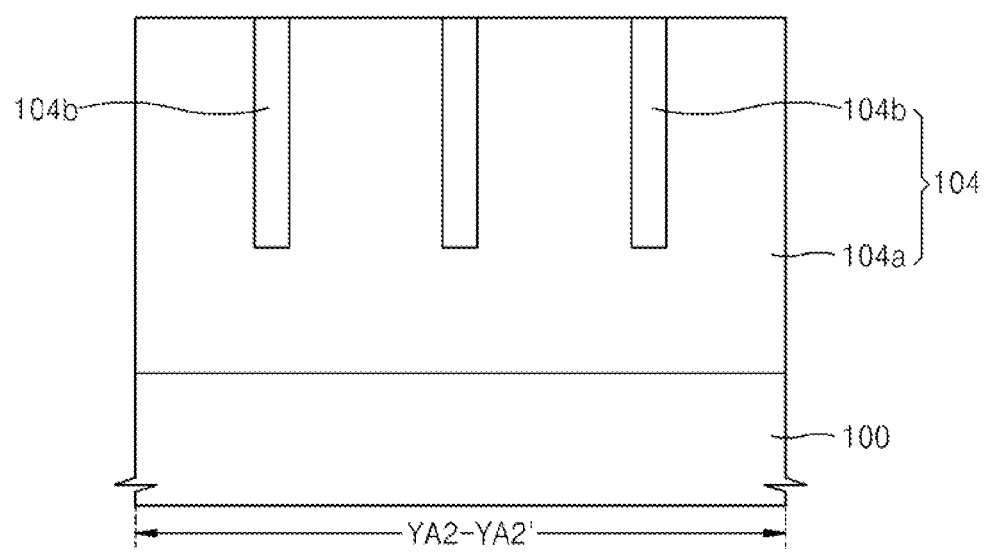
FIG. 2C is a cross-sectional view of the isolation layer cut along a line YA2-YA2' of FIG. 2A.
Figure 2D:
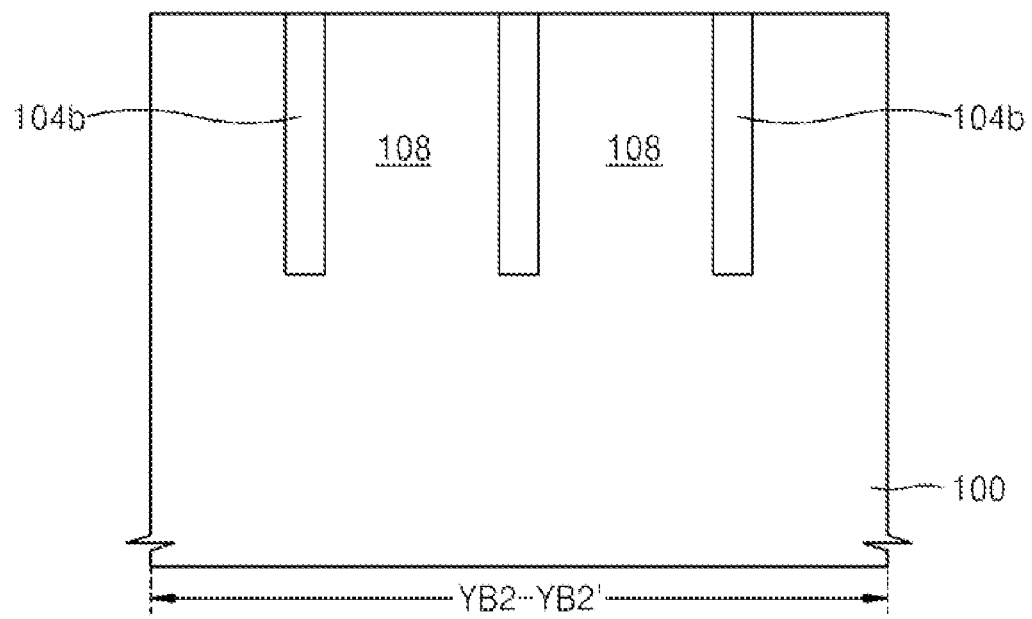
FIG. 2D is a cross-sectional view of the isolation layer taken along the line YB2-YB2' of FIG. 2A.

FIG. 2A is a plan view of the isolation layer 104 illustrated in FIGS. 1A and 1B, FIG. 2B is a cross-sectional view of the isolation layer 104 cut along a line X2-X2' of FIG. 2A, FIG. 2C is a cross-sectional view of the isolation layer 104 cut along a line YA2-YA2' of FIG. 2A, and FIG. 2D is a cross-sectional view of the isolation layer 104 cut along a line YB2-YB2' of FIG. 2A.

As illustrated in FIGS. 2A, 2B, 2C, and 2D, the isolation layer 104 has a network structure including a plurality of first isolation portions 104a and a plurality of second isolation portions 104b. The plurality of first isolation portions 104a extend in a second direction ('y' direction in FIG. 2A) and the plurality of second isolation portions 104b cross the plurality of first isolation portions 104a and extend in a first direction ('x' direction in FIG. 2A).

A first width Wa of the first isolation portions 104a is greater than a second width Wb of the second isolation portions 104b. Also, a thickness of the first isolation portions 104a is greater than a thickness of the second isolation portions 104b. That is, a first distance Da between the upper surface 108t of the active area 108 and the lower surface of the first isolation portion 104a is greater than a second distance Db between the upper surface 108t of the active area 108 and the lower surface of the second isolation portion 104b. Accordingly, elevated and depressed step portions exist on the lower surface of the isolation layer 104 due to the thickness difference between the first isolation portions 104a and the second isolation portions 104b.

Referring back to FIGS. 1A and 1B, a plurality of buried bit lines 120 whose upper surfaces are lower than the plurality of buried word lines 150 are formed in the substrate 100. The plurality of buried bit lines 120 are parallel to the main surface of the substrate 100 and extend in a second direction that is different to the first direction, such as a vertical direction ('y' direction in FIG. 1A).

Viewed from the upper surface of the substrate 100, any one buried bit line 120 selected from the plurality of buried bit lines 120 may overlap active areas 108 arranged in a line extending in the second direction ('y' direction in FIG. 1A) and with second isolation portions 104b arranged in a line and interposed between the plurality of active areas 108, as illustrated in FIGS. 1A and 1B.

A first source/drain area 132 and a second source/drain area 134 are formed in the active area 108. The first source/drain area 132 is in a lower portion of the active area 108 near the buried bit line 120 and the second source/drain area 134 is formed in an upper portion of the active area 108.

In FIGS. 1A and 1B, both sidewalls and the lower surfaces of the buried word lines 150 are each surrounded by the active areas 108. Channel areas 108C, in which vertical channels are formed in the active area 108 in a direction indicated by the arrow A in FIG. 1B, are interposed between the first source/drain area 132 and the second source/drain area 134 near both sidewalls of the buried word lines 150.

A capacitor 190 including a lower electrode 192, a dielectric film 194, and a upper electrode 196 is formed on the substrate 100. The lower electrode 192 is electrically connected to the second source/drain area 134, the dielectric film 194 covers the lower electrode 192, and the upper electrode 196 is formed on the dielectric film 194.

A capping layer 152 formed of an insulating layer is interposed between the buried word line 150 and the lower electrode 192. The capping layer 152 is filled in the substrate 100. Thus, the upper surface of the capping layer 152 may be disposed at the same level as the upper surface 108t of the active area 108.

In FIGS. 1A and 1B, the upper surfaces 108t of the active areas 108 each include first upper surfaces 108t1 and second upper surfaces 108t2 that are spaced apart from each other with the buried word lines 150 disposed therebetween. The second source/drain areas 134 are each included in the first upper surfaces 108t1 and the second upper surfaces 108t2. The lower electrodes 192 of the capacitor 190 directly contact the second source/drain area 134. Here, one lower electrode 192 contacts the second source/drain area 134 in two contact areas that are spaced apart from each other.

When the semiconductor device of FIGS. 1A and 1B is a DRAM having a unit cell size of $4F^2$, a width Ww of the buried word lines 150 may be less than the width of the buried bit lines 120. For example, the width of the buried bit lines 120 may be 1F and the width Ww of the buried word lines 150 may be less than 1F. Also, the width of the active areas 108 in the first direction ('x' direction in FIG. 1A) may be less than a repeating pitch of the plurality of buried word lines 150 in the second direction ('y' direction in FIG. 1A).

Figure 3A:
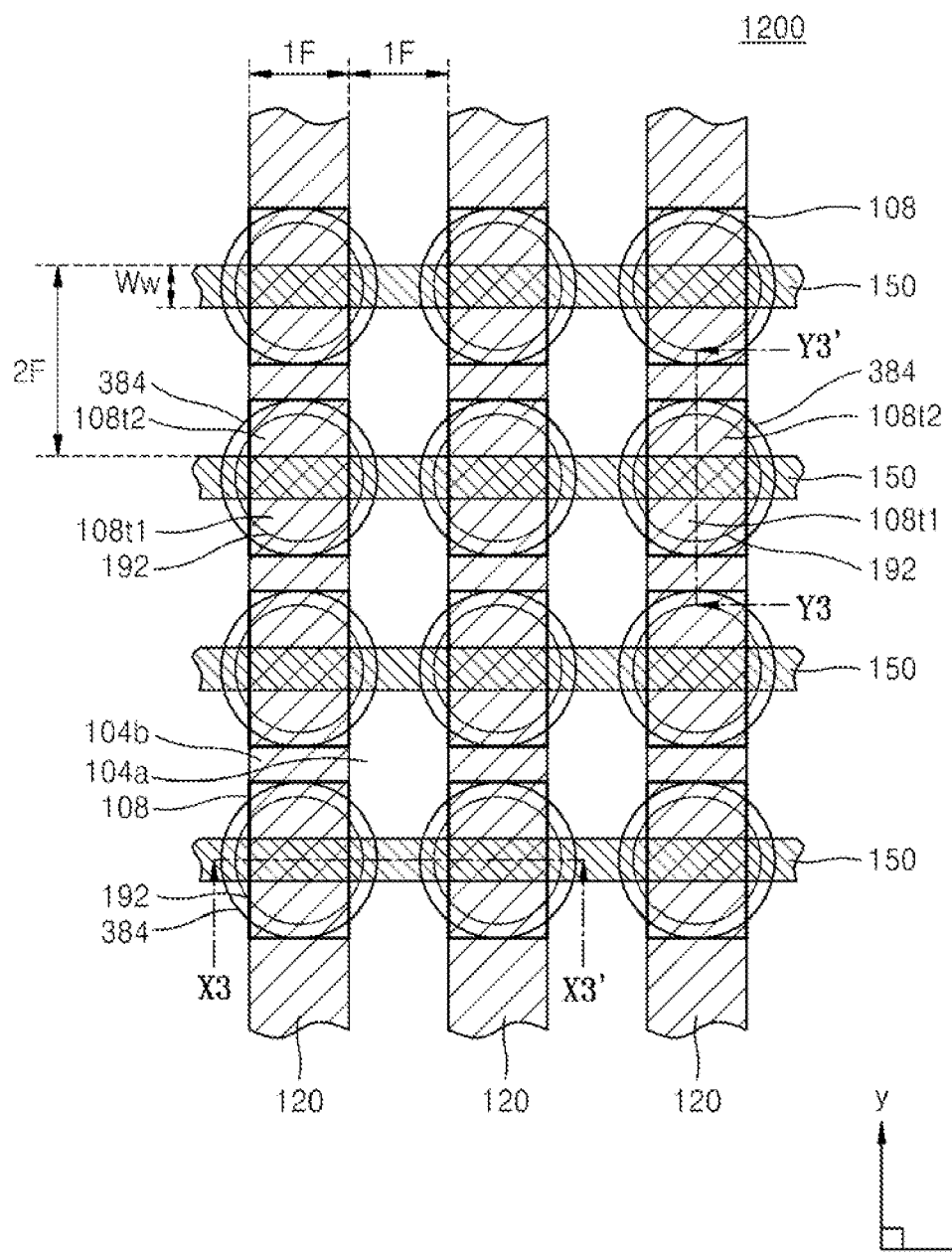
FIG. 3A illustrates a layout of a semiconductor device according to another embodiment of the inventive concept.

FIG. 3A illustrates a layout of a semiconductor device 1200 according to another embodiment of the inventive concept. The semiconductor device 1200 illustrated in FIG. 3A may be, in particular, a DRAM having a unit cell size of $4F^2$.

Figure 3B:
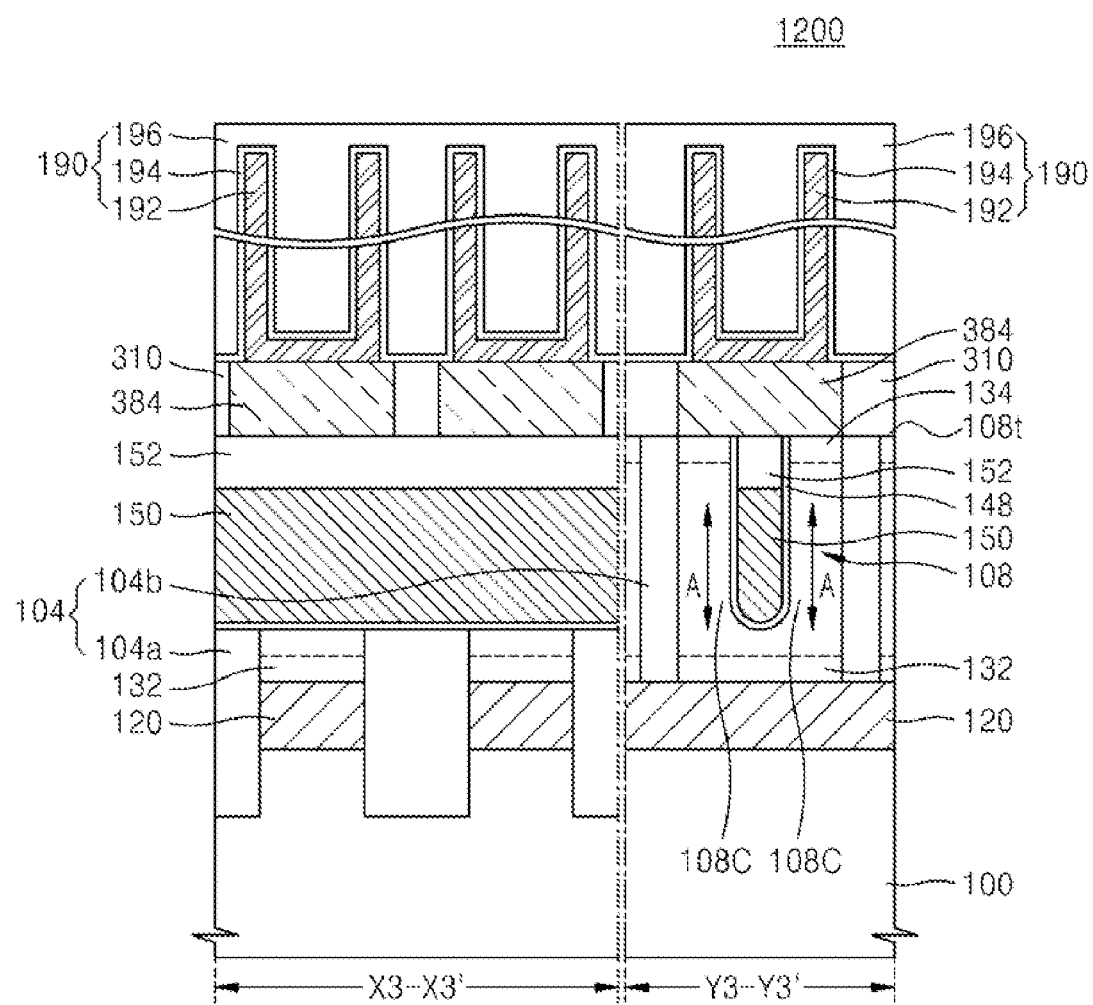
FIG. 3B is a cross-sectional view of the semiconductor device of FIG. 3A cut along lines X3-X3' and Y3-Y3' of FIG. 3A, respectively.

FIG. 3B is a cross-sectional view of the semiconductor device 1200 of FIG. 3A along cut lines X3-X3' and Y3-Y3' of FIG. 3A, respectively.

Like reference numerals in FIGS. 3A and 3B denote like elements in FIGS. 1A and 1B. In this regard, detailed descriptions of the common elements are omitted.

Referring to FIGS. 3A and 3B, conductive landing pads 384 electrically connect the lower electrodes 192 to the second source/drain area 134 formed on the first upper surface 108t1 and the second upper surface 108t2 of the active area 108.

The conductive landing pads 384 may be formed of conductive polysilicon, a metal such as tungsten (W), or a metal nitride such as titanium nitride (TiN). Also, the conductive landing pads 384 may include conductive monocrystalline silicon formed through a selective epitaxial growth (SEG) process. However, a material for forming the conductive landing pads 384 is not limited thereto and any material which may reduce a contact resistance between the lower electrodes 192 and the second source/drain area 134 each formed on the first upper surface 108t1 and the second upper surface 108t2 may be used to form the conductive landing pads 384. The conductive landing pads 384 are separated by interlayer insulating film patterns 310.

Figure 4A:
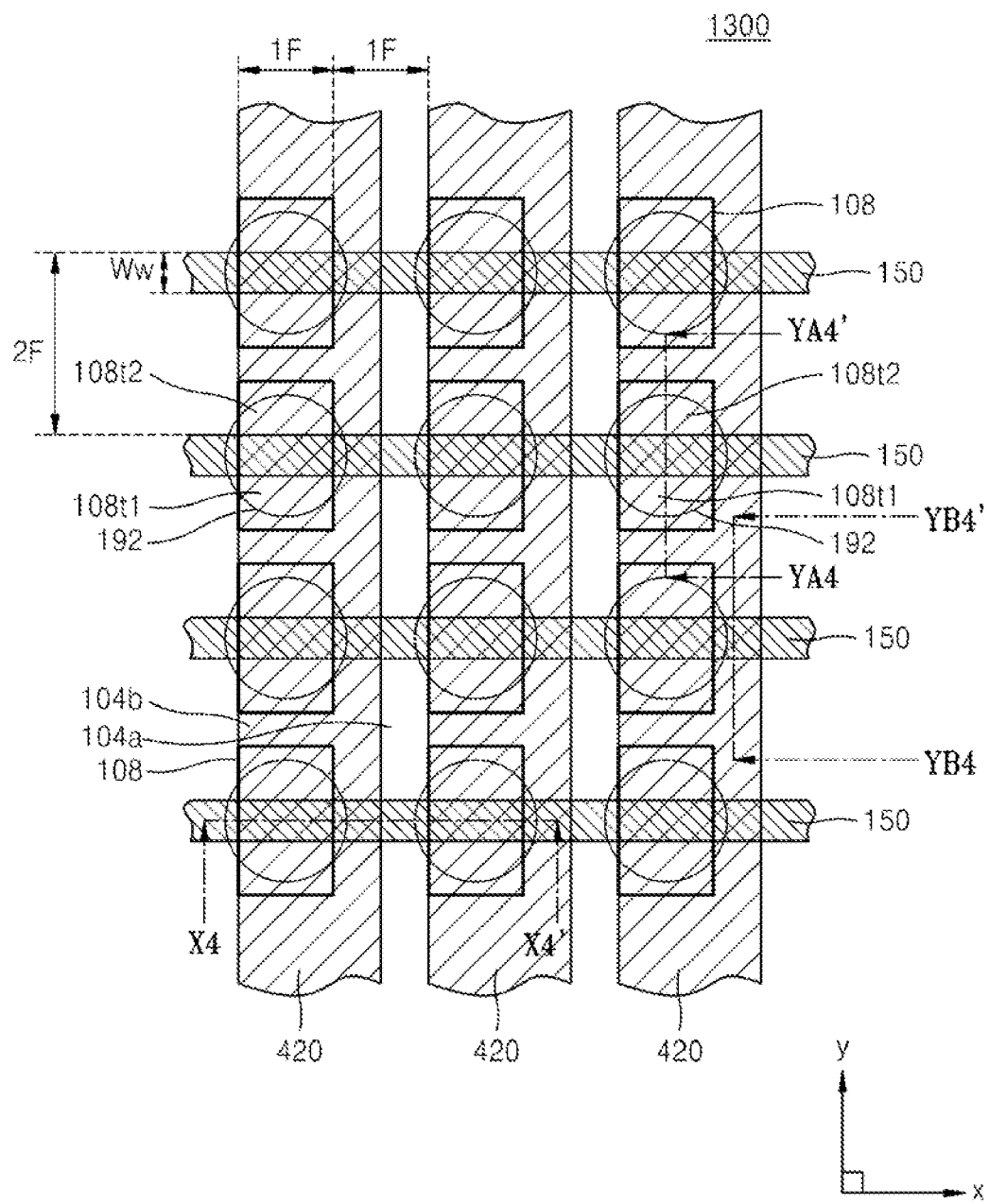
FIG. 4A illustrates a layout of a semiconductor device according to another embodiment of the inventive concept.

FIG. 4A illustrates a layout of a semiconductor device 1300 according to another embodiment of the inventive concept. The semiconductor device 1300 illustrated in FIG. 4A may be, for example, a DRAM, in particular, a DRAM having a unit cell size of $4F^2$.

Figure 4B:
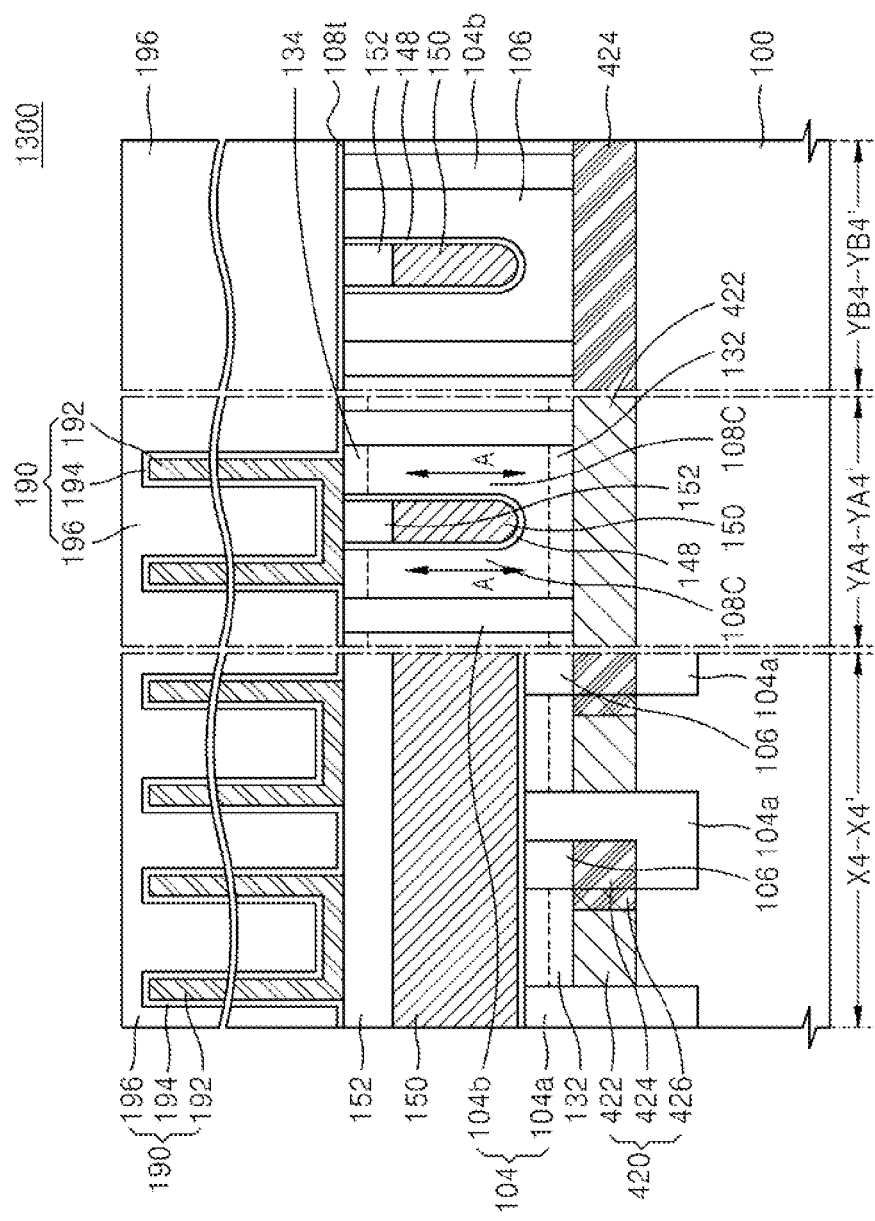
FIG. 4B is a cross-sectional view of the semiconductor device of FIG. 4A cut along lines X4-X4', YA4-YA4', and YB4-YB4' of FIG. 4A, respectively.

FIG. 4B is a cross-sectional view of the semiconductor device 1300 of FIG. 4A along cut lines X4-X4', YA4-YA4', and YB4-YB4' of FIG. 4A, respectively.

Like reference numerals in FIGS. 4A and 4b denote like elements in FIGS. 1A and 1B. In this regard, detailed descriptions of the common elements are omitted.

Referring to FIGS. 4A and 4B, a plurality of buried bit lines 420 having upper surfaces that are lower than the plurality of buried word lines 150 are formed on the substrate 100. The plurality of buried bit lines 420 are parallel to a main surface of the substrate 100 and extend in a second direction ('y' direction in FIG. 4A) that is perpendicular to a first direction ('x' direction in FIG. 4A).

Viewed from the top of the substrate 100, the plurality of buried bit lines 420 may each include a first bit line portion 422, a second bit line portion 424, and a third bit line portion 426 that are connected to each other.

The first bit line portion 422 may be formed to overlap the plurality of active areas 108 arranged in a line in the second direction ('y' direction in FIG. 4A) and the plurality of second isolation portions 104b arranged in a line and interposed between the plurality of active areas 108.

The second bit line portion 424 extends in the first direction ('x' direction in FIG. 4A) from the first bit line portion 422. Some portions of the second bit line portion 424 may be surrounded by the first isolation portions 104a.

The third bit line portion 426 is interposed between the first bit line portion 422 and the second bit line portion 424.

The first bit line portion 422, the second bit line portion 424, and the third bit line portion 426 may each include materials that differ from each other. For example, the first bit line portion 422 may be an ion implantation area in which impurities are ion implanted from the substrate 100. The second bit line portion 424 may include a metal or a metal nitride. The third bit line portion 426 may include metal silicide. For example, the third bit line portion 426 may include metal silicide, which results from a silicide reaction of Si included in the substrate 100 and the first bit line portion 422 with a metal component included in the second bit line portion 424.

Figure 5A:
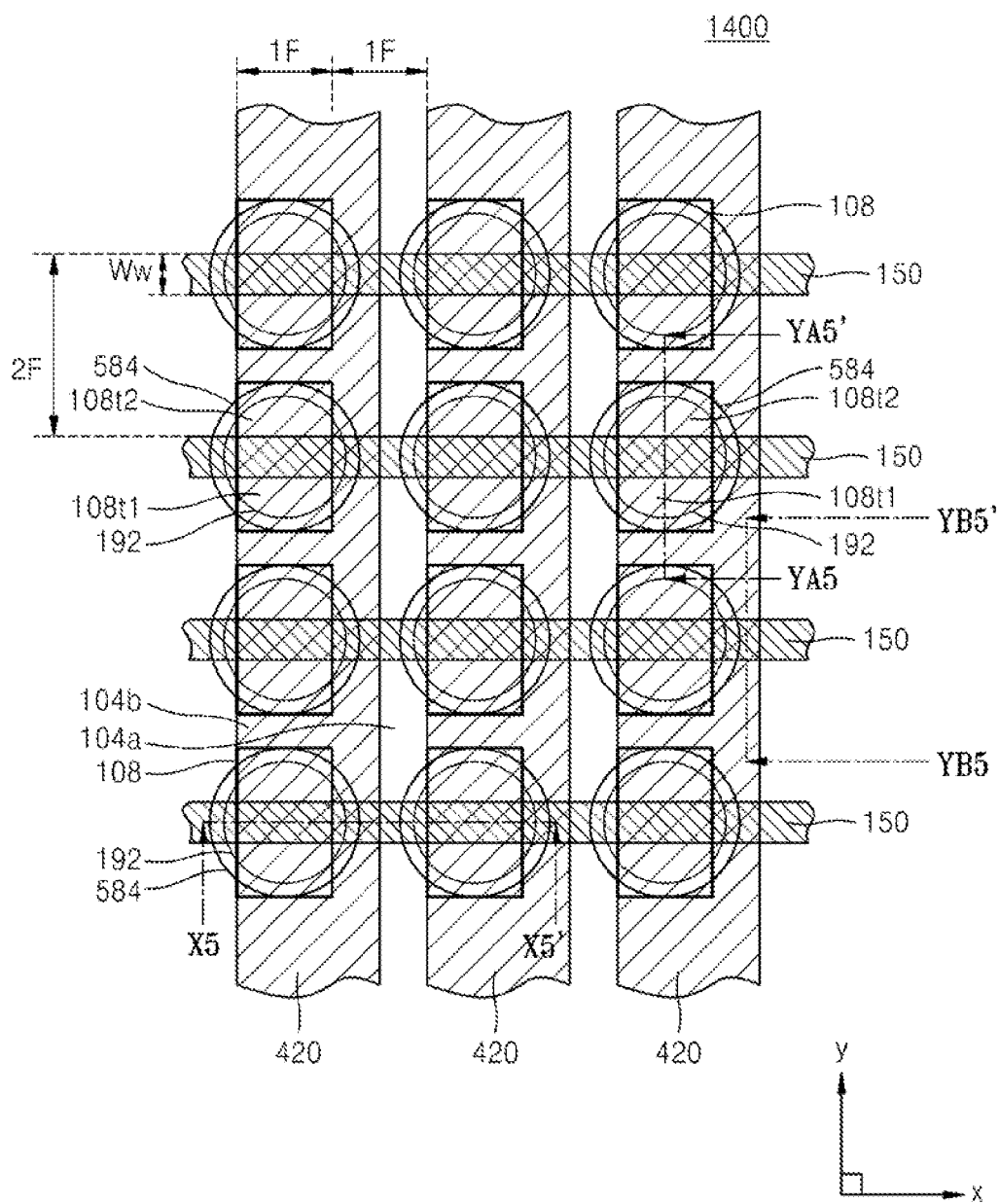
FIG. 5A illustrates a layout of a semiconductor device according to another embodiment of the inventive concept.

FIG. 5A illustrates a layout of a semiconductor device 1400 according to another embodiment of the inventive concept. The semiconductor device 1400 illustrated in FIG. 5A may be, for example, a DRAM, in particular, a DRAM having a unit cell size of $4F^2$.

Figure 5B:
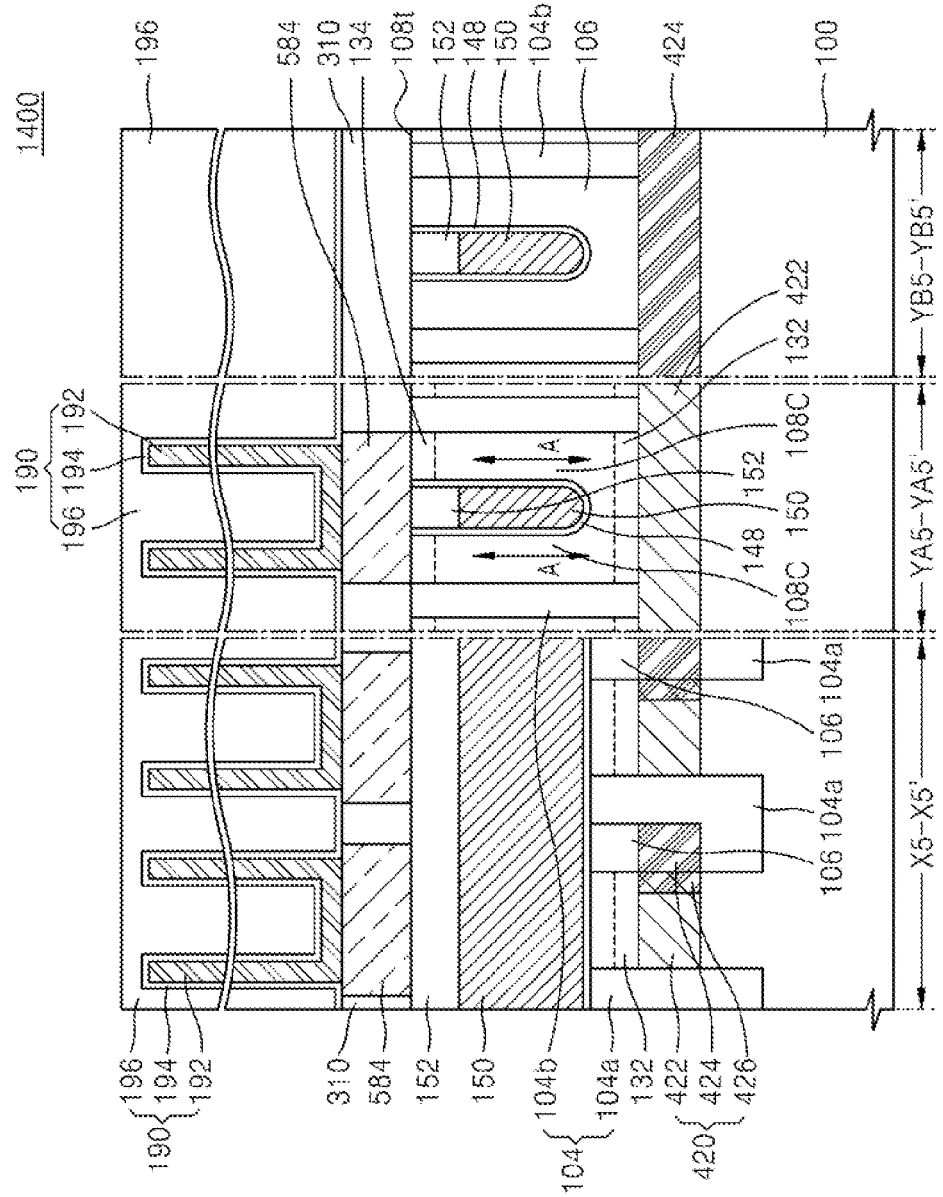
FIG. 5B is a cross-sectional view of the semiconductor device of FIG. 5A cut along lines X5-X5', YA5-YA5', and YB5-YB5' of FIG. 5A, respectively.

FIG. 5B is a cross-sectional view of the semiconductor device 1400 of FIG. 5A along cut lines X5-X5', YA5-YA5', and YB5-YB5' of FIG. 5A, respectively.

Like reference numerals in FIGS. 5A and 5B denote like elements in FIGS. 1A and 1B and FIGS. 4A and 4R. In this regard, detailed descriptions of the common elements are omitted.

Referring to FIGS. 5A and 5B, conductive landing pads 584 electrically connect the lower electrodes 192 to the second source/drain area 134 formed on the first upper surface 108t1 and the second upper surface 108t2 of the active area 108.

The conductive landing pads 584 are the same as the conductive landing pads 384 in FIGS. 3A and 3B. The conductive landing pads 584 are separated by interlayer insulating film patterns 310.

Figure 6A:
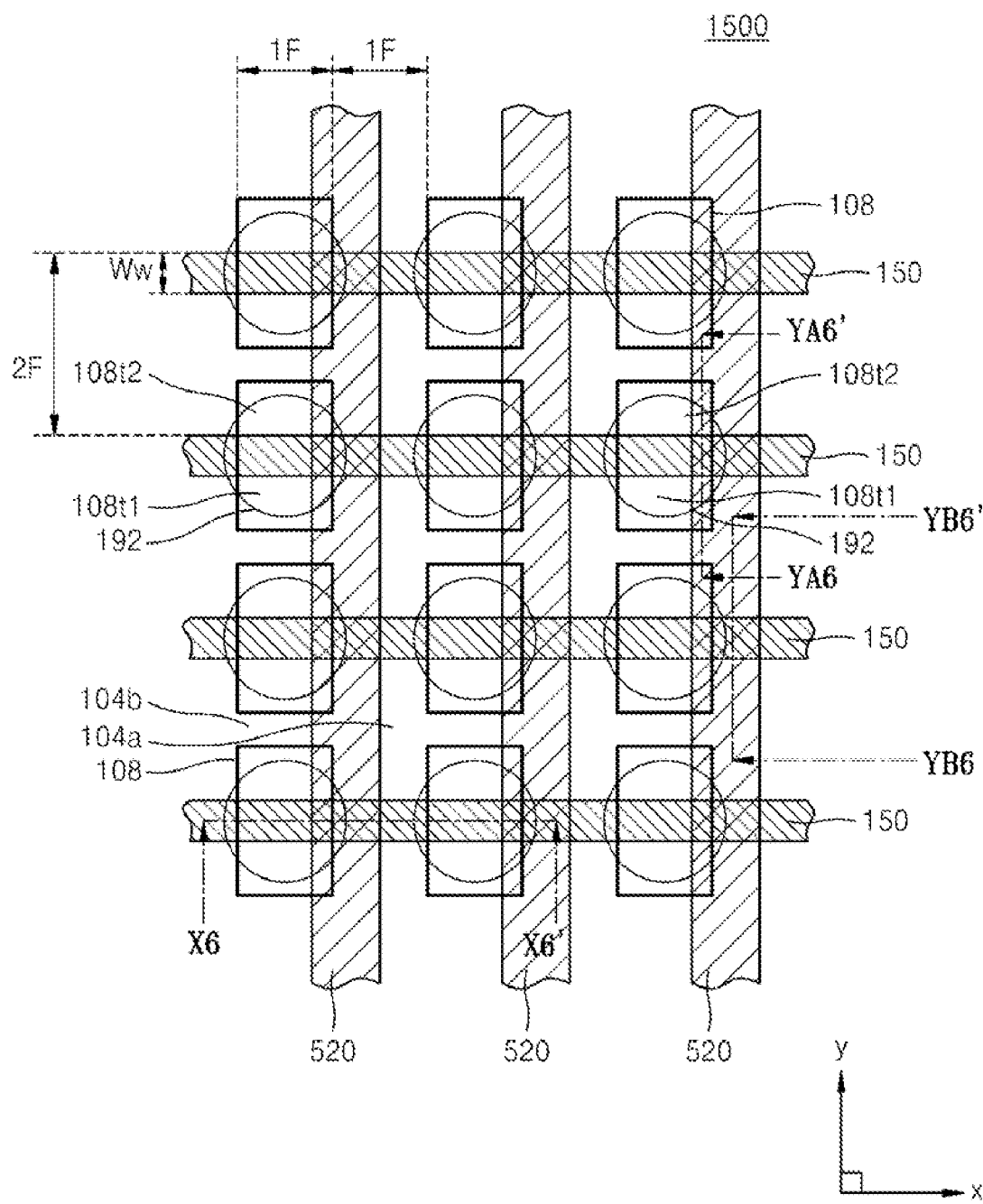
FIG. 6A illustrates a layout of a semiconductor device according to another embodiment of the inventive concept.

FIG. 6A illustrates a layout of a semiconductor device 1500 according to another embodiment of the inventive concept. The semiconductor device 1500 illustrated in FIG. 6A may be, for example, a DRAM, in particular, a DRAM having a unit cell size of $4F^2$.

Figure 6B:
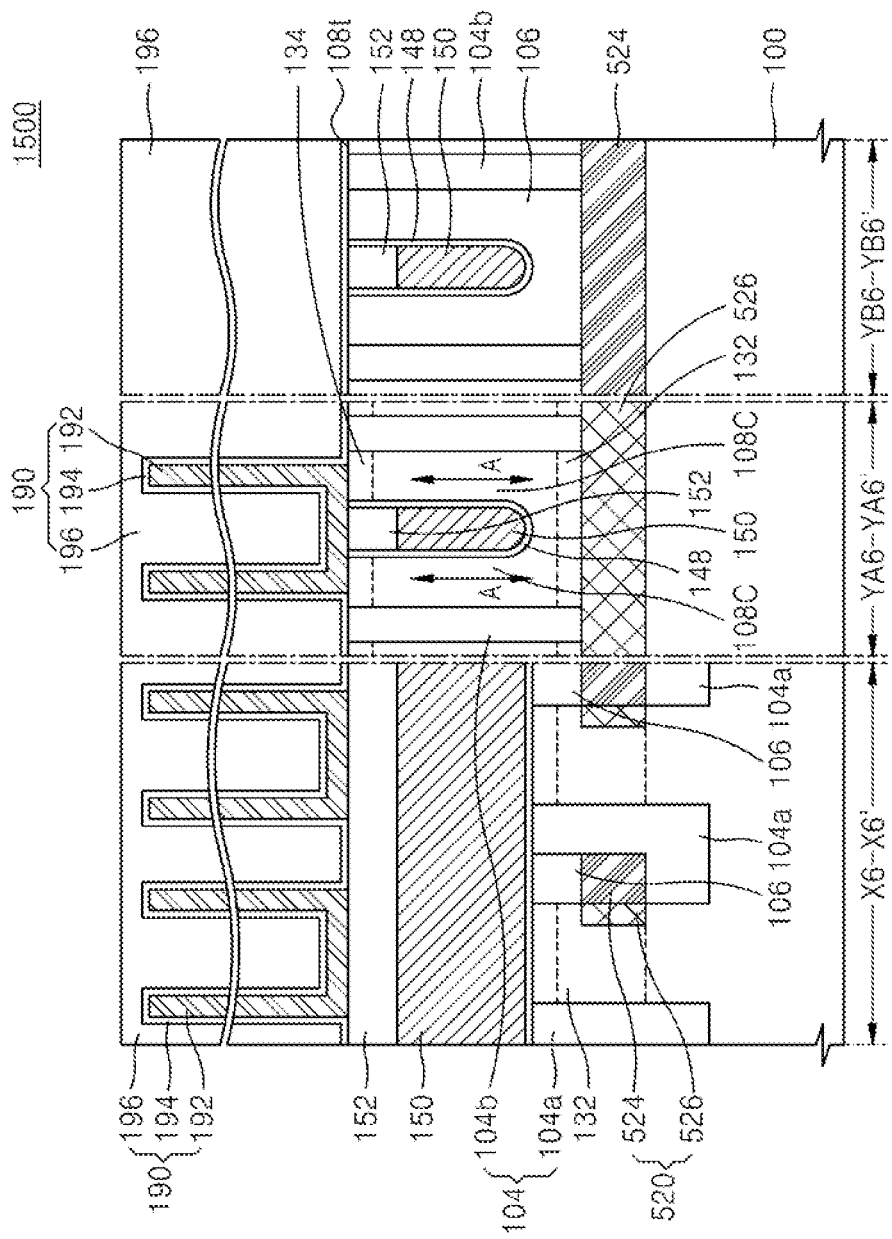
FIG. 6B is a cross-sectional view of the semiconductor device of FIG. 6A cut along lines X6-X6', YA6-YA6', and YB6-YB6' of FIG. 6A, respectively.

FIG. 6B is a cross-sectional view of the semiconductor device 1500 of FIG. 6A along cut lines X6-X6', YA6-YA6', and YB6-YB6' of FIG. 6A, respectively.

Like reference numerals in FIGS. 6A and 6B denote like elements in FIGS. 1A and 1B. In this regard, detailed descriptions of the common elements are omitted.

Referring to FIGS. 6A and 6B, a plurality of buried bit lines 520 having upper surfaces that are lower than the plurality of buried word lines 150 are formed on the substrate 100. The plurality of buried bit lines 520 are parallel to a main surface of the substrate 100 and extend in a second direction ('y' direction in FIG. 6A) that is perpendicular to a first direction ('x' direction in FIG. 6A).

The plurality of buried bit lines 520 may each include a first bit line portion 524 and a second bit line portion 526 that are connected to each other.

The first bit line portion 524 extends a predetermined width in the first direction ('x' direction in FIG. 6A) from the side wall of the active area 108A for some portions of the first bit line portion 524 to be surrounded by the first isolation portion 104a.

Viewed from the top of the substrate 100, the second bit line portion 526 may overlap the plurality of active areas 108 arranged in a line in the second direction ('y' direction in FIG. 6A) and the plurality of second isolation portions 104b interposed between the plurality of active areas 108.

The first bit line portion 524 and the second bit line portion 526 may include materials that differ from each other. For example, the first bit line portion 524 may include a metal or a metal nitride and the second bit line portion 526 may include a metal silicide. For example, the second bit line portion 526 may include a metal silicide that results from a silicide reaction of Si included in the substrate 100 with a metal component included in the first bit line portion 524.

In FIGS. 6A and 6B, sidewalls and lower surfaces of the plurality of buried word lines 150 are each surrounded by the active areas 108. Vertical channels indicated by the arrow A in FIG. 6B are interposed between the first source/drain area 132 formed on the second bit line portion 526 and the second source/drain area 134 formed near both sidewalls of the buried word line 150.

Figure 7A:
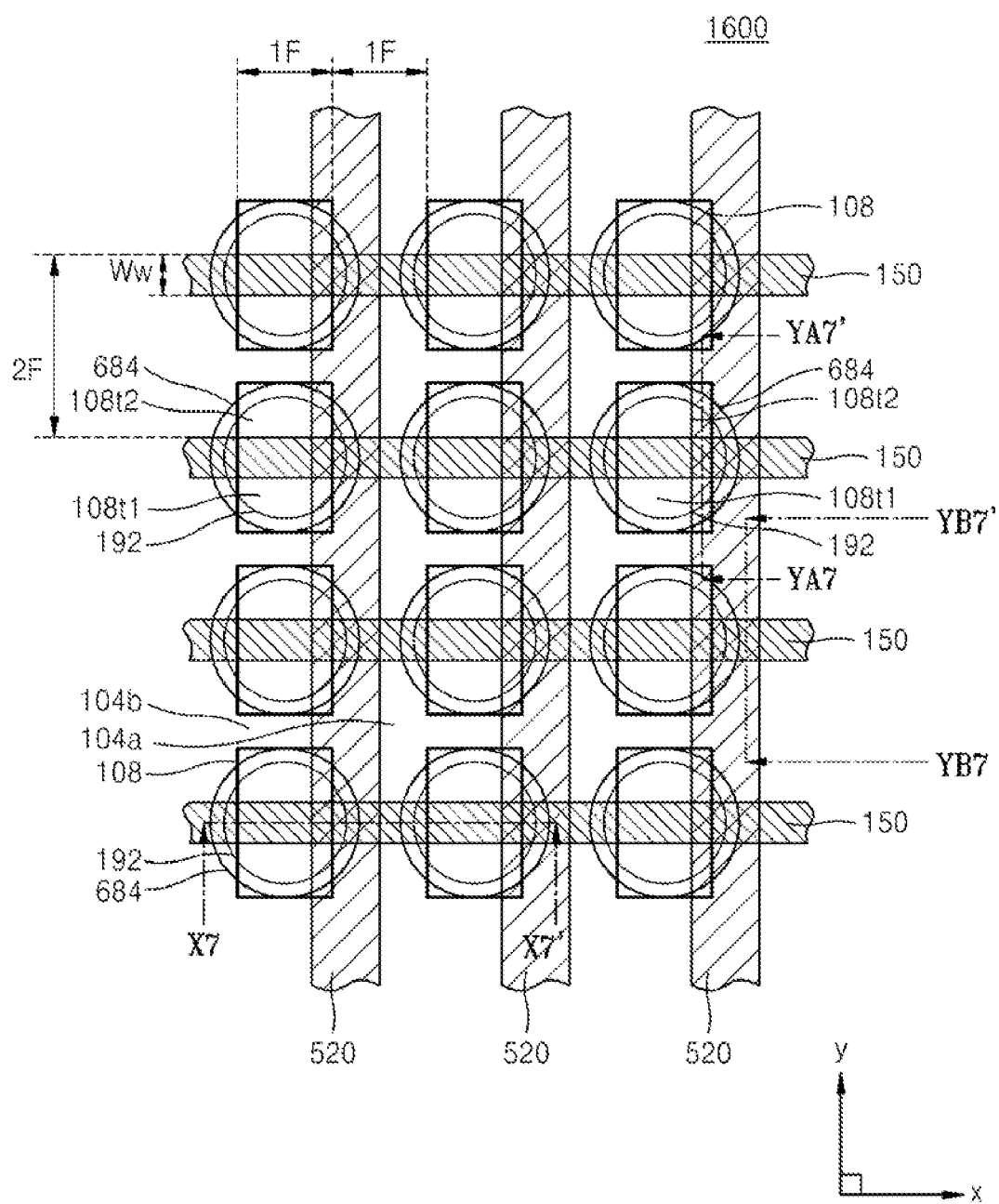
FIG. 7A illustrates a layout of a semiconductor device according to another embodiment of the inventive concept.

FIG. 7A illustrates a layout of a semiconductor device 1600 according to another embodiment of the inventive concept. The semiconductor device 1600 illustrated in FIG. 7A may be, for example, a DRAM, in particular, a DRAM having a unit cell size of $4F^2$.

Figure 7B:
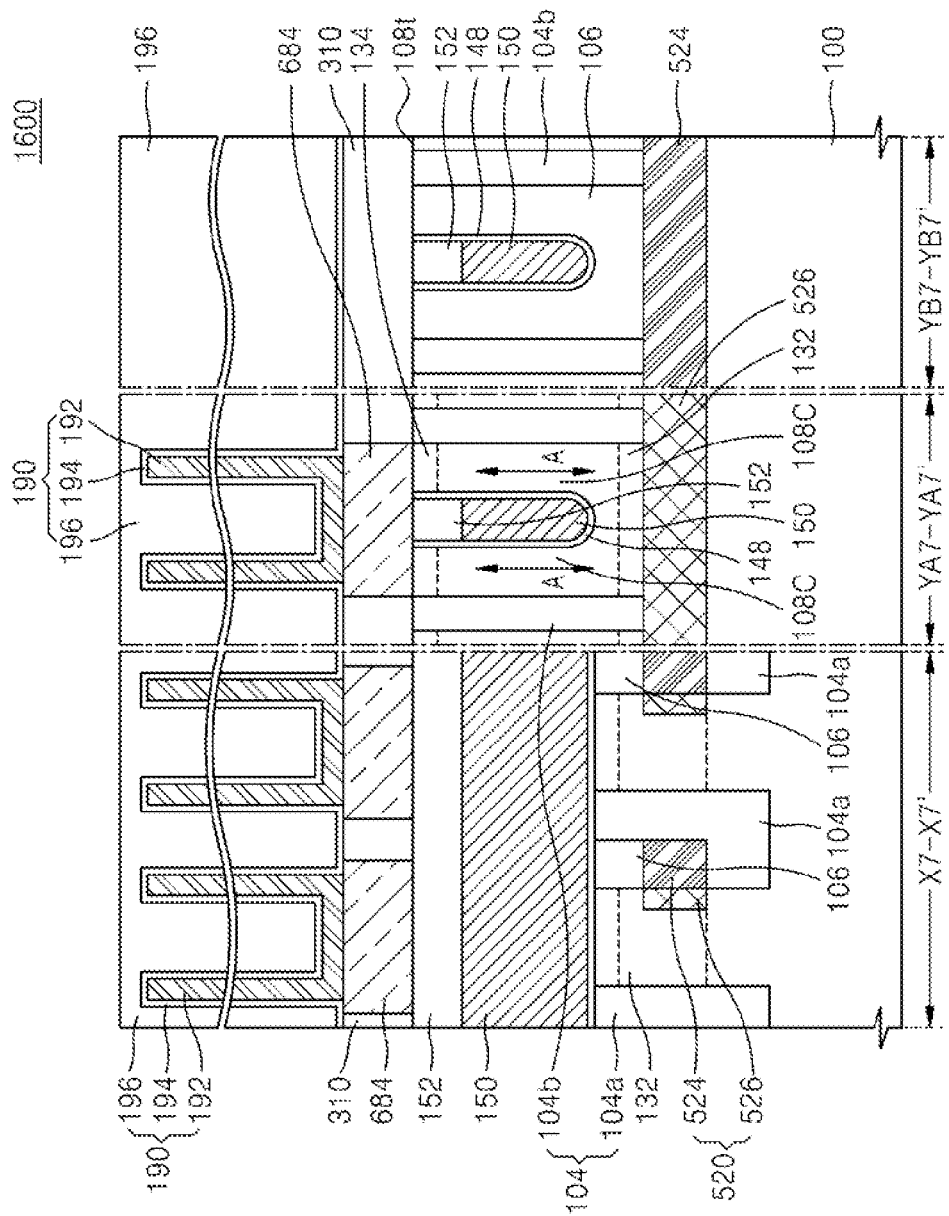
FIG. 7B is a cross-sectional view of the semiconductor device of FIG. 7A cut along lines X7-X7', YA7-YA7', and YB7-YB7' of FIG. 7A, respectively.

FIG. 7B is a cross-sectional view of the semiconductor device 1600 of FIG. 7A along cut lines X7-X7', YA7-YA7', and YB7-YB7' of FIG. 7A, respectively.

Like reference numerals in FIGS. 7A and 7B denote like elements in FIGS. 1A, 1B, 3A, 3B, 6A, and 6B. In this regard, detailed descriptions of the common elements are omitted.

Referring to FIGS. 7A and 7B, conductive landing pads 684 electrically connect the lower electrodes 192 to the second source/drain, area 134 formed on the first upper surface 108t1 and the second upper surface 108t2 of the active area 108.

The conductive landing pads 684 are the same as the conductive landing pads 384 in FIGS. 3A and 3B. The conductive landing pads 684 are separated by interlayer insulating film patterns 310.

Figure 8A:
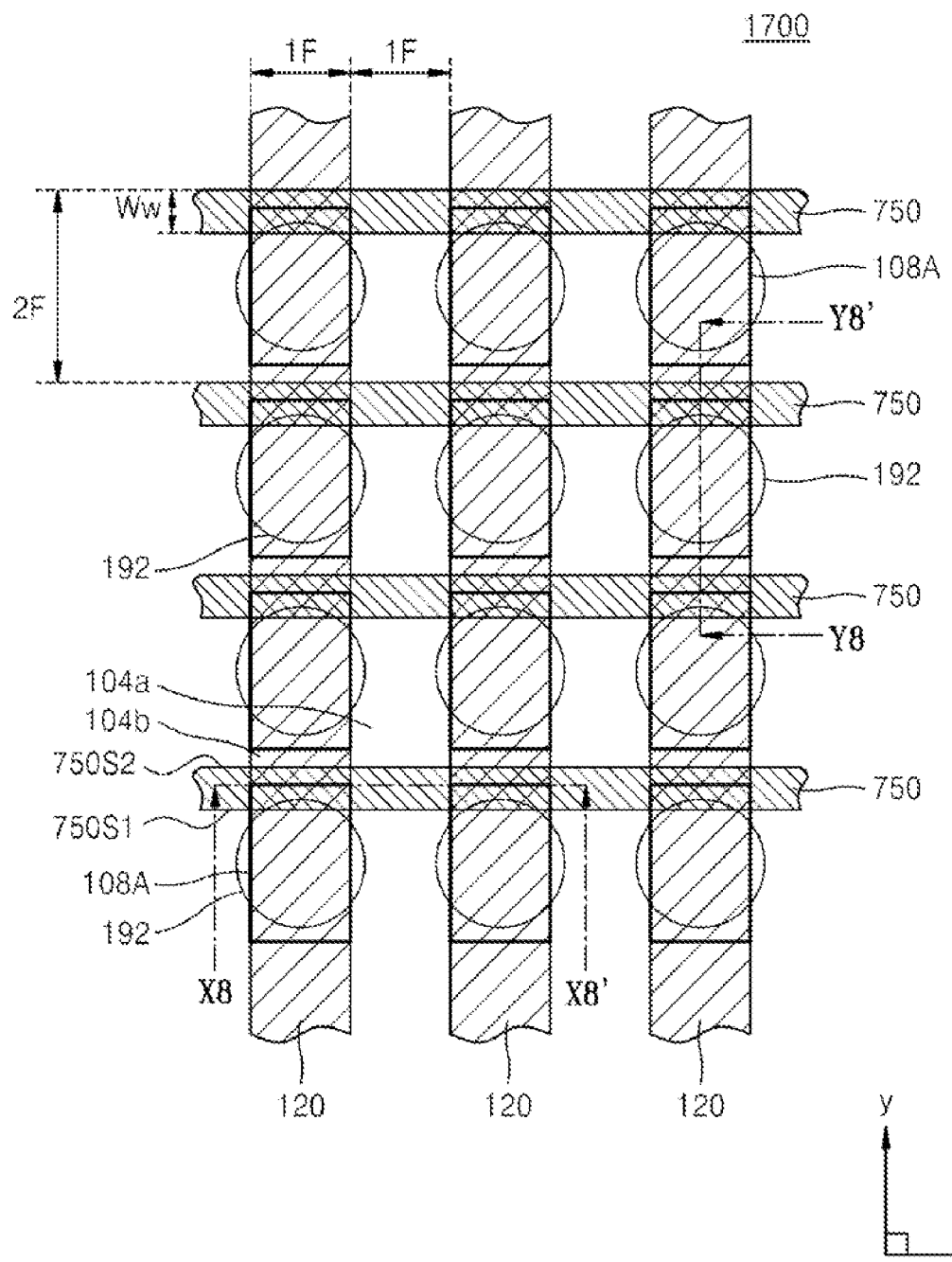
FIG. 8A illustrates a layout of a semiconductor device according to another embodiment of the inventive concept.

FIG. 8A illustrates a layout of a semiconductor device 1700 according to another embodiment of the inventive concept. The semiconductor device 1700 illustrated in FIG. 8A may be, for example, a DRAM, in particular, a DRAM having a unit cell size of $4F^2$.

Figure 8B:
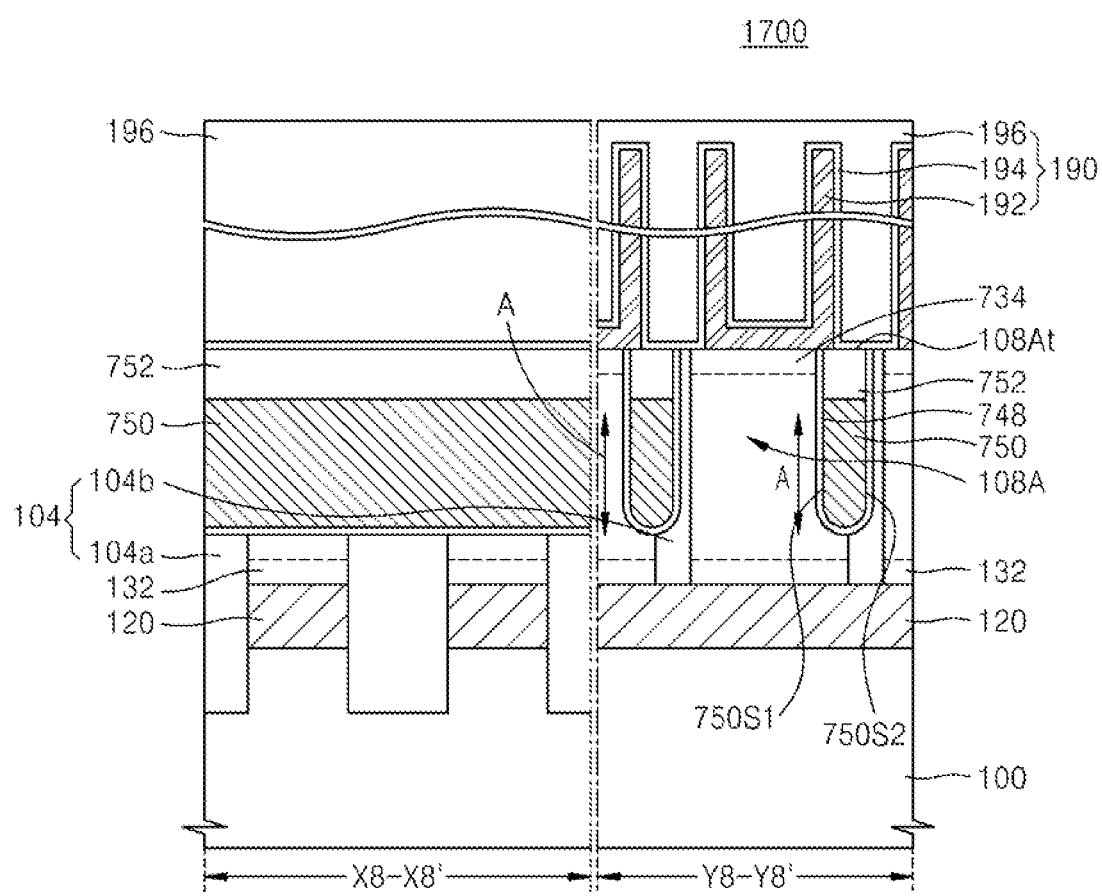
FIG. 8B is a cross-sectional view of the semiconductor device of FIG. 8A cut along lines X8-X8' and Y8-Y8' of FIG. 8A, respectively.

FIG. 8B is a cross-sectional view of the semiconductor device 1700 of FIG. 8A along cut lines X8-X8' and Y8-Y8' of FIG. 8A, respectively.

Like reference numerals in FIGS. 8A and 8B denote like elements in FIGS. 1A and 1B. In this regard, detailed descriptions of the common elements are omitted.

The semiconductor device 1700 of FIGS. 8A and 8B is similar to the semiconductor device 1100 of FIGS. 1A and 1B. A difference between the semiconductor device 1700 of FIGS. 8A and 8B and the semiconductor device 1100 of FIGS. 1A and 1B is that first sidewalls 750S1, which are one of two sidewalls of buried word lines 750, are each surrounded by the active areas 108A, and second sidewalls 750S2, which are opposite to the first sidewalls 750S1, are surrounded by the second isolation portions 104b of the isolation layer 104.

Also, another difference between the semiconductor device 1700 of FIGS. 8A and 8B and the semiconductor device 1100 of FIGS. 1A and 1B is that the second isolation portions 104*b* are adjacent to the gate dielectric films 748 along the second sidewalls, and the upper surfaces 108A*t* of the active areas 108A extend from gate dielectric films 748 formed on the first side walls 750S1 to the second isolation portions 104*b*.

Second source/drain areas 734 are formed on the upper surfaces 108A*t* of the active areas 108A. One second source/drain area 734 is formed on the upper surface of each of the active areas 108A.

Each of the lower electrodes 192 of the capacitors 190 contacts the second source/drain areas 734 in a contact area of the lower electrode 192. Capping layer 752 is the same as capping layer 152 in FIG. 1B.

Figure 9A:
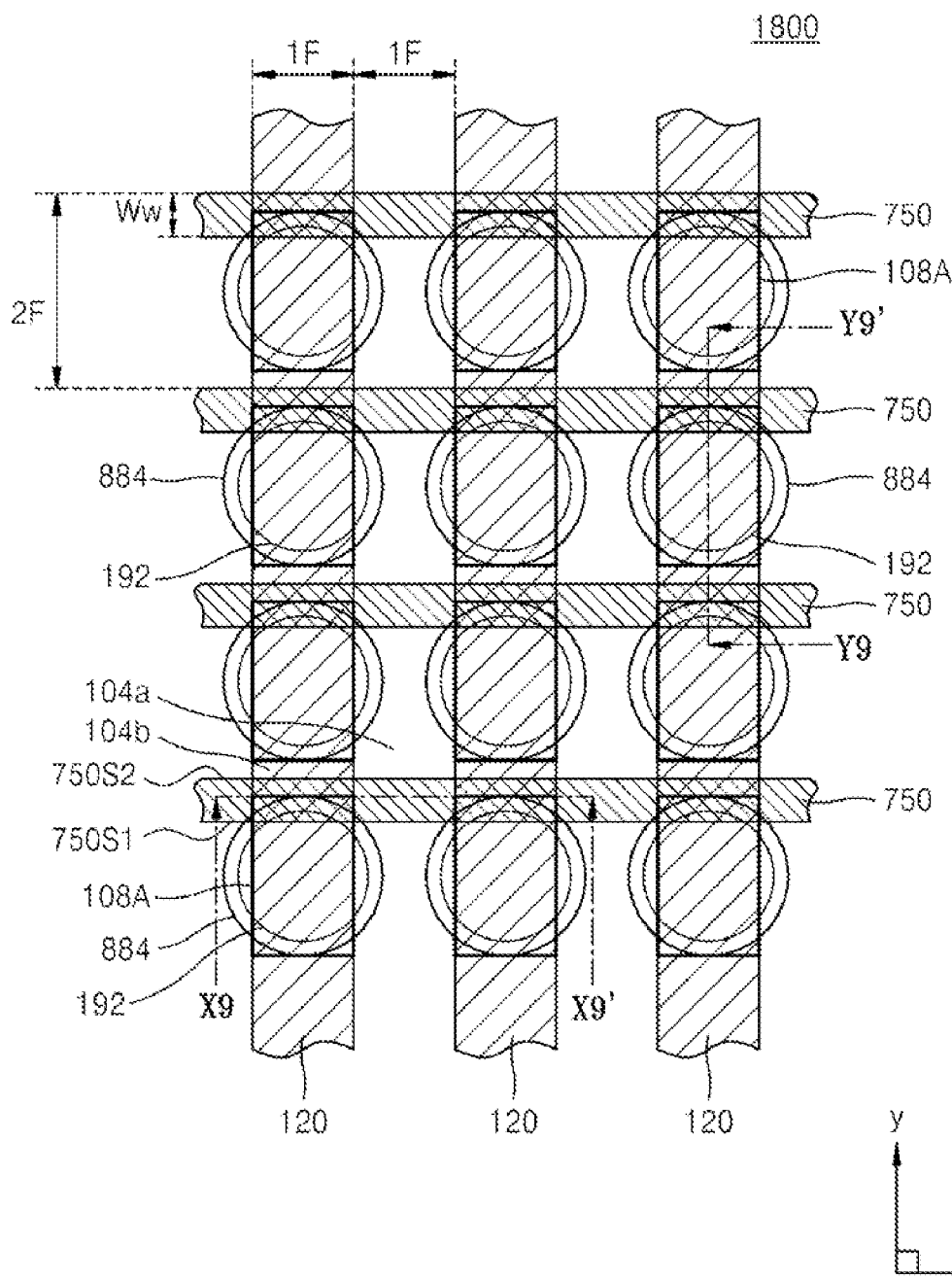
FIG. 9A illustrates a layout of a semiconductor device according to another embodiment of the inventive concept.

FIG. 9A illustrates a layout of a semiconductor device 1800 according to another embodiment of the inventive concept. The semiconductor device 1800 illustrated in FIG. 9A may be, for example, a DRAM, in particular, a DRAM having a unit cell size of 4F².

Figure 9B:
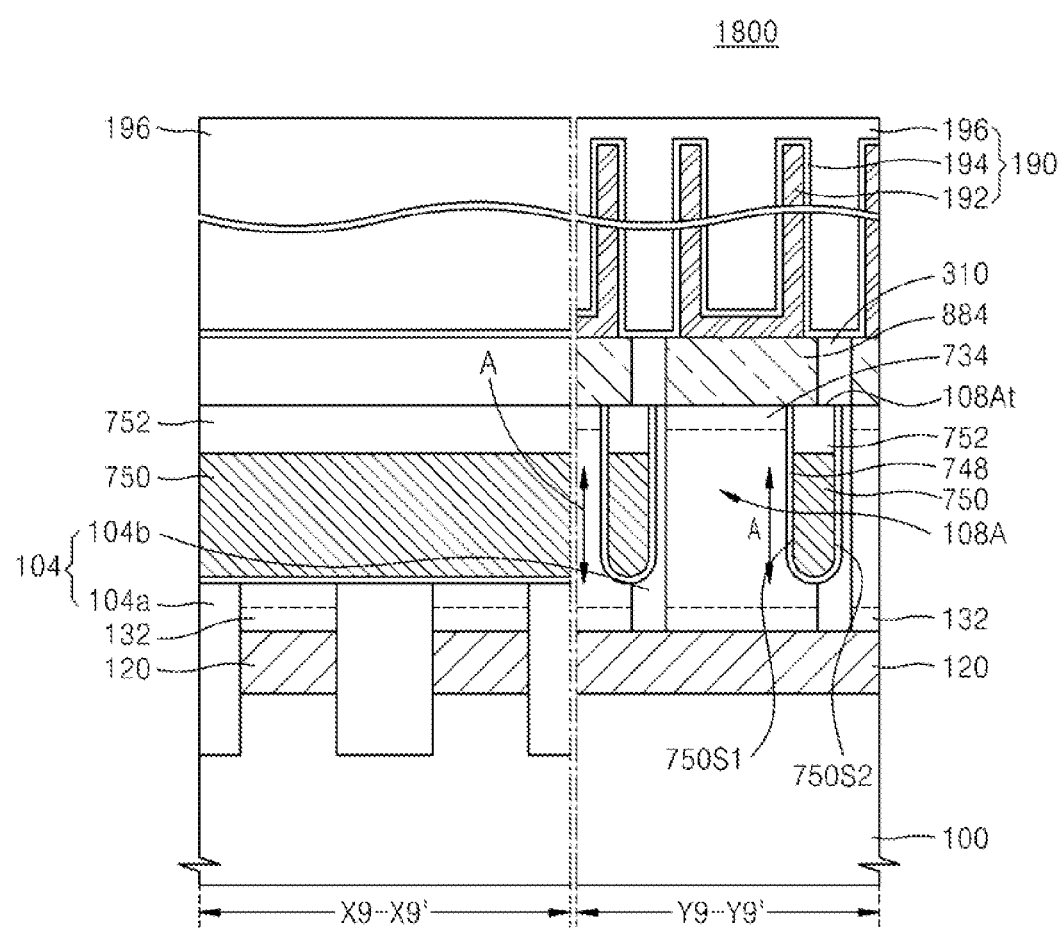
FIG. 9B is a cross-sectional view of the semiconductor device of FIG. 9A cut along lines X9-X9' and Y9-Y9' of FIG. 9A, respectively.

FIG. 9B is a cross-sectional view of the semiconductor device 1800 of FIG. 9A along cut lines X9-X9' and Y9-Y9' of FIG. 9A, respectively.

Like reference numerals in FIGS. 9A and 9B denote like elements in FIGS. 1A, 1B, 3A, 3B, 8A, and 8B. In this regard, detailed descriptions of the common elements are omitted.

Referring to FIGS. 9A and 9B, conductive landing pads 884 electrically connect each of the lower electrodes 192 to the second source/drain area 734 formed on the upper surface 108A*t* of the active area 108.

The conductive landing pads 884 are the same as the conductive landing pads 384 in FIGS. 3A and 3B. The conductive landing pads 884 are separated by interlayer insulating film patterns 310.

Figure 10A:
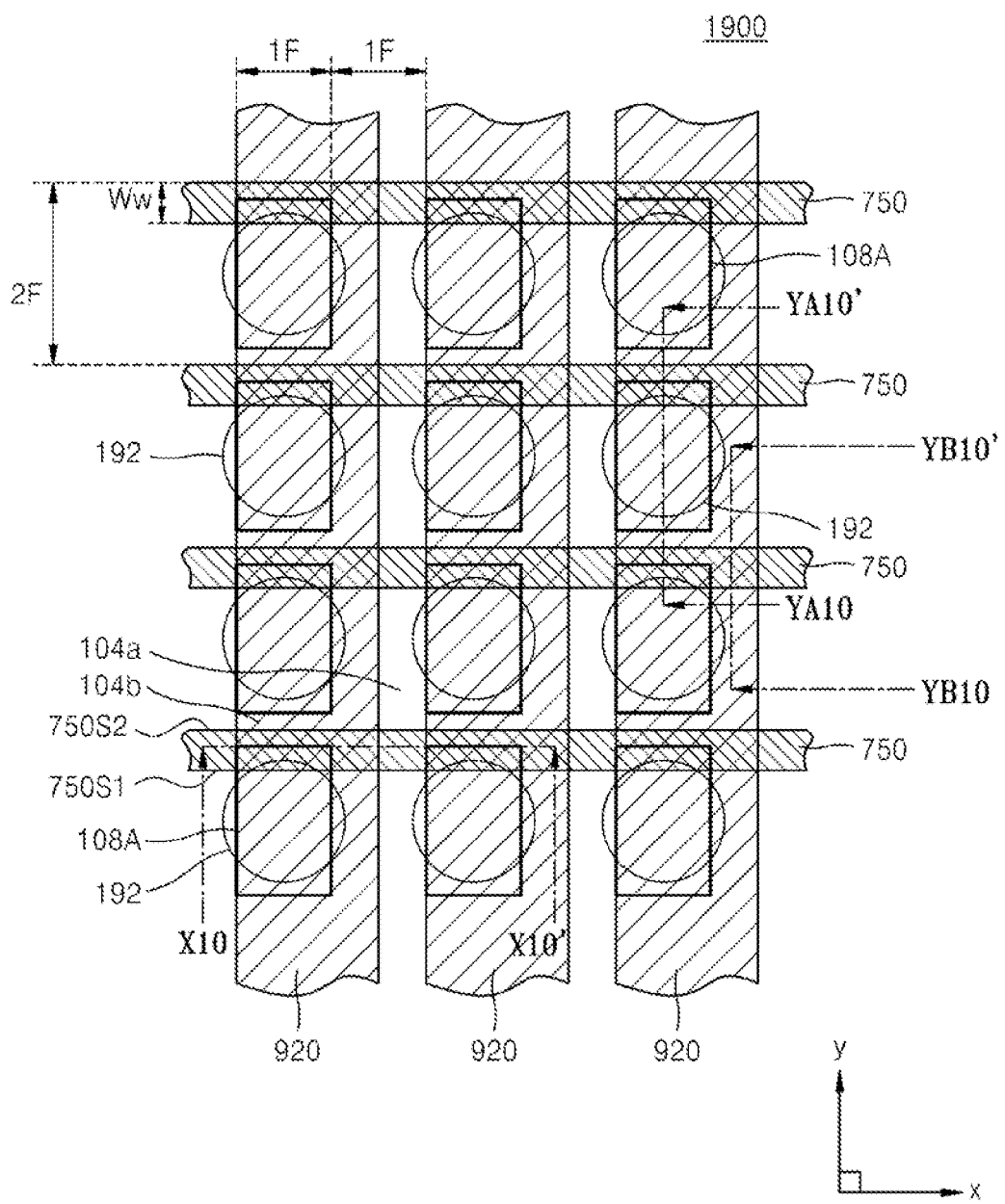
FIG. 10A illustrates a layout of a semiconductor device according to another embodiment of the inventive concept.

FIG. 10A illustrates a layout of a semiconductor device 1900 according to another embodiment of the inventive concept. The semiconductor device 1900 illustrated in FIG. 10A may be, for example, a DRAM, in particular, a DRAM having a unit cell size of 4F².

FIG. 10B is a cross-sectional view of the semiconductor device 1900 of FIG. 10A along cut lines X10-X10', YA10-YA10', and YB10-YB10' of FIG. 10A, respectively.

Like reference numerals in FIGS. 10A and 10B denote like elements in FIGS. 1A, 1B, 8A, and 8B. In this regard, detailed descriptions of the common elements are omitted.

Referring to FIGS. 10A and 10B, a plurality of buried bit lines 920 having upper surfaces that are lower than the plurality of buried word lines 750 are formed in the substrate 100. The plurality of buried bit lines 920 are parallel to a main surface of the substrate 100 and extend in a second direction ('y' direction in FIG. 10A) that is perpendicular to a first direction ('x' direction in FIG. 10A).

The plurality of buried bit lines 920 may each include a first bit line portion 922, a second bit line portion 924; and a third bit line portion 926 that are connected to each other.

Viewed from the top of the substrate 100, the first bit line portion 922 may overlap the plurality of active areas 108 arranged in a line in the second direction ('y' direction in FIG. 10A) and the plurality of second isolation portions 104*b* arranged in a line and interposed between the plurality of active areas 108.

The second bit line portion 924 extends from the first bit line portion 922 in the first direction ('x' direction in FIG. 10A). Some portions of the second bit line portion 924 may be surrounded by the first isolation portions 104*a*.

The third bit line portion 926 is interposed between the first bit line portion 922 and the second bit line portion 924.

The first bit line portion 922, the second bit line portion 924, and the third bit line portion 926 may each include materials that differ from each other. For example, the first bit line portion 922 may be an ion implantation area in the substrate 100. The second bit line portion 924 may include a metal or a metal nitride. The third bit line portion 926 may include a metal silicide. For example, the third bit line portion 926 may include a metal silicide that results from a silicide reaction of Si included in the substrate 100 with a metal component included in the second bit line portion 924.

The first bit line portion 922, the second bit line portion 924, and the third bit line portion 926 may be formed using the same process used to form the first bit line portion 422, the second bit line portion 424, and the third bit line portion 426 illustrated in FIGS. 4A and 4B.

The process of forming the first bit line portion 422, the second bit line portion 424, and the third bit line portion 426 illustrated in FIGS. 4A and 4B will be described with reference to FIGS. 16A through 16H.

Figure 11A:
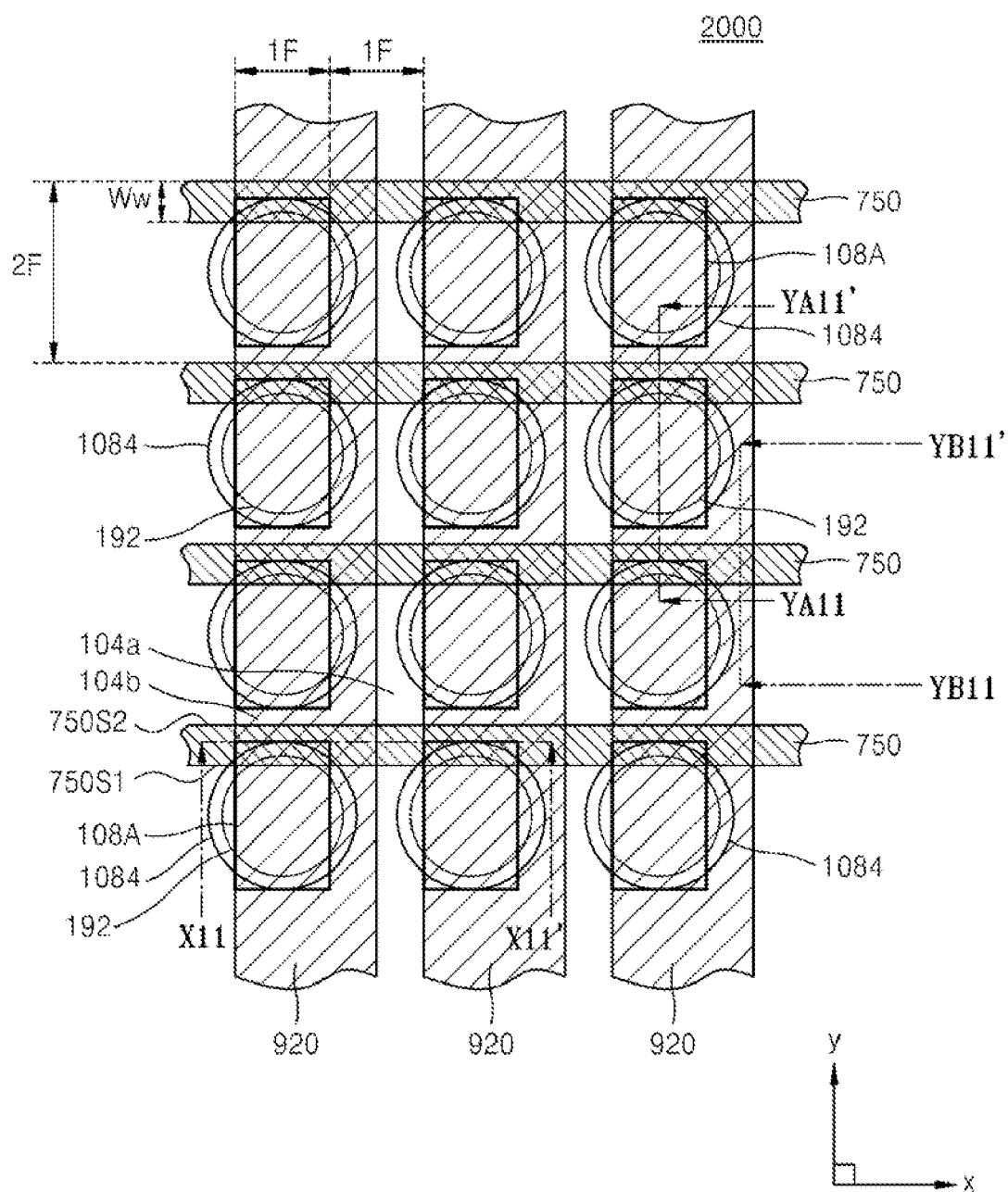
FIG. 11A illustrates a layout of a semiconductor device according to another embodiment of the inventive concept.

FIG. 11A illustrates a layout of a semiconductor device 2000 according to another embodiment of the inventive concept. The semiconductor device 2000 illustrated in FIG. 11A may be, for example, a DRAM, in particular, a DRAM having a unit cell size of 4F².

Figure 11B:
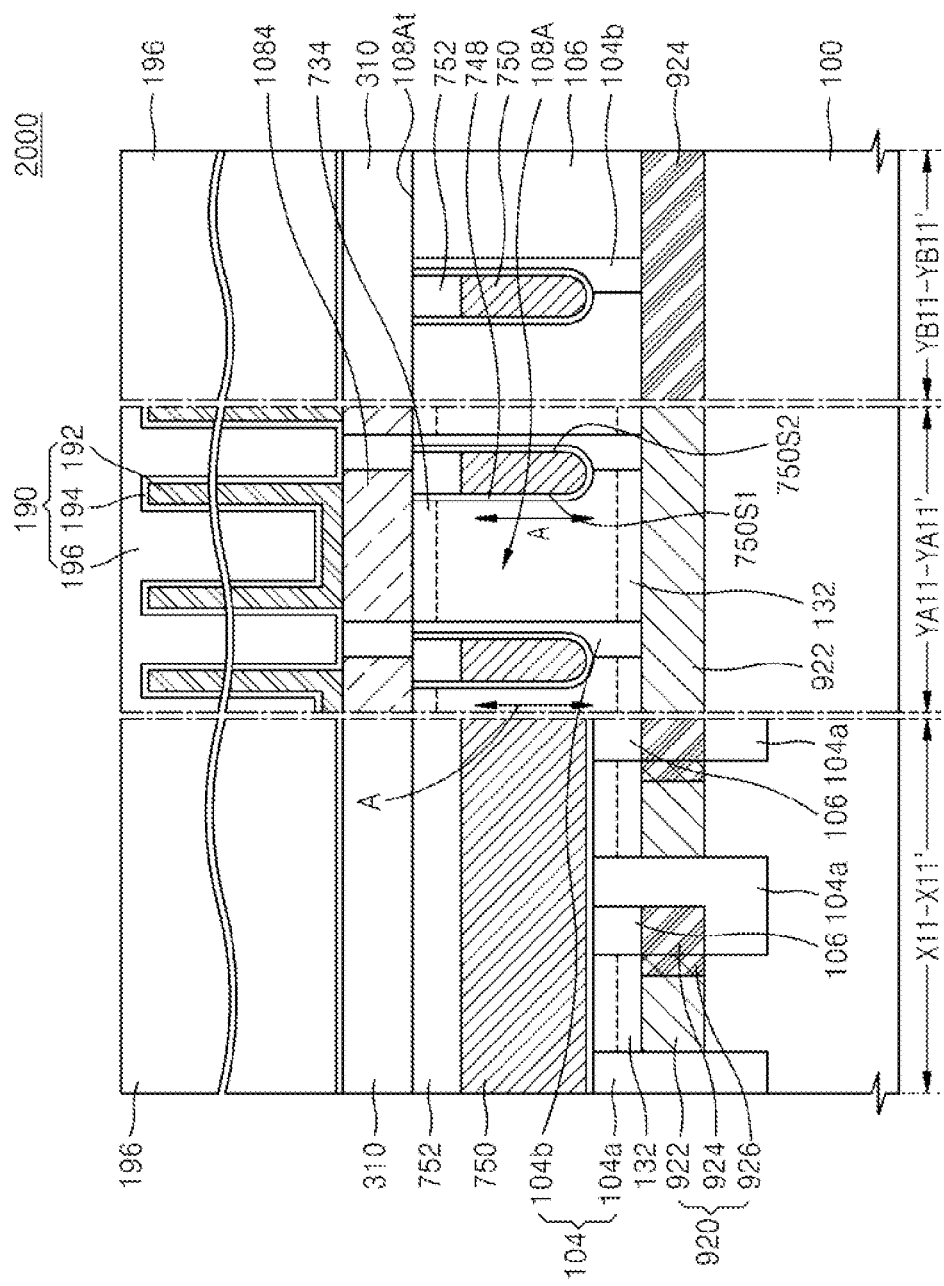
FIG. 11B is a cross-sectional view of the semiconductor device of FIG. 11A cut along lines X11-X11', YA11-YA11', and YB11-YB11' of FIG. 11A, respectively.

FIG. 11B is a cross-sectional view of the semiconductor device 2000 of FIG. 11A along cut lines X11-X11', YA11-YA11', and YB11-YB11' of FIG. 11A, respectively.

Like reference numerals in FIGS. 11A and 11B denote like elements in FIGS. 1A, 1B, 8A, 8B, 10A, and 10B. In this regard, detailed descriptions of the common elements are omitted.

Referring to FIGS. 11A and 11B, conductive landing pads 1084 electrically connect each of the lower electrodes 192 to the second source/drain area 734 formed on the upper surface 108A*t* of the active area 108.

The conductive landing pads 1084 are the same as the conductive landing pads 384 in FIGS. 3A and 3B. The conductive landing pads 1084 are separated by interlayer insulating film patterns 310.

Figure 12A:
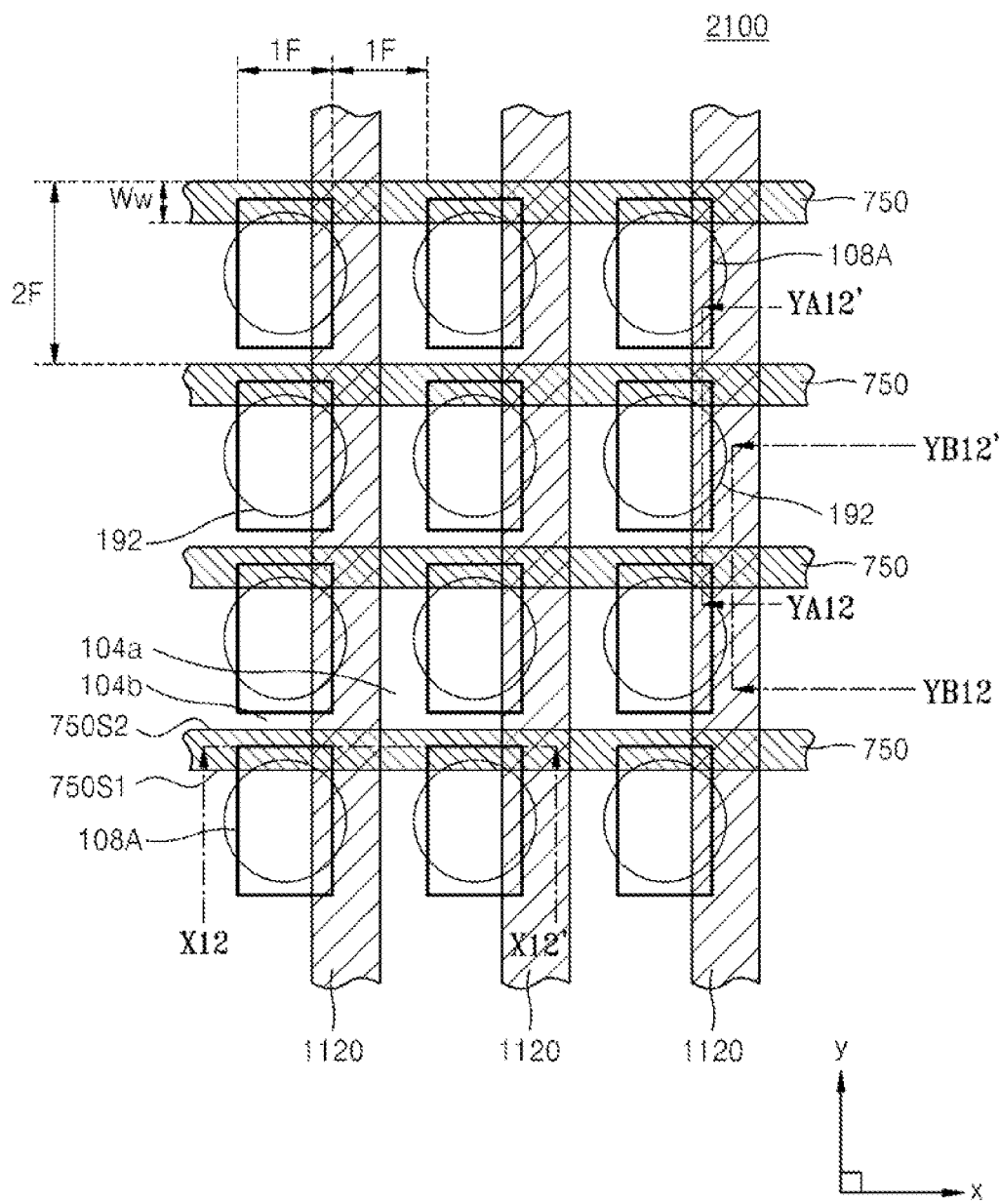
FIG. 12A illustrates a layout of a semiconductor device according to another embodiment of the inventive concept.

FIG. 12A illustrates a layout of a semiconductor device 2100 according to another embodiment of the inventive concept. The semiconductor device 2100 illustrated in FIG. 12A may be, for example, a DRAM, in particular, a DRAM having a unit cell size of 4F².

Figure 12B:
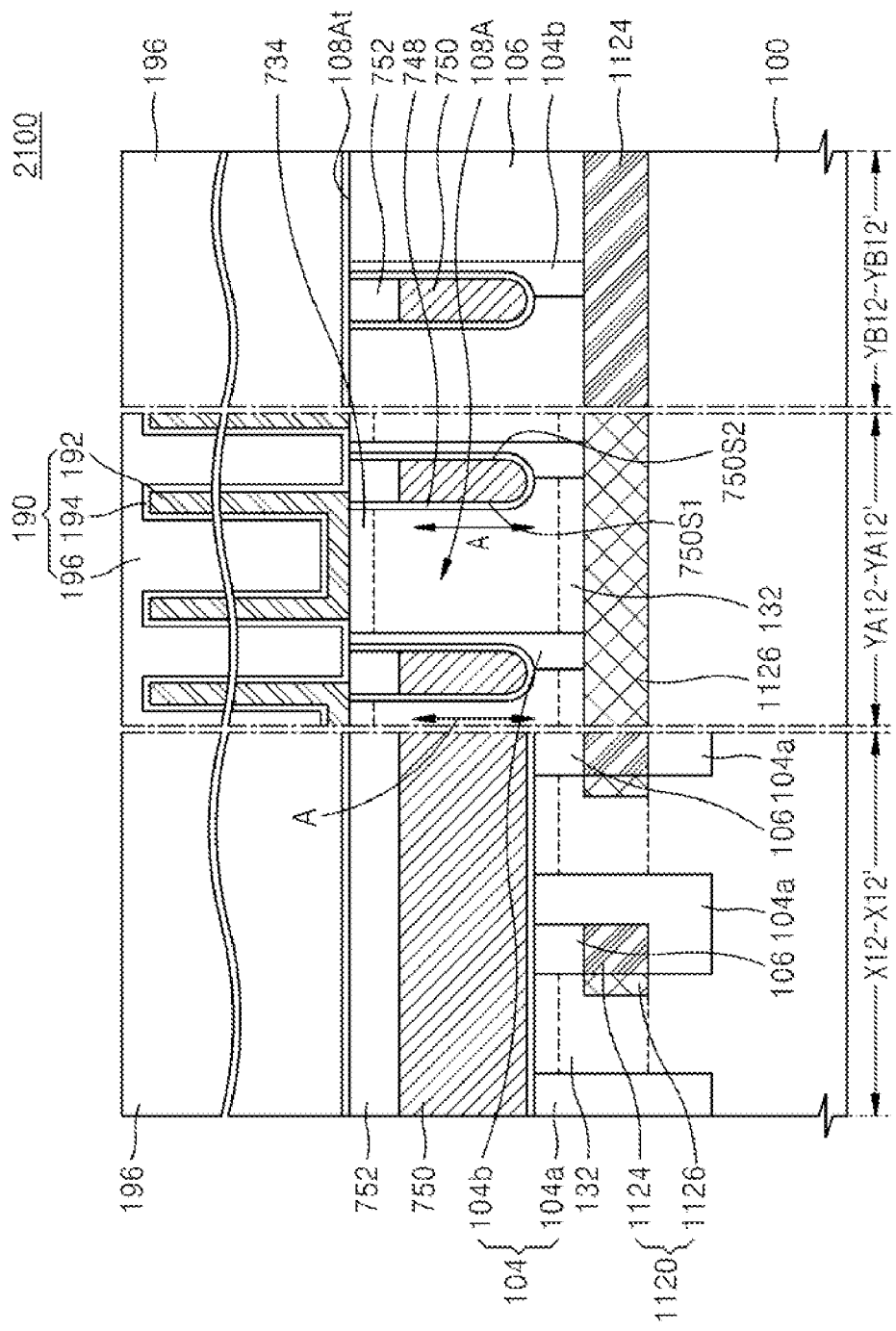
FIG. 12B is a cross-sectional view of the semiconductor device of FIG. 12A cut along lines X12-X12', YA12-YA12', and YB12-YB12' of FIG. 12A, respectively.

FIG. 12B is a cross-sectional view of the semiconductor device 2100 of FIG. 12A along cut lines X12-X12', YA12-YA12', and YB12-YB12' of FIG. 12A, respectively.

Like reference numerals in FIGS. 12A and 12B denote like elements in FIGS. 1A, 1B, 8A, and 8B. In this regard, detailed descriptions of the common elements are omitted.

Referring to FIGS. 12A and 12B, a plurality of buried bit lines 1120 having the upper surfaces that are lower than the plurality of buried word lines 750 are formed in the substrate 100. The plurality of buried bit lines 1120 are parallel to a main surface of the substrate 100 and extend in a second direction ('y' direction in FIG. 12A) that is perpendicular to a first direction ('x' direction in FIG. 12A).

The plurality of buried bit lines 1120 may each include a first bit line portion 1124 and a second bit line portion 1126 that are connected to each other.

The first bit line portion 1124 extends a predetermined width in the first direction ('x' direction in FIG. 12A) from the sidewall of the active area 108A for some portions of the first bit line portion 1124 to be surrounded by the first isolation portion 104*a*.

The second bit line portion 1126 may overlap the plurality of active areas 108 arranged in a line in the second direction ('y' direction in FIG. 12A) and the plurality of second isolation portions 104b arranged in a line and interposed between the plurality of active areas 108.

The first bit line portion 1124 and the second bit line portion 1126 may include materials that differ from each other. For example, the first bit line portion 1124 may include a metal or a metal nitride and the second bit line portion 1126 may include a metal silicide. For example, the second bit line portion 1126 may include a metal silicide which results from a silicide reaction of Si included in the substrate 100 with a metal component included in the first bit line portion 1124.

In FIGS. 12A and 12B, the first sidewalls 750S1 of buried word lines 750 are each surrounded by the active areas 108A, and the second side walls 750S2, which are opposite to the first sidewalls 750S1, are surrounded by the second isolation portions 104b of the isolation layer 104. Vertical channels indicated by the arrow A in FIG. 12B are interposed in the active area 108A between the first source/drain area 132 formed on the second bit line portion 1126 and the second source/drain area 734 near the first side walls 750S1 of the buried word line 750.

The first bit line portion 1124 and the second bit line portion 1126 may be formed using the same process used to form the first bit line portion 524 and the second bit line portion 526 illustrated in FIGS. 6A and 6B. The process of forming the first bit line portion 524 and the second bit line portion 526 illustrated in FIGS. 6A and 6B will be described with reference to FIGS. 18A through 18D.

Figure 13A:
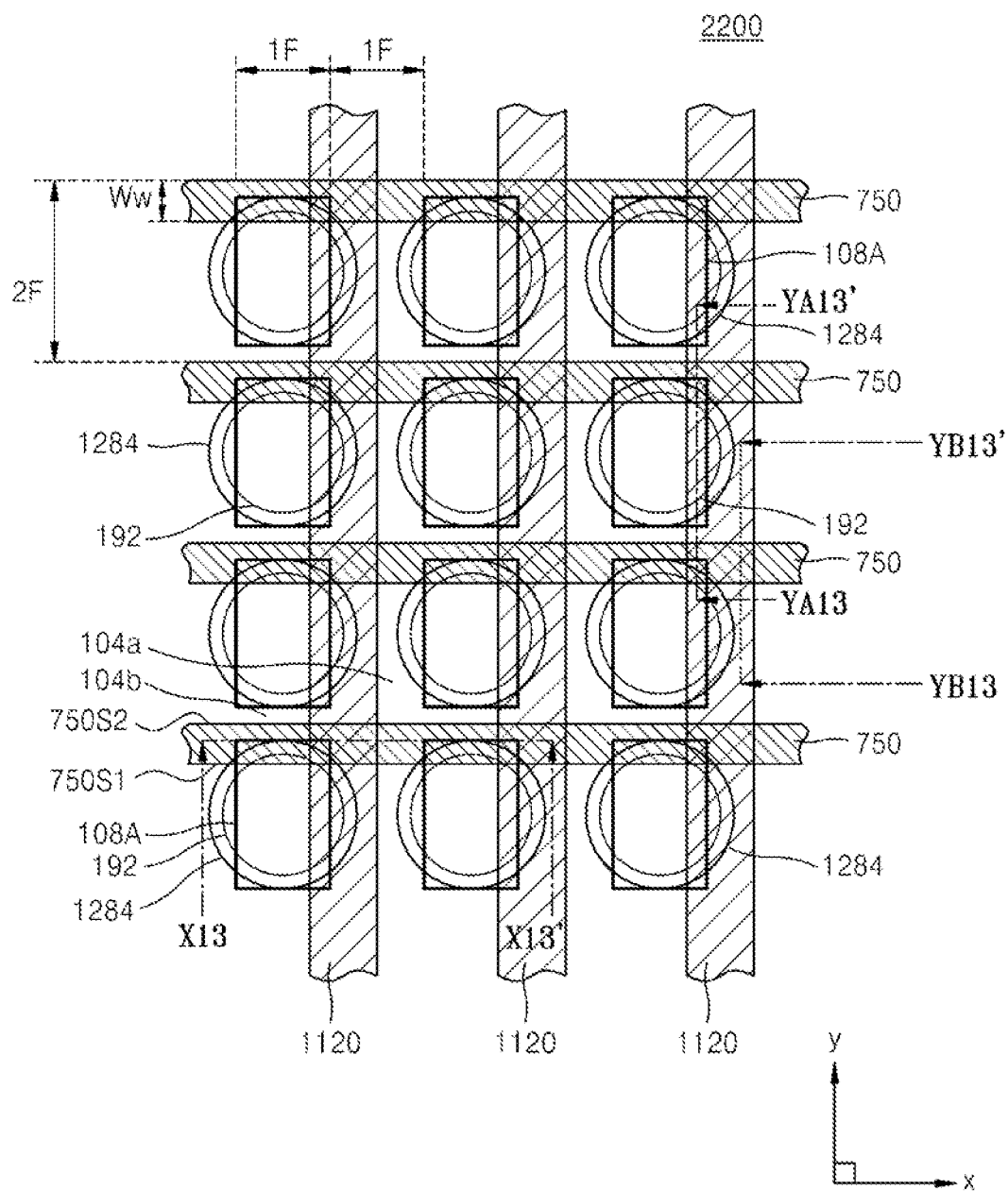
FIG. 13A illustrates a layout of a semiconductor device according to another embodiment of the inventive concept.

FIG. 13A illustrates a layout of a semiconductor device 2200 according to another embodiment of the inventive concept. The semiconductor device 2200 illustrated in FIG. 13A may be, for example, a DRAM, in particular, a DRAM having a unit cell size of $4F^2$.

Figure 13B:
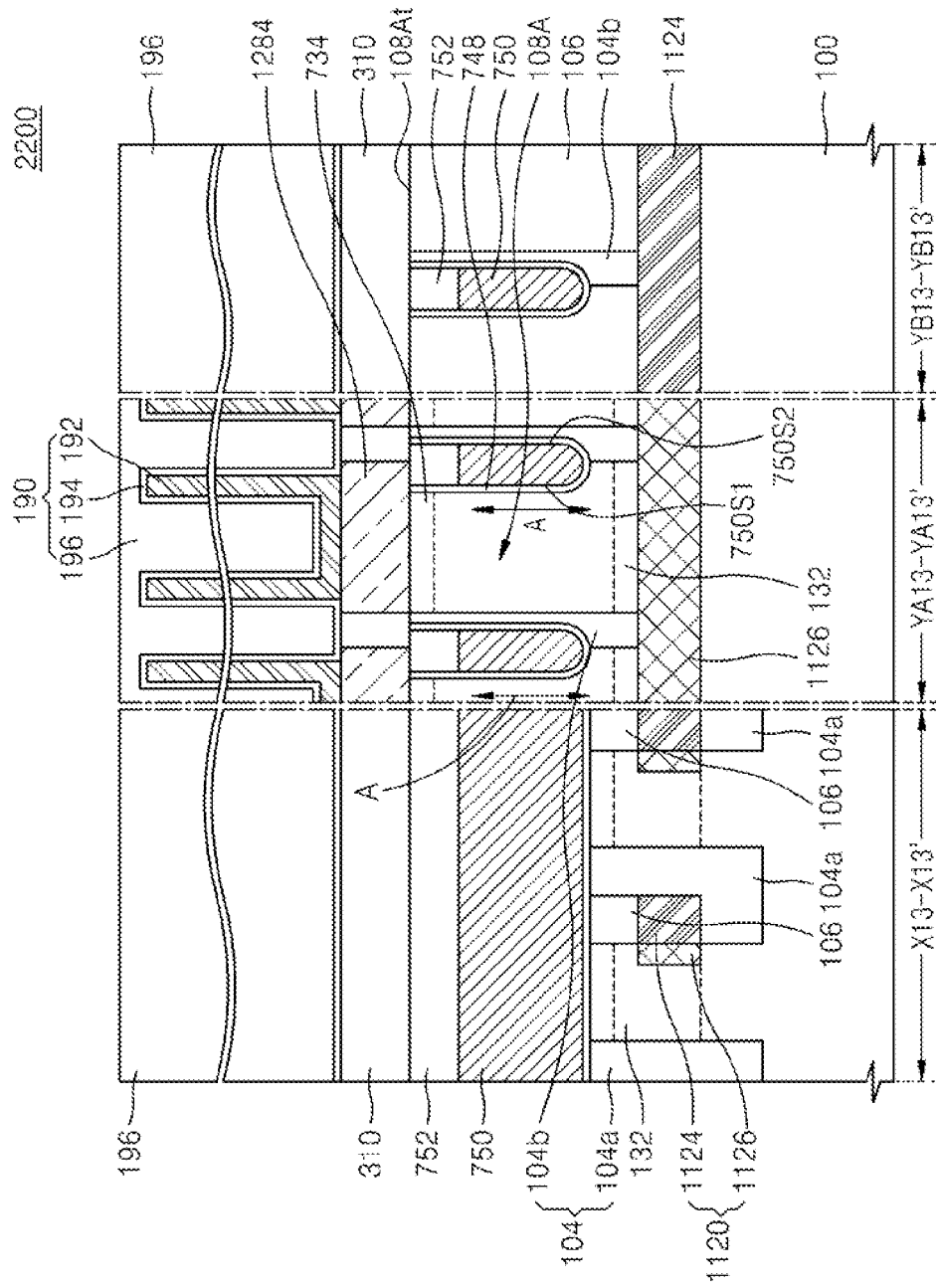
FIG. 13B is a cross-sectional view of the semiconductor device of FIG. 13A cut along lines X13-X13', YA13-YA13', and YB13-YB13' of FIG. 13A, respectively.

FIG. 13B is a cross-sectional view of the semiconductor device 2200 of FIG. 13A along cut lines X13-X13', YA13-YA13', and YB13-YB13' of FIG. 13A, respectively.

Like reference numerals in FIGS. 13A and 13B denote like elements in FIGS. 1A, 1B, 8A, 8B, 12A, and 12B. In this regard, detailed descriptions of the common elements are omitted.

Referring to FIGS. 13A and 13B, conductive landing pads 1284 electrically connect each of the lower electrodes 192 to the second source/drain area 734 formed on the upper surface 108At of the active area 108.

The conductive landing pads 1284 are the same as the conductive landing pads 384 in FIGS. 3A and 3B. The conductive landing pads 1284 are separated by interlayer insulating film patterns 310.

Hereinafter, a method of manufacturing the semiconductor devices 1100, 1200, 1300, 1400, 1500, 1600, 1700, 1800, 1900, 2000, 2100, and 2200 according to embodiments of the inventive concept is described more fully.

Figure 14A:
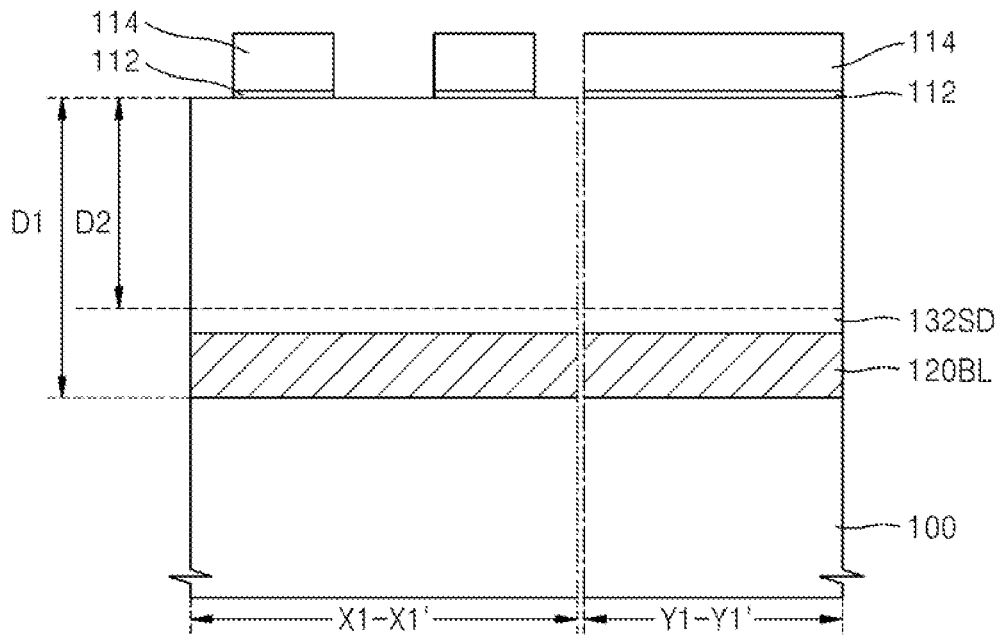
FIGS. 14A through 14O are cross-sectional views illustrating a method of manufacturing the semiconductor device of FIGS. 1A and 1B, according to an embodiment of the inventive concept.

FIGS. 14A through 14O are cross-sectional views sequentially illustrating a method of manufacturing a semiconductor device 1100 of FIGS. 1A and 1B, according to an embodiment of the inventive concept.

FIGS. 14A through 14O illustrate cross-sectional views of the semiconductor device 1100 along the cut lines X1-X1' and Y1-Y1' of FIG. 1A as shown in FIG. 1B.

Referring to FIG. 14A, impurity ions are implanted in the substrate 100, such as a silicon substrate, and a first ion implantation area 120BL for forming buried bit lines is formed at the first depth D1 below the upper surface of the substrate 100. For example, n-type impurities may be implanted in the substrate 100 to form the first ion implantation area 120BL.

The first ion implantation area 120BL is formed throughout the substrate 100.

A second ion implantation area 132SD for forming a first source/drain area is formed in the substrate 100. The second ion implantation area 132SD is formed on the first ion implantation area 120BL and contacts the first ion implantation area 120BL. The second ion implantation area 132SD is formed at the second depth D2 below the upper surface of the substrate 100, where the second depth D2 is less than the first depth D1.

Then, first pad oxide film patterns 112 and first mask patterns 114 exposing the substrate 100 are stacked on the substrate 100. Each of the first mask patterns 114 may be a hard mask pattern including a nitride film or a polysilicon film. Also, the first mask patterns 114 may include a structure on which the hard mask pattern and a photoresist pattern are stacked.

Figure 14B:
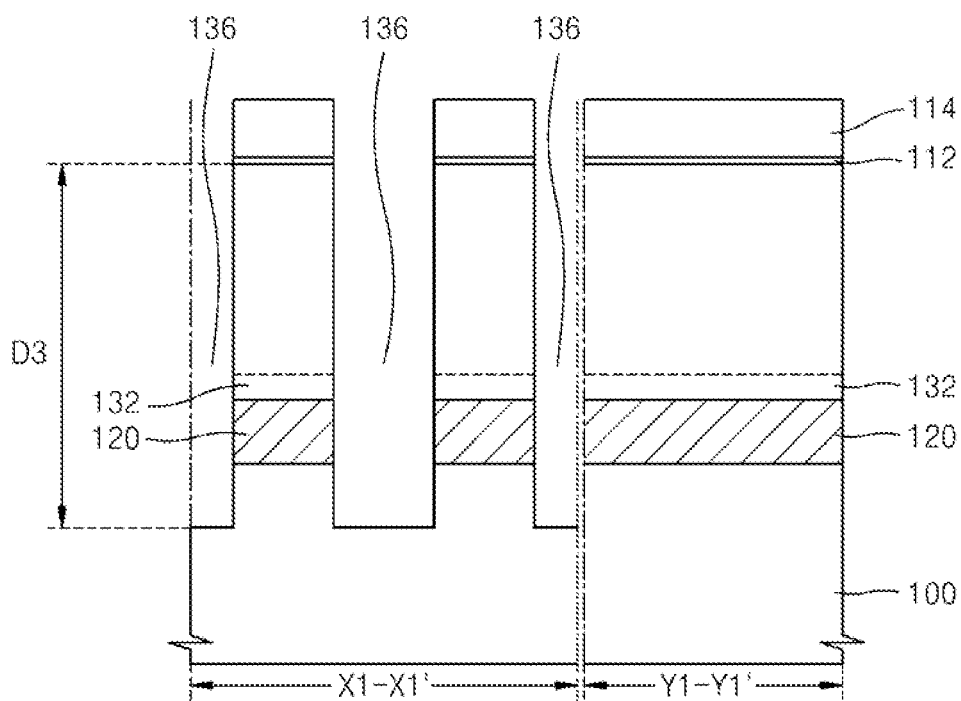

Referring to FIG. 14B, the exposed substrate 100 is etched using the first mask patterns 114 as an etching mask to form a plurality of first trenches 136 having a third depth D3 that is greater than the first depth D1. The plurality of first trenches 136 are in the form of a plurality of line patterns that extend to be parallel each other in one direction ('y' direction in FIG. 1A) in the substrate 100.

As the plurality of first trenches 136 are formed, the first ion implantation area 120BL and the second ion implantation area 132SD are each divided into a plurality of first source/drain areas 132 and a plurality of buried bit lines 120.

Figure 14C:
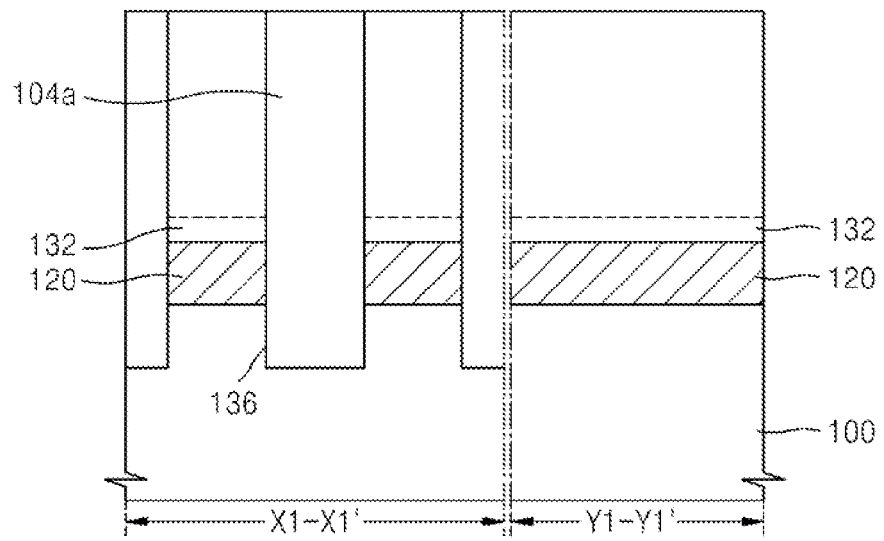

Referring to FIG. 14C, an insulating material is deposited on the substrate 100 to completely fill the plurality of first trenches 136 and the deposited insulating material is planarized until the upper surface of the substrate 100 is exposed, forming a plurality of first isolation portions 104a that fill the plurality of first trenches 136.

The insulating material that forms the first isolation portions 104a may include an oxide, such as Tonen SilaZene (TOSZ).

Figure 14D:
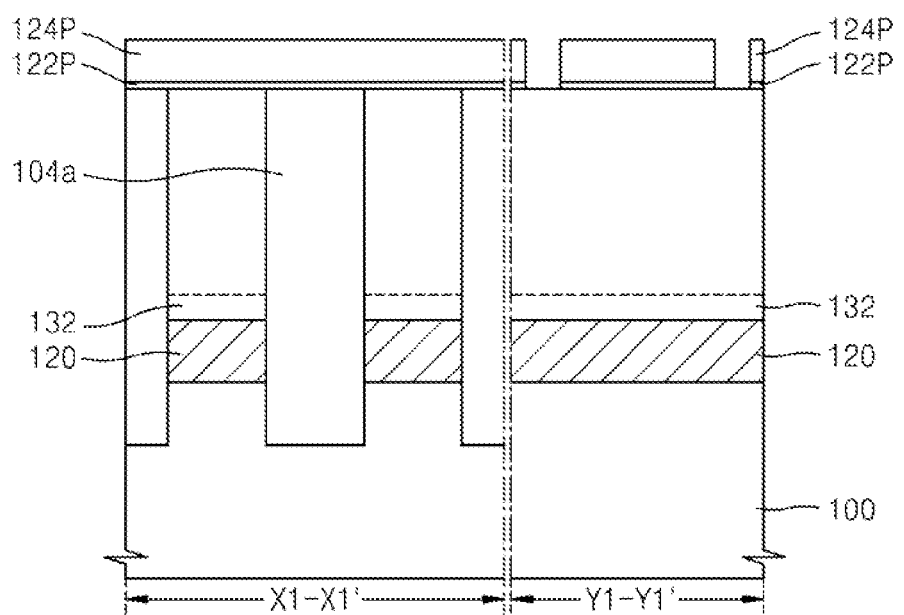

Referring to FIG. 14D, to expose a part of the substrate 100, a second pad oxide film pattern 122p and a second mask pattern 124p are stacked on the first isolation portions 104a and the substrate 100. The second mask pattern 124p may be a hard mask pattern including a nitride film or a polysilicon film. Also, the second mask pattern 124p may include a structure on which the hard mask pattern and a photoresist pattern are stacked.

Figure 14E:
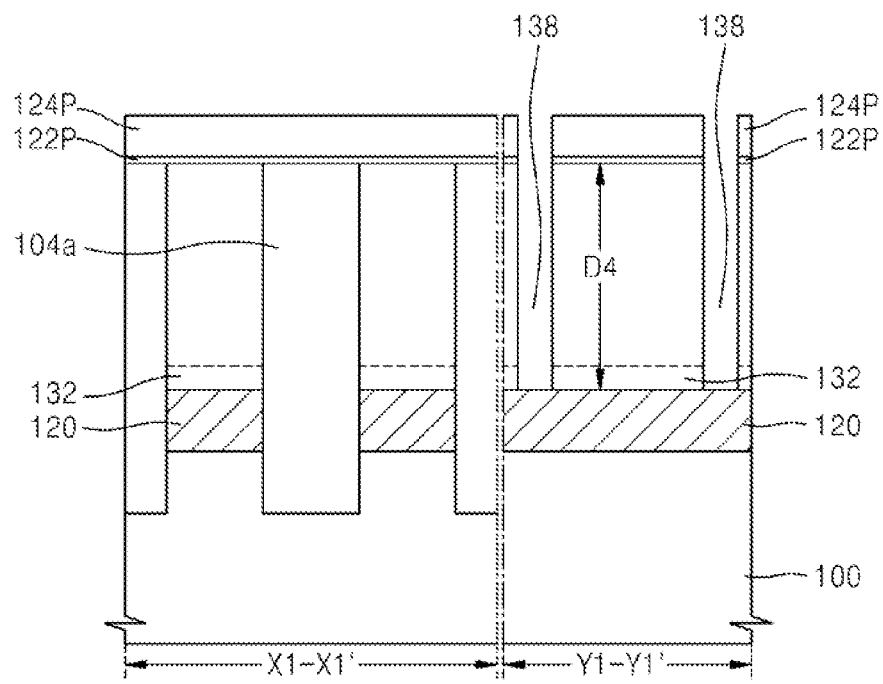

Referring to FIG. 14E, the exposed substrate 100 is etched using the second mask pattern 124p as an etching mask to form a plurality of second trenches 138 having a fourth depth D4 that is less than the first depth D1. The plurality of second trenches 138 are in the form of a plurality of line patterns that extend to be parallel to each other in one direction ('y' direction in FIG. 1A) in the substrate 100.

Figure 14F:
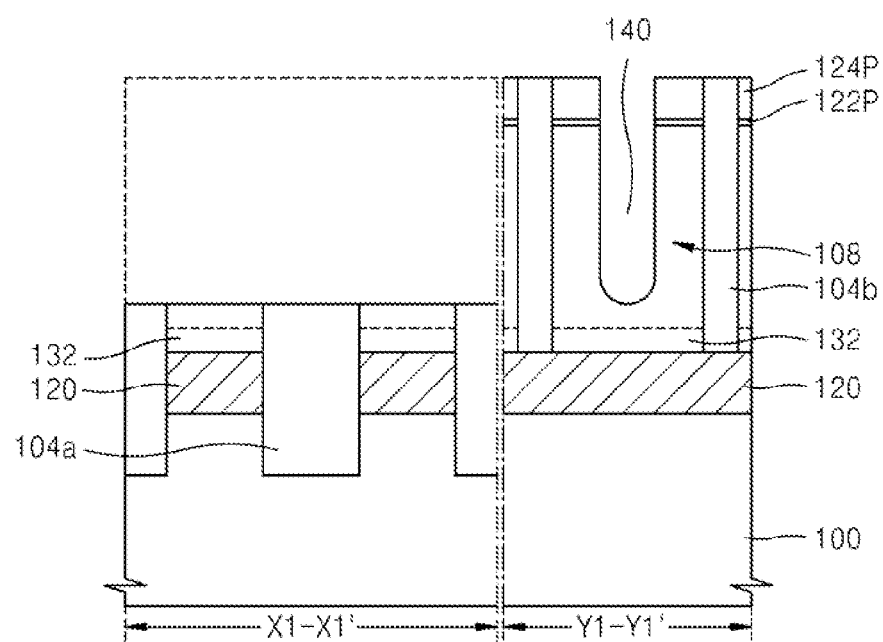

Referring to FIG. 14F, an insulating layer is formed on the substrate 100 to completely fill the second trenches 138 and chemical mechanical polishing (CMP) or an etch back process is performed on the insulating layer until the upper surface of the second mask pattern 124p is exposed, forming a plurality of second isolation portions 104b that fill the plurality of second trenches 138.

The insulating material that forms the second isolation portions 104b may include an oxide, for example, TOSZ.

The second isolation portions 104b may extend to cross the first isolation portions 104a and to be perpendicular to an extending direction of the first isolation portions 104a.

The first isolation portions 104a and the second isolation portions 104b may form a net shaped isolation layer 104 which defines a plurality of active areas 108 in the form of islands, as depicted in FIGS. 2A, 2B, 2C, and 2D.

Then, the stacked structure of the second pad oxide film pattern 122p and the second mask pattern 124p is patterned again, and a structure is formed which exposes the upper surface of the active area 108 interposed between two adjacent second isolation portions 104b.

Next, the exposed active area 108 is etched using the second mask pattern 124p, and a third trench 140 for forming word lines is formed in the active area 108.

Figure 14G:
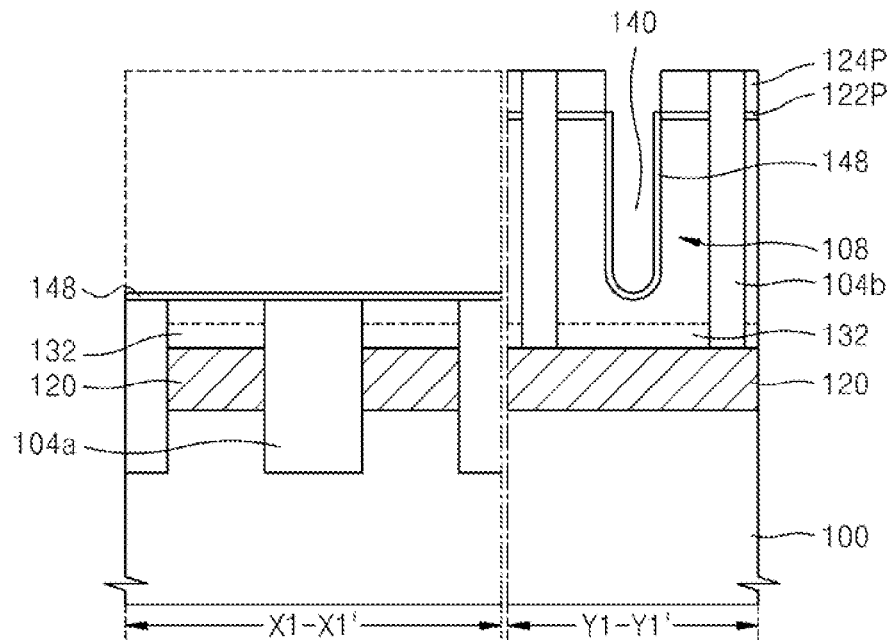

Referring to FIG. 14G, the gate dielectric film 148 is formed on the inner wall of the third trench 140. The gate dielectric film 148 may be a thermal oxide film.

Figure 14H:
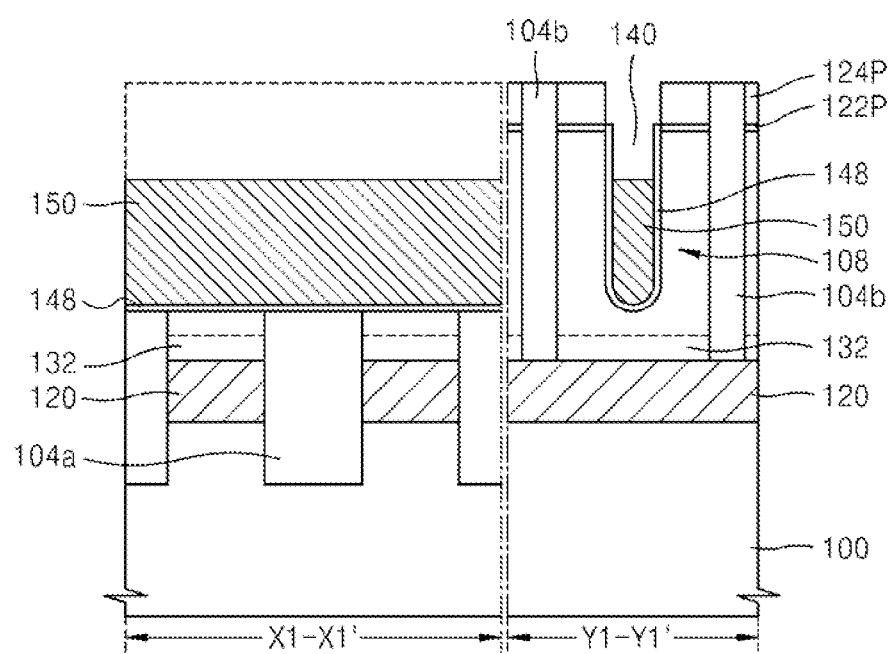

Referring to FIG. 14H, the buried word lines 150 are formed on the gate dielectric film 148 in the third trench 140.

The buried word lines 150 have upper surfaces that are lower than the upper surface of the substrate 100 in the active area 108. After the buried word lines 150 are formed, the upper portion of the third trench 140 above the buried word lines 150 remains empty. The buried word lines 150 are extended to be parallel to the plurality of second isolation portions 104b.

To form the buried word lines 150, a conductive layer that completely fills the third trench 140 is formed on the structure of FIG. 14G in which the gate dielectric film 148 is formed and then the conductive layer is etched back again, forming the buried word lines 150 in the third trench 140.

The buried word lines 150 may be formed of doped polysilicon. Also, the buried word lines 150 may include a metal such as tungsten (W), aluminum (Al), copper (Cu), molybdenum (Mo), titanium (Ti), tantalum (Ta), or ruthenium (Ru). In addition, the buried word lines 150 may include a metal nitride such as TiN, Ti/TiN, WN, W/WN, TaN, Ta/TaN, TiSiN, TaSiN, or WSiN.

Figure 14I:
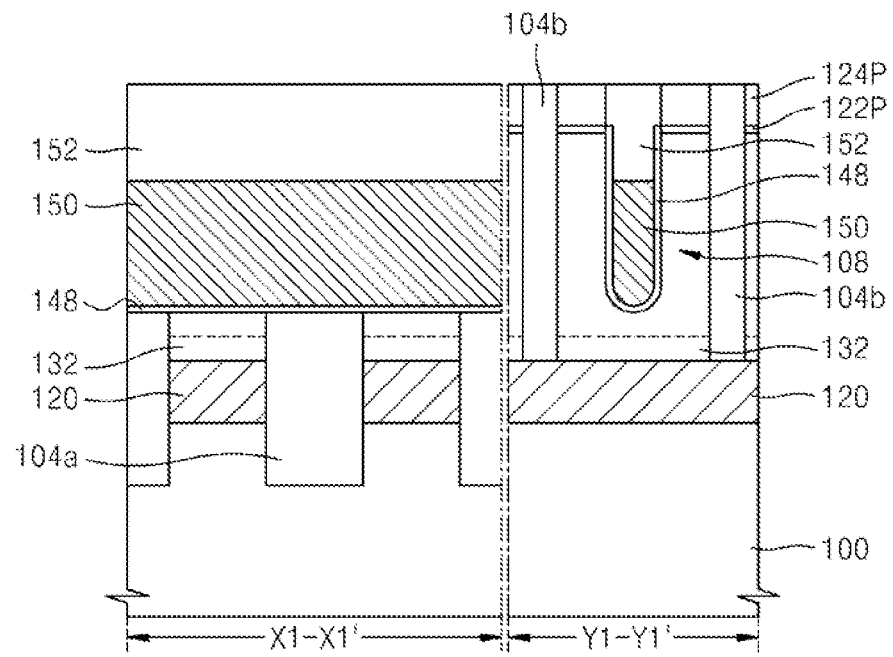

Referring to FIG. 14I, to completely fill the inside space at the top of the third trench 140, an insulating layer is formed on the buried word line 150 and the second mask pattern 124p and then CMP or an etch back process is performed on the insulating layer until the upper surface of the second mask pattern 124p is exposed, forming a capping layer 152 which completely fills the inside space of the upper portion of the third trench 140.

The insulating layer which forms the capping layer 152 may include an oxide or nitride.

Figure 14J:
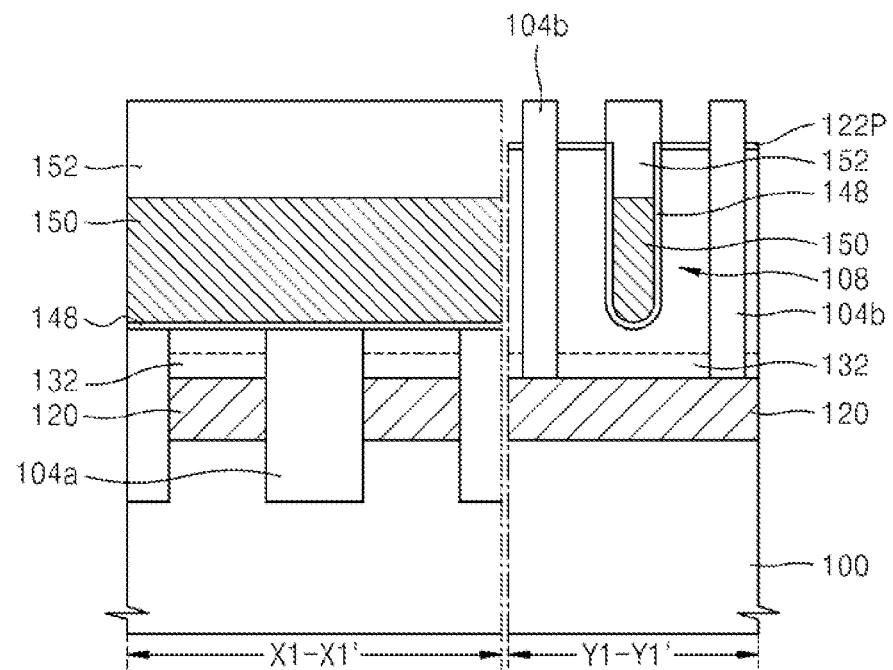

Referring to FIG. 14J, the second mask pattern 124p is removed to expose the second pad oxide film pattern 122p.

Figure 14K:
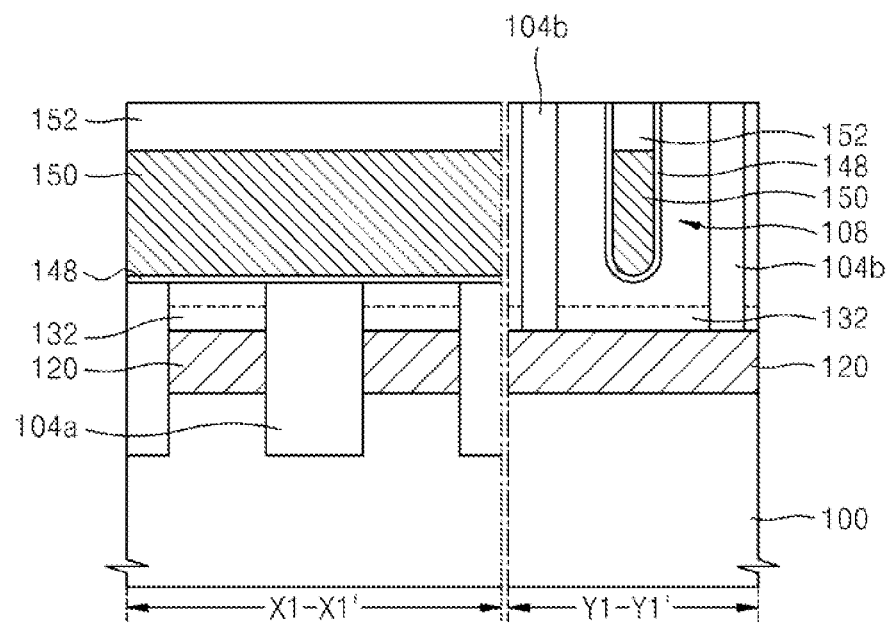

Referring to FIG. 14K, the second pad oxide film pattern 122p may be removed using wet etching. When the second isolation portions 104b, the capping layer 152 and the second pad oxide film pattern 122p each include an oxide film, a predetermined portion of the second isolation portions 104b and the capping layer 152 are removed until the second pad oxide film pattern 122p is removed, resulting in the second isolation portions 104b and the capping layer 152 having upper surfaces which are at the same level as that of the upper surface of the substrate 100.

The second pad oxide film pattern 122p, the second isolation portions 104b and the capping layer 152 may be wet etched using a HF etching solution, a LAL solution (HF+NH$_4$F+pure water), or a combination thereof.

Figure 14L:
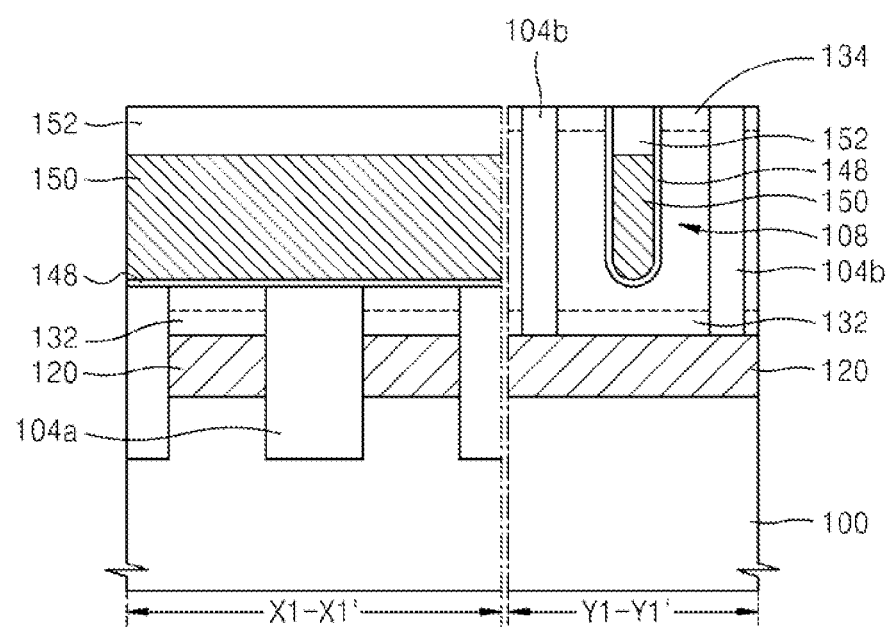

Referring to FIG. 14L, impurity ions are implanted from the upper surface of the on the active area 108 to form the second source/drain area 134.

The ion implantation process for forming the second source/drain area 134 may be performed simultaneously with an ion implantation process of forming a source/drain area of a transistor (not illustrated) for a peripheral circuit formed in a peripheral circuit area (not illustrated) of the substrate 100.

Figure 14M:
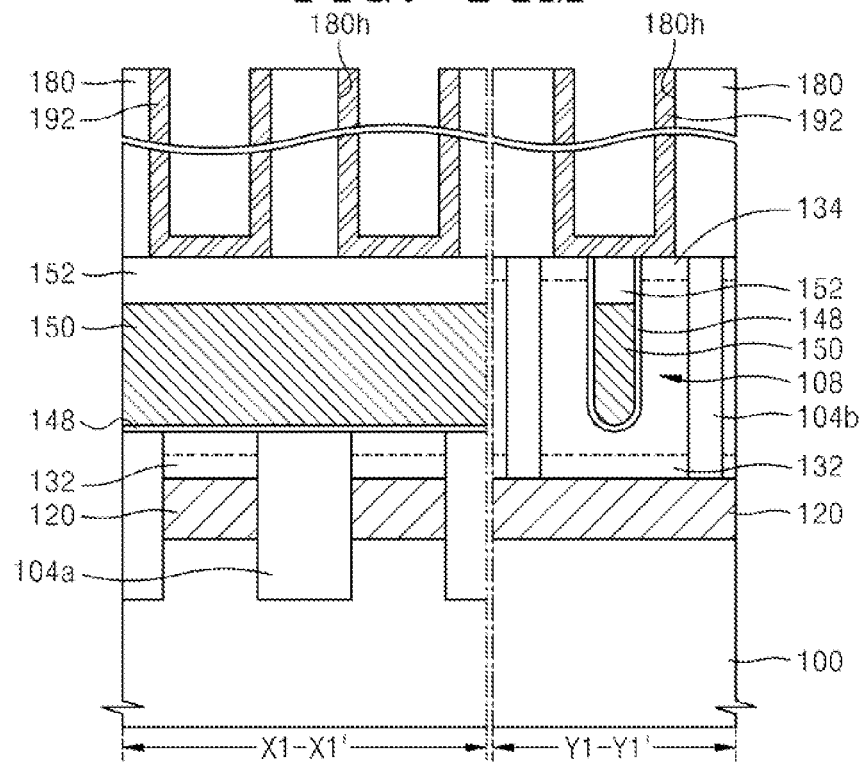

Referring to FIG. 14M, the lower electrodes 192 which directly contact the second source/drain area 134 are formed on the second source/drain area 134 and the capping layer 152.

To form the lower electrodes 192, sacrificial insulating film patterns 180, including a plurality of storage node holes 180h, are formed on the first isolation portions 104a and the second isolation portions 104b. The capping layer 152 and the second source/drain area 134 disposed on both sides of the capping layer 152 are each exposed through the storage node holes 180h of the sacrificial insulating film patterns 180.

The sacrificial insulating film patterns 180 may include a boro-phospho-silicate glass (BPSG), a high density plasma (HDP) oxide, or a polysilazane based inorganic silicon-on-glass film (TOSZ). Although not illustrated, the sacrificial insulating film patterns 180 may include an etching blocking layer at the bottom thereof. The etching blocking layer may function as an etch stopper during an etching process of forming the storage node holes 180h.

Then, a conductive layer is formed on the inner walls of each of the plurality of storage node holes 180h, and the upper surfaces of the sacrificial insulating film patterns 180 and the conductive layer are etched back until the upper surfaces of the sacrificial insulating film patterns 180 are exposed, forming a plurality of lower electrodes 192 including portions remaining in the plurality of storage node holes 180h. The plurality of lower electrodes 192 may be as illustrated in FIGS. 1A and 1B.

The lower electrodes 192 may include Ti, TiN, or a structure in which Ti and TiN are sequentially stacked, such as a Ti/TiN structure.

The lower electrodes 192 directly contact the second source/drain area 134 on the active area 108 disposed on both sides of the capping layer 152. Accordingly, in the semiconductor device 1100 manufactured using A process according to a current embodiment, both portions of each lower electrode 192 that are spaced apart from each other directly contact the second source/drain area 134.

Figure 14N:
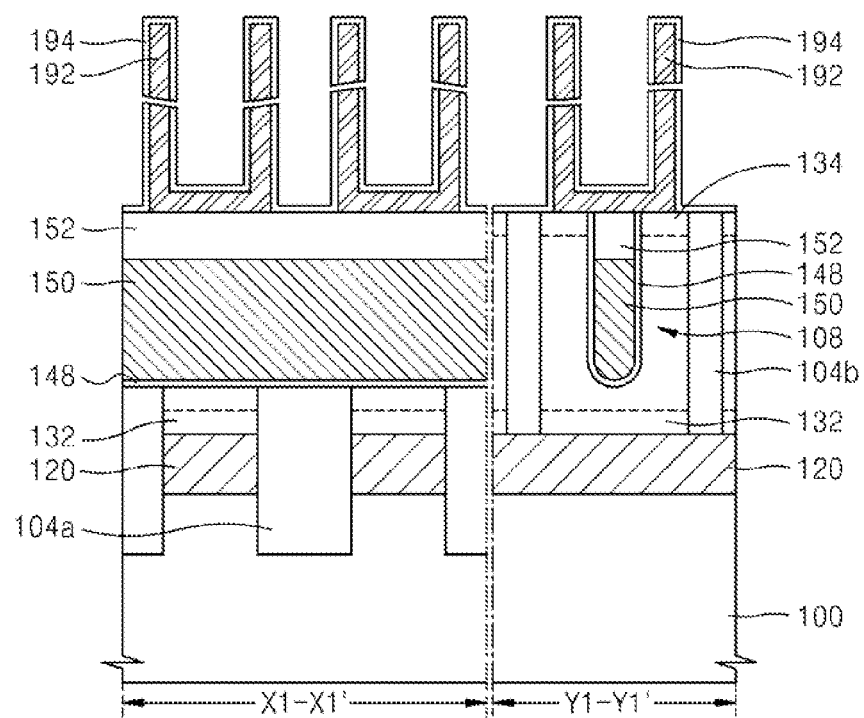
Figure 140:
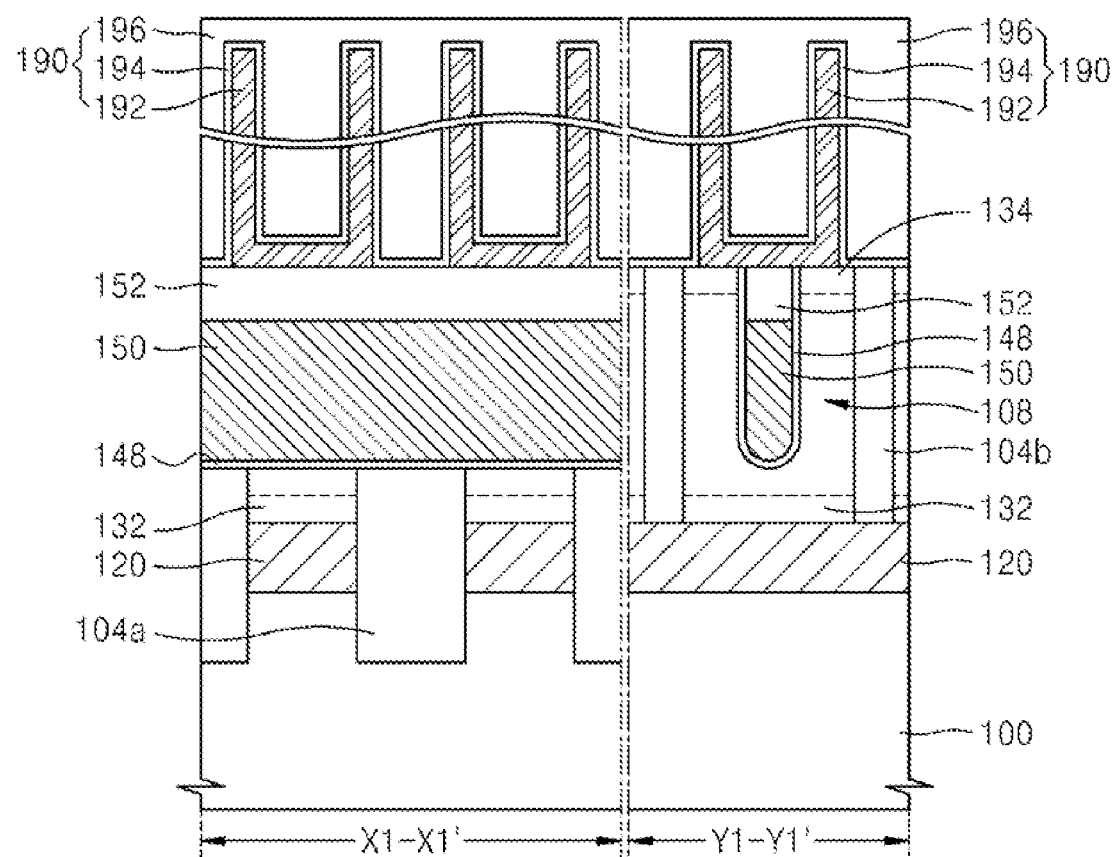

Referring to FIG. 14N, the sacrificial insulating film patterns 180 are removed and then the dielectric films 194 are formed which cover the lower electrodes 192.

To remove the sacrificial insulating film patterns 180, an HF etching solution, a LAL solution (HF+NH$_4$F+pure water), or a combination thereof may be used.

Referring to FIG. 14O, the upper electrode 196 is formed on the dielectric films 194, thereby completing manufacture of the capacitors 190.

Figure 15A:
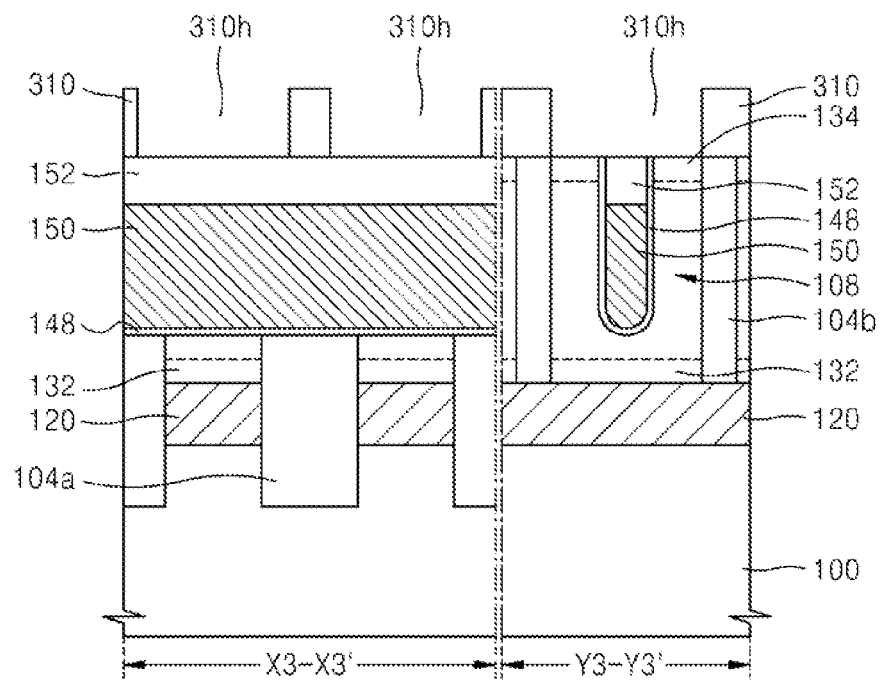
FIGS. 15A through 15C are cross-sectional views illustrating a method of manufacturing the semiconductor device of FIGS. 3A and 3B, according to another embodiment of the inventive concept.
Figure 15B:
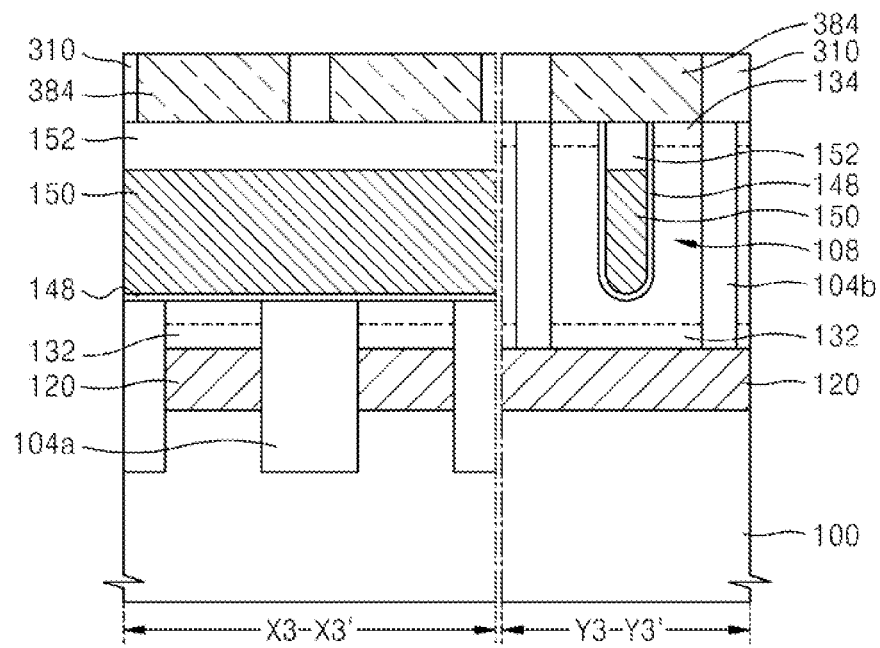
Figure 15C:
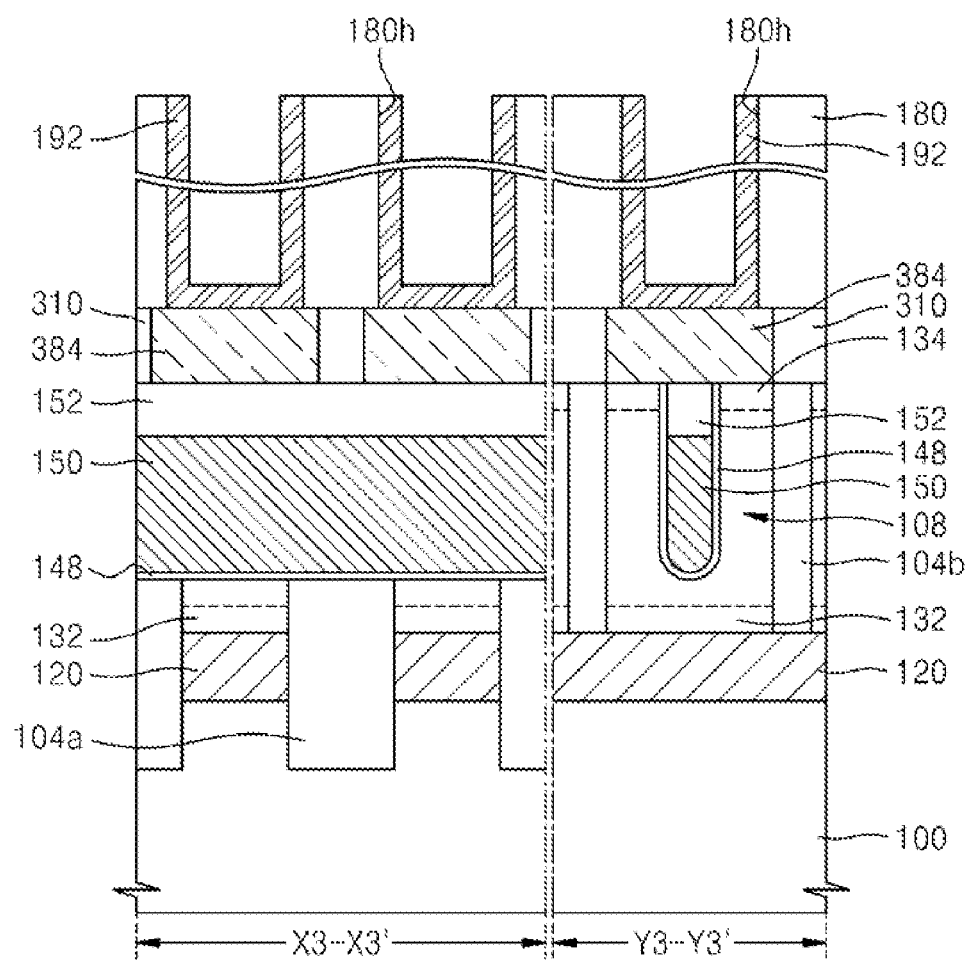

FIGS. 15A through 15C are cross-sectional views sequentially illustrating a method of manufacturing a semiconductor device 1200 of FIGS. 3A and 3B, according to an embodiment of the inventive concept.

FIGS. 15A through 15C illustrate cross-sectional views of the semiconductor device 1200 along the cut lines X3-X3' and Y3-Y3' of FIG. 3A as shown in FIG. 3B.

Like reference numerals in FIGS. 15A through 15C denote like elements in FIGS. 14A through 14O. In this regard, detailed descriptions of the common elements are omitted.

Referring to FIG. 15A, interlayer insulating film patterns 310, in which a plurality of openings 310h are formed, are formed on the structure obtained through steps described with reference to FIGS. 14A through 14L.

The capping layer 152 and the second source/drain area 134 disposed on both sides of the capping layer 152 are each exposed through the plurality of openings 310h.

The interlayer insulating film patterns 310 may include an oxide film.

Referring to FIG. 15B, a conductive material is filled in the plurality of openings 310h, thereby forming a plurality of conductive landing pads 384.

The conductive landing pads 384 may include conductive polysilicon, a metal such as tungsten W, or a metal nitride such as TiN. In this case, to form the conductive landing pads 384, conductive layers are formed on the capping layer 152 and the second source/drain area 134 exposed through the plurality of openings 310h and the interlayer insulating film patterns 310, and the conductive layers are etched back until the interlayer insulating film patterns 310 are exposed to form the conductive landing pads 384 in the plurality of openings 310h.

In addition, the conductive landing pads 384 may include conductive monocrystalline silicon formed through a selective epitaxial growth (SEG) process.

Referring to FIG. 15C, the sacrificial insulating film patterns 180, including a plurality of storage node holes 180h to expose the plurality of conductive landing pads 384, are formed on the interlayer insulating film patterns 310. Then, the plurality of lower electrodes 192 which contact the plurality of conductive landing pads 384 are formed in the plurality of storage node holes 180h.

The dielectric film 194 and the upper electrode 196 are each formed on the plurality of lower electrodes 192 using processes described above with reference to FIGS. 14N and 14O, thereby forming the plurality of capacitors 190.

FIGS. 16A through 16H are cross-sectional views sequentially illustrating a method of manufacturing a semiconductor device 1300 of FIGS. 4A and 4B, according to an embodiment of the inventive concept.

FIGS. 16A through 16H illustrate cross-sectional views of the semiconductor device 1300 along cut lines X4-X4', YA4-YA4' and YB4-YB4' of FIG. 4A as shown in FIG. 4B.

Like reference numerals in FIGS. 16A through 16H denote like elements in FIGS. 14A through 14O. In this regard, detailed descriptions of the common elements are omitted.

Figure 16A:
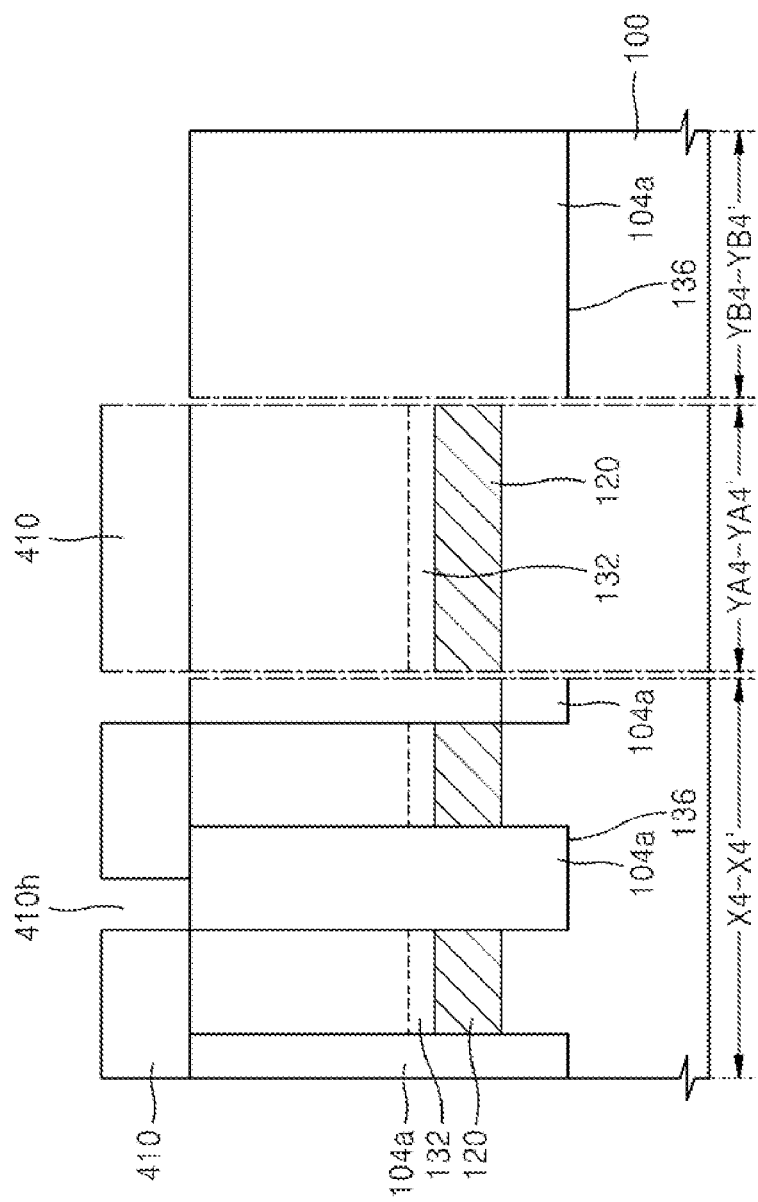
FIGS. 16A through 16H are cross-sectional views illustrating a method of manufacturing the semiconductor device of FIGS. 4A and 4B, according to another embodiment of the inventive concept.

Referring to FIG. 16A, a plurality of first isolation portions 104a, a plurality of buried bit lines 120, and a plurality of first source/drain area 132 are formed on the substrate 100 through steps described with reference to FIGS. 14A through 14C. Then, mask patterns 410, in which a plurality of openings 410h are formed to expose a portion of the plurality of first isolation portions 104a, are formed in each of the plurality of first isolation portions 104a.

Some portions of the plurality of buried bit lines 120 may be the first bit line portion 422 of the buried bit line 420 illustrated in FIGS. 4A and 4B, as will be described later with reference to FIG. 16D.

The mask patterns 410 may include a material which may provide etching selectivity for the first isolation portions 104a. For example, when the first isolation portions 104a include an oxide film, the mask patterns 410 may include a nitride film, a polysilicon film, or a combination thereof.

Figure 16B:
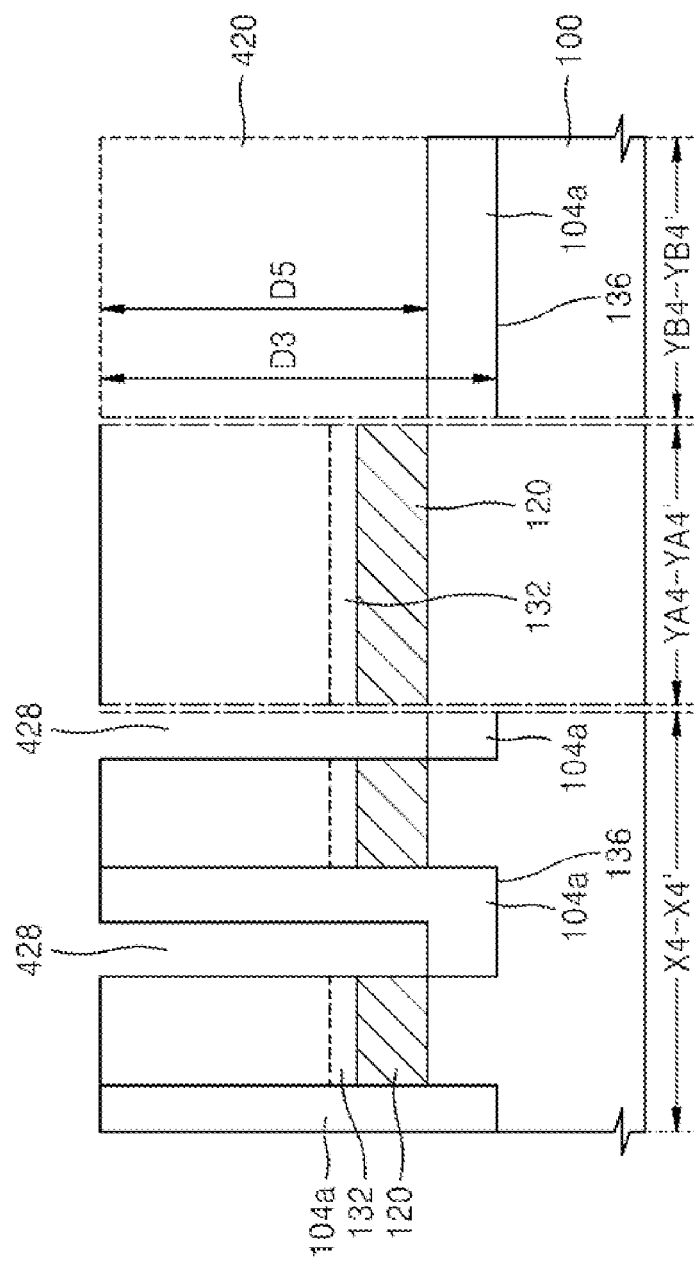

Referring to FIG. 16B, the exposed portions of the first isolation portions 104a are etched using the mask patterns 410 as an etching mask to form a plurality of fourth trenches 428 having a fifth depth D5 that is less than the third depth D3 of the plurality of first trenches 136. The sidewalls of the buried bit lines 120 are exposed in the fourth trenches 428.

Then, the mask patterns 410 are removed.

Figure 16C:
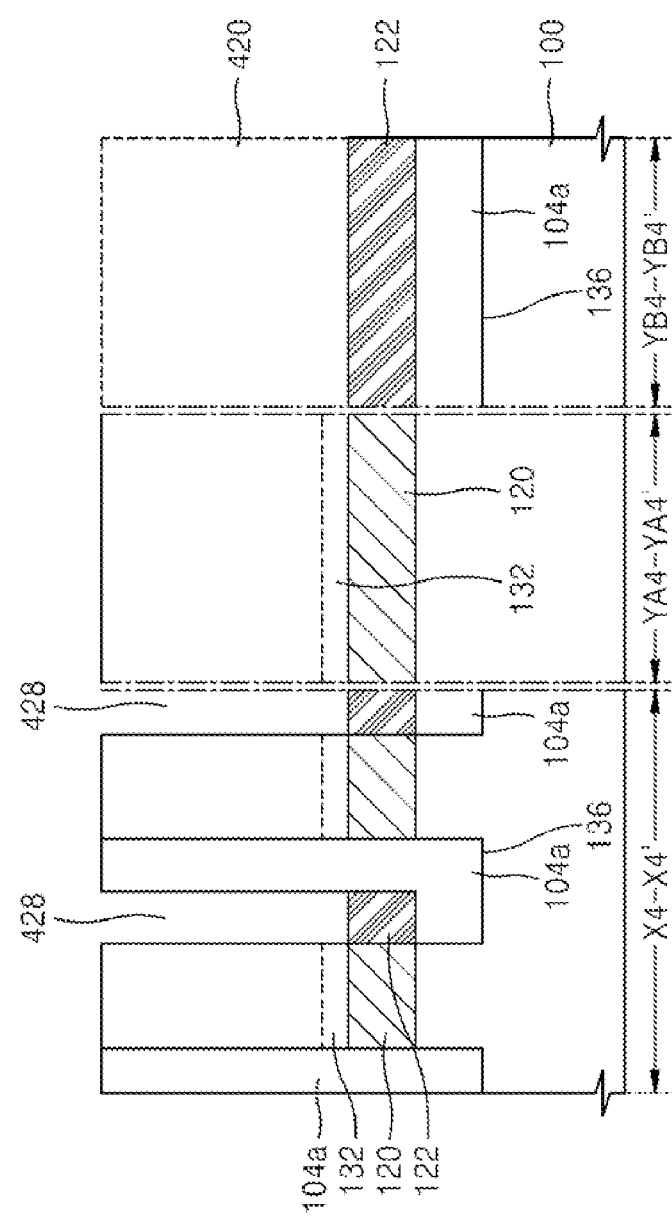

Referring to FIG. 16C, a buried conductive layer 122 having a predetermined thickness is formed at the bottom of the fourth trenches 428. The buried conductive layer 122 may form the second bit line portion 424 of the buried bit line 420 illustrated in FIGS. 4A and 4B.

The buried conductive layer 122 is formed to cover the sidewalls of the buried bit lines 120 which are exposed in the fourth trenches 428. After the buried conductive layer 122 is formed, the upper portion of the fourth trenches 428 above the buried conductive layer 122 remains empty.

To form the buried conductive layer 122, a conductive layer, which fills the fourth trenches 428, is formed on the first isolation portions 104a and the substrate 100 and then the conductive layer is etched back, thereby forming the buried conductive layer 122 in the fourth trenches 428.

The buried conductive layer 122 may include a metal or metal nitride. For example, the buried conductive layer 122 may include W or WN.

Figure 16D:
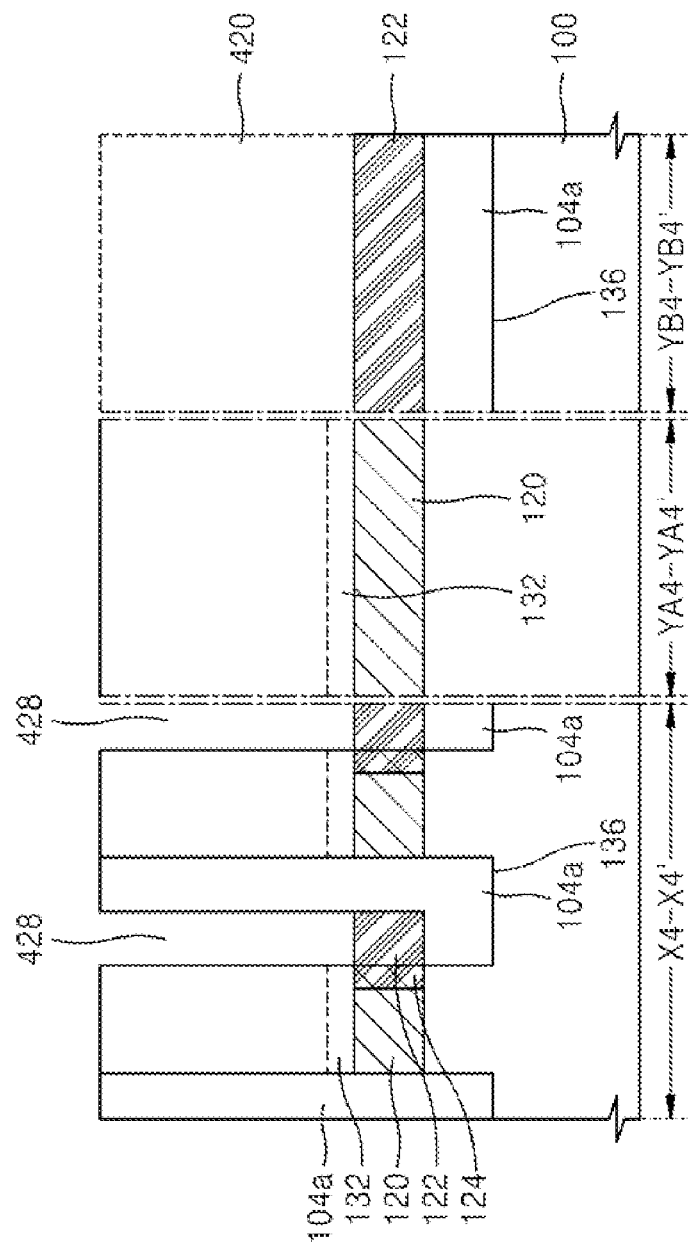

Referring to FIG. 16D, a silicide reaction of Si in the buried bit lines 120 and a metal component in the buried conductive layer 122 is induced to form a metal silicide layer 124 between the buried bit lines 120 and the buried conductive layer 122. The metal silicide layer 124 is formed after a part of the metal diffuses from the sidewall of the buried conductive layer 122 in the buried bit lines 120. The metal silicide layer 124 may include, for example, tungsten silicide.

The width of the buried bit lines 120 after the metal silicide layer 124 is formed is less than the width of the buried bit lines 120 before the metal silicide layer 124 is formed. The buried reduced width bit lines 120 may form the first bit line portion 422 of the buried bit line 420 illustrated in FIGS. 4A and 4B. Also, the metal silicide layer 124 may form the third bit line portion 426 of the buried bit line 420, and the buried conductive layer 122 may form the third bit line portion 426 of the buried bit line 420, illustrated in FIGS. 4A and 4B.

Figure 16E:
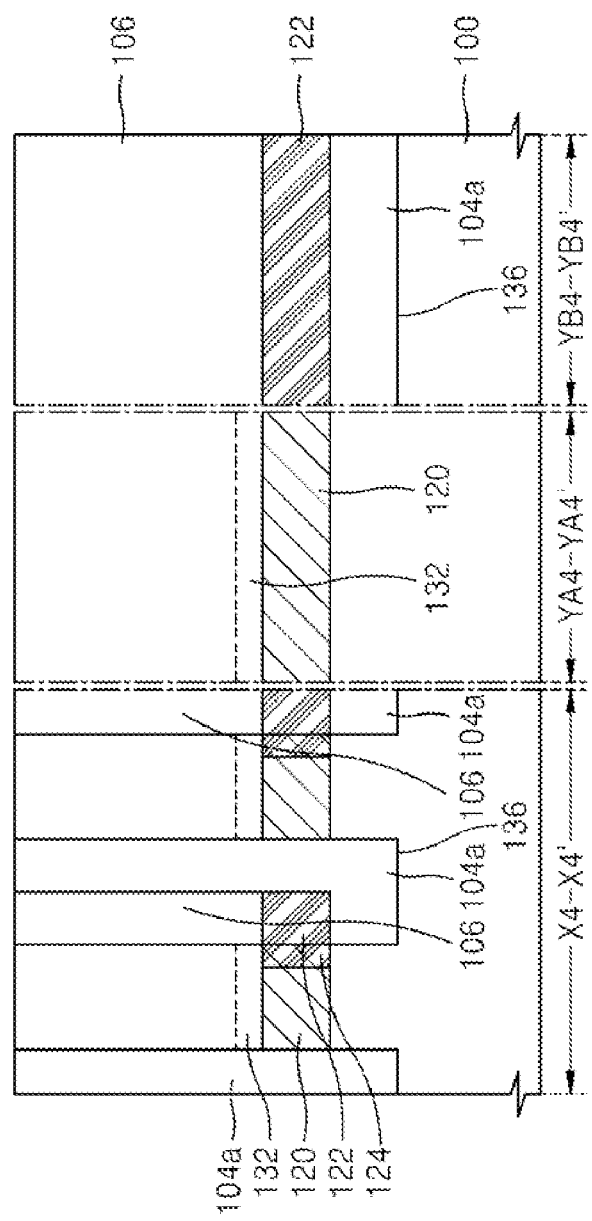

Referring to FIG. 16E, an insulating material is deposited on the substrate 100 to completely fill the plurality of fourth trenches 428 and the deposited insulating material is planarized until the upper surface of the substrate 100 is exposed, forming a plurality of third isolation portions 106 that fill the plurality of fourth trenches 428.

In FIG. 4A, the width of the active area 108 in the first direction ('x' direction in FIG. 4A) is defined by the first isolation portions 104a and the third isolation portions 106.

The insulating material that forms the third isolation portions 106 may include an oxide, such as TOSZ.

Figure 16F:
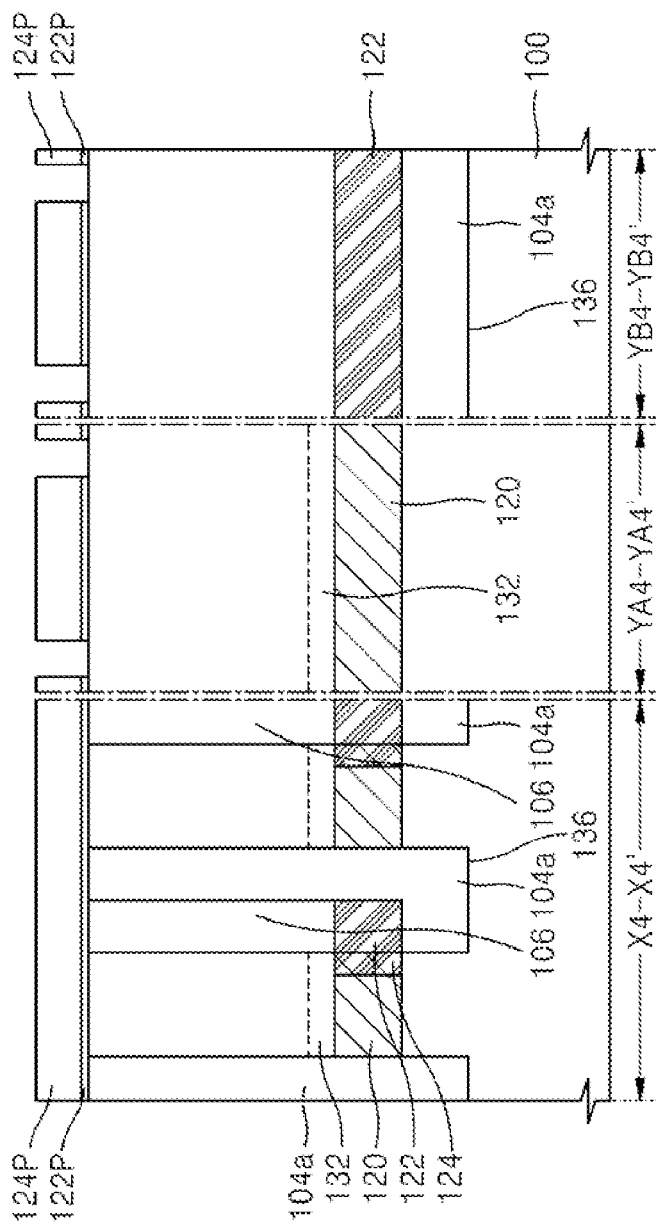

Referring to FIG. 16F, to expose a portion of the substrate 100, the second pad oxide film pattern 122p and the second mask pattern 124p are formed in a stacked structure on the first isolation portions 104a, the third isolation portions 106, and the substrate 100. A process of forming the stacked structure of the second pad oxide film pattern 122p and the second mask pattern 124p is described with reference to FIG. 14D.

Figure 16G:
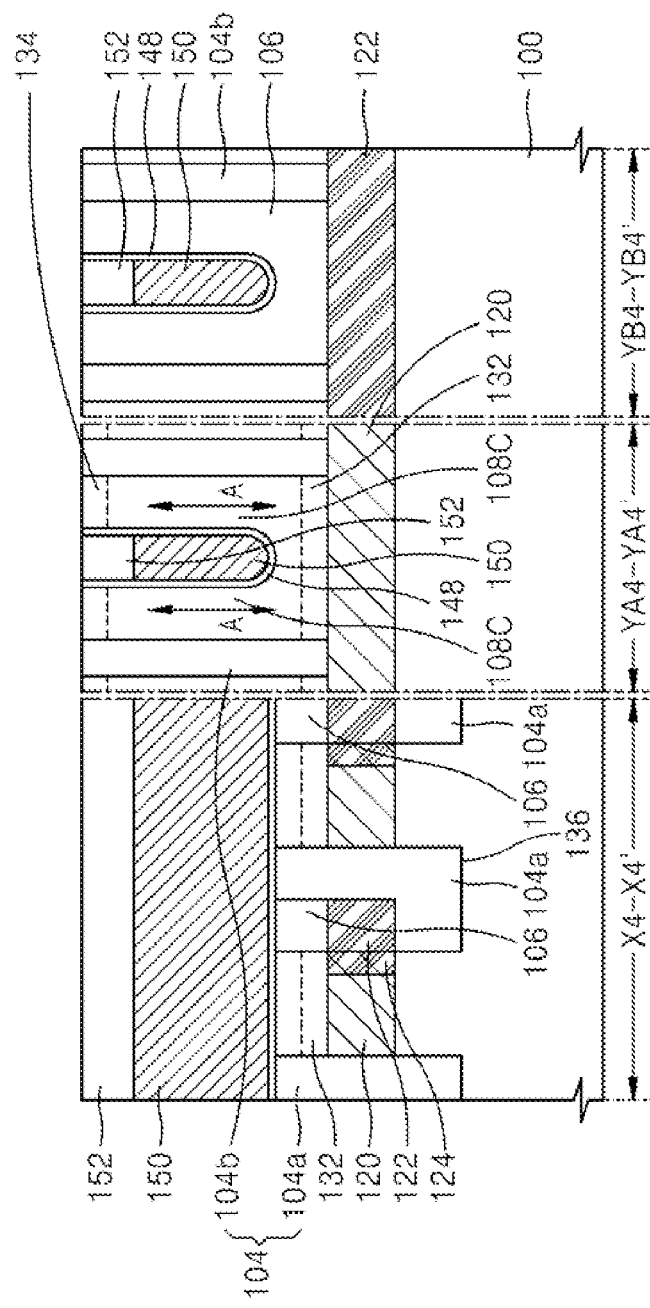

Referring to FIG. 16G, the second source/drain area 134 is formed on the active area 108 using steps described with reference to FIGS. 14E through 14L.

Figure 16H:
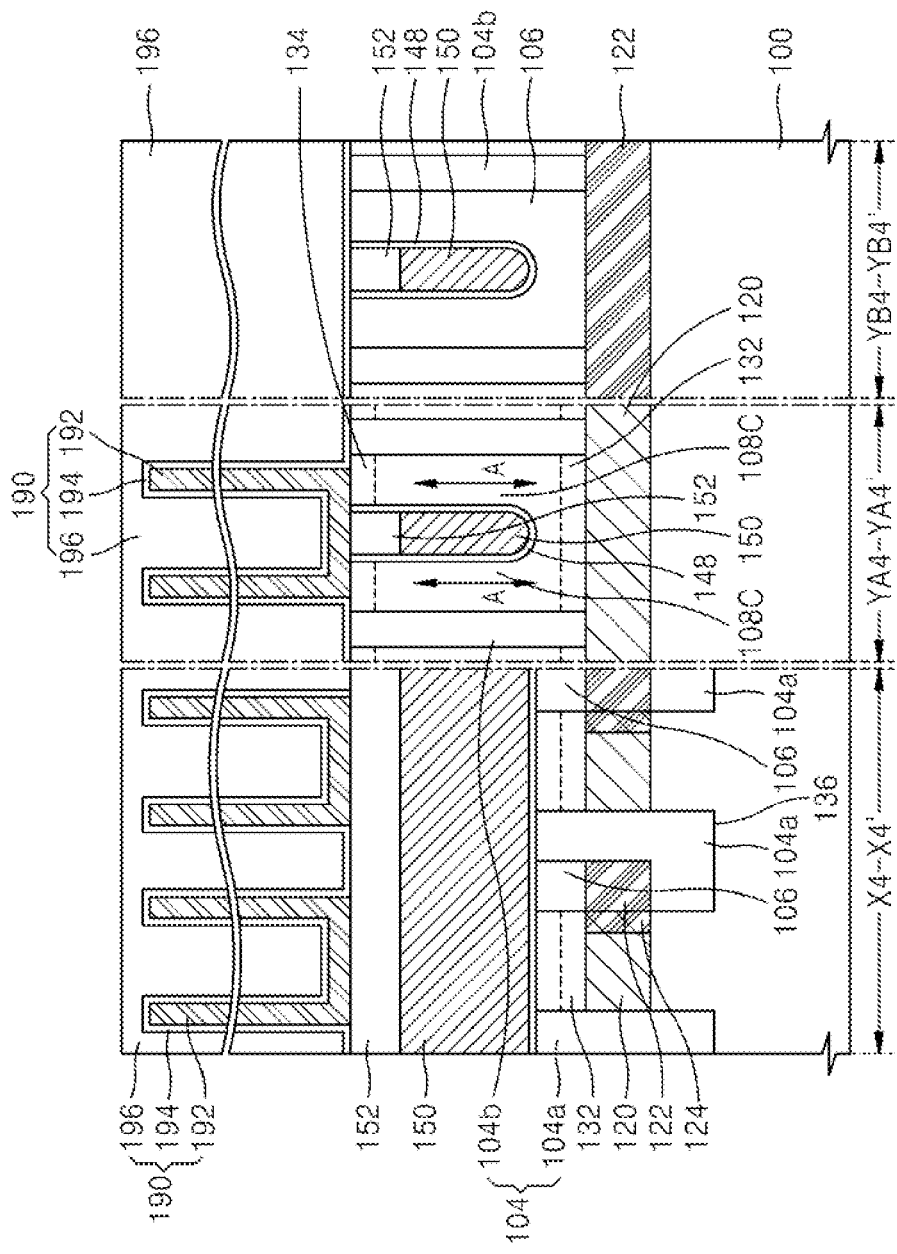

Referring to FIG. 16H, steps described with reference to FIGS. 14M through 14O are sequentially performed to form the capacitors 190 on the structure of FIG. 16G.

Figure 17:
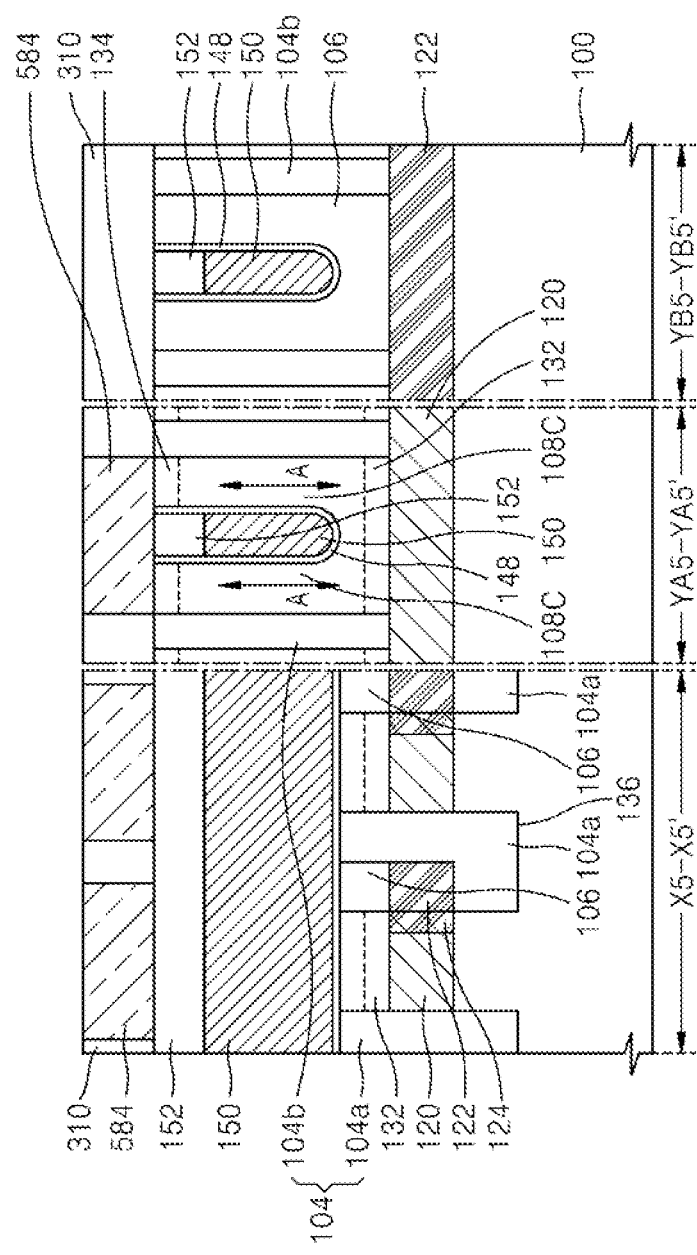
FIG. 17 is a cross-sectional view illustrating a method of manufacturing the semiconductor device of FIGS. 5A and 5B, according to another embodiment of the inventive concept.

FIG. 17 is a cross-sectional view sequentially illustrating a method of manufacturing a semiconductor device 1400 of FIGS. 5A and 5B, according to an embodiment of the inventive concept.

FIG. 17 illustrates cross-sectional views of the semiconductor device 1400 along cut lines X5-X5', YA5-YA5', and B5-YB5' of FIG. 5A as shown in FIG. 5B.

Like reference numerals in FIG. 17A denote like elements in FIGS. 14A through 14O, FIGS. 15A through 15C, and FIGS. 16A through 16H. In this regard, detailed descriptions of the common elements are omitted.

Referring to FIG. 17, the interlayer insulating film patterns 310 are formed using steps described with reference to FIGS. 15A and 15B on the structure obtained through steps described with reference to FIGS. 16A through 16G.

Then, the conductive landing pads 584 are formed on the second source/drain area 134 exposed through the interlayer insulating film patterns 310 using a method of forming the conductive landing pads 384 described with reference to FIG. 15B.

Next, the plurality of lower electrodes 192 which contact the conductive landing pads 584 are formed using a method described with reference to FIG. 15C. Then, the dielectric film 194 and the upper electrode 196 are each formed on the plurality of lower electrodes 192, thereby forming the structure illustrated in FIGS. 5A and 5B, which includes the plurality of capacitors 190.

FIGS. 18A through 18D are cross-sectional views sequentially illustrating a method of manufacturing a semiconductor device 1500 of FIGS. 6A and 6B, according to an embodiment of the inventive concept.

FIGS. 18A through 18D illustrate cross-sectional views of the semiconductor device 1500 along cut lines X6-X6', YA6-YA6' and YB6-YB6' of FIG. 6A as shown in FIG. 6B.

Like reference numerals in FIGS. 18A through 18D denote like elements in FIGS. 14A through 14O, FIGS. 15A through 15C, and FIGS. 16A through 16H. In this regard, detailed descriptions of the common elements are omitted.

Figure 18A:
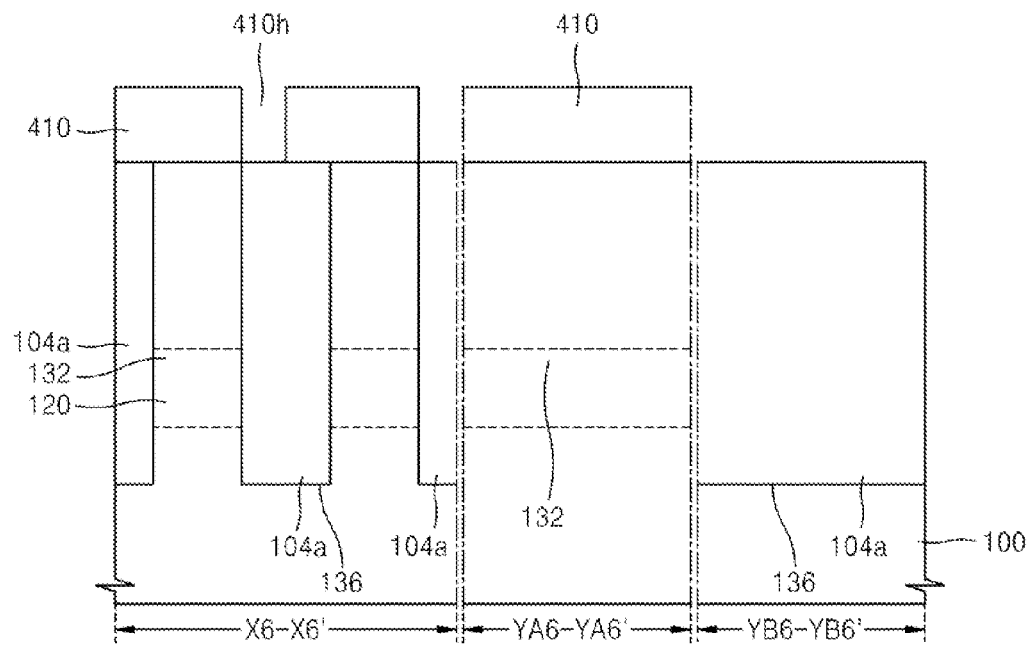
FIGS. 18A through 18D are cross-sectional views illustrating a method of manufacturing the semiconductor device of FIGS. 6A and 6B, according to another embodiment of the inventive concept.

Referring to FIG. 18A, the plurality of first isolation portions 104a and the plurality of first source/drain areas 132 are formed on the substrate 100 through processes similar to those described with reference to FIGS. 14A through 14C. In the current embodiment, a process of forming the first ion implantation area 120BL described with reference to FIG. 14A is omitted. As a result, the plurality of first source/drain areas 132 are interposed between the plurality of first isolation portions 104a in the substrate 100, as illustrated in FIG. 18A.

Then, the mask patterns 410, in which the plurality of openings 410h are formed to expose a portion of the plurality of first isolation portions 104a, are formed in each of the plurality of first isolation portions 104a using a method described with reference to FIG. 16A.

Figure 18B:
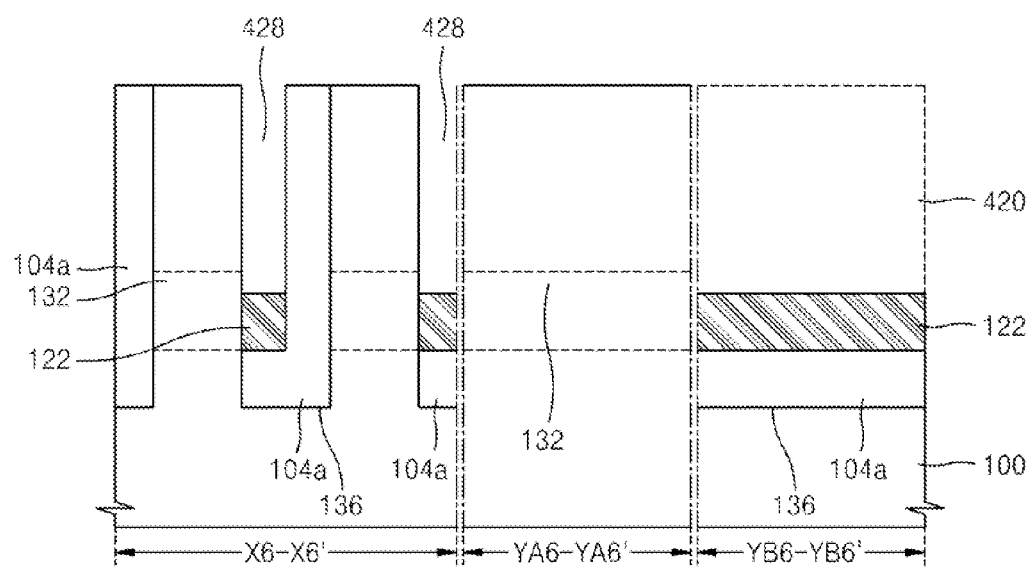

Referring to FIG. 18B, the plurality of fourth trenches 428 are formed in the plurality of first trenches 136, and the buried conductive layer 122 having a predetermined thickness is formed at the bottom of the fourth trenches 428 using methods described with reference to FIGS. 16B and 16C. The buried conductive layer 122 may be formed to contact the first source/drain area 132 in the fourth trenches 428. The buried conductive layer 122 may form the first bit line portion 524 of the buried bit line 520 illustrated in FIGS. 6A and 6B.

Figure 18C:
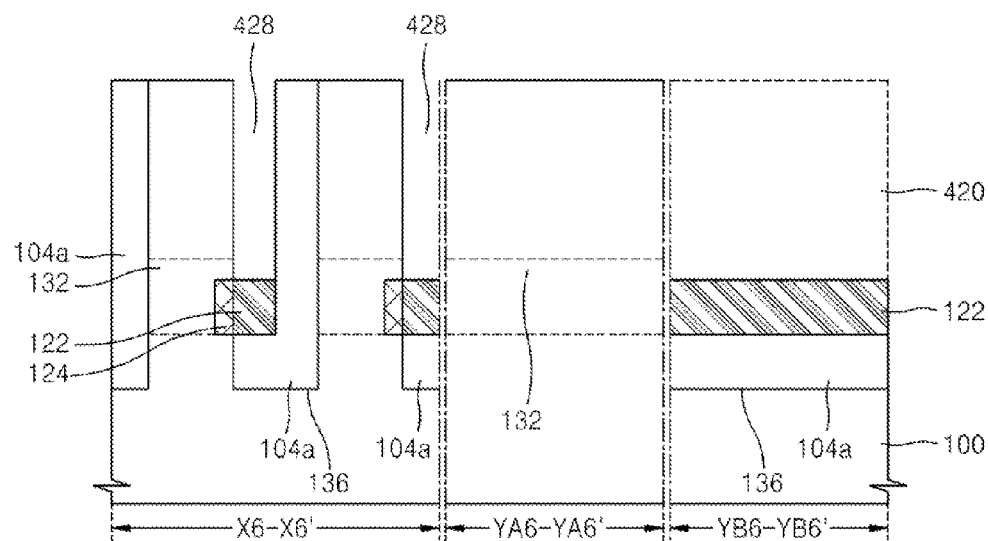

Referring to FIG. 18C, a silicide reaction of Si in the first source/drain area 132 and a metal component in the buried conductive layer 122 is induced to form the metal silicide layer 124 between the first source/drain area 132 and the buried conductive layer 122 using a method described with reference to FIG. 16D. The metal silicide layer 124 is formed after a part of the metal diffuses from the sidewall of the buried conductive layer 122 in the first source/drain area 132. The metal silicide layer 124 may include, for example, tungsten silicide.

The metal silicide layer 124 may form the second bit line portion 526 of the buried bit line 520 illustrated in FIGS. 6A and 6B.

Figure 18D:
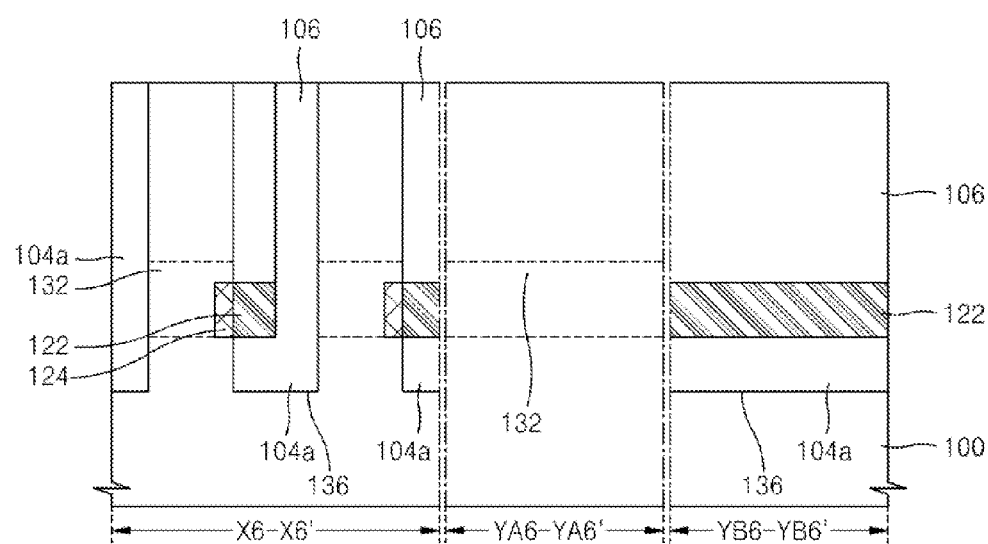

Referring to FIG. 18D, the third isolation portions 106 that fill the plurality of fourth trenches 428 are formed using a method described with reference to FIG. 16E.

Then, steps described with reference to FIGS. 16F through 16G are sequentially performed.

A process of forming a semiconductor device 1600 illustrated in FIGS. 7A and 7B is the same as a process of forming a semiconductor device 1500 described with reference to FIGS. 18A through 18D. A difference between process of forming a semiconductor device 1600 illustrated in FIGS. 7A and 7B and a process of forming a semiconductor device 1500 described with reference to FIGS. 18A through 18D is that the interlayer insulating film patterns 310 and the conductive landing pads 684 are further formed using a method described with reference to FIG. 17 before forming the sacrificial insulating film patterns 180 needed to form the lower electrodes 192. Here, a process of forming the conductive landing pads 684 is the same as that of forming the conductive landing pads 384 in FIG. 15B.

FIGS. 19A through 19I are cross-sectional views sequentially illustrating a method of manufacturing a semiconductor device 1700 of FIGS. 8A and 8B, according to an embodiment of the inventive concept.

FIGS. 19A through 19I illustrate cross-sectional views of the semiconductor device 1700 along cut lines X8-X8' and Y8-Y8' of FIG. 8A as shown in FIG. 8B.

Like reference numerals in FIGS. 19A through 19I denote like elements in FIGS. 14A through 14O. In this regard, detailed descriptions of the common elements are omitted.

Figure 19A:
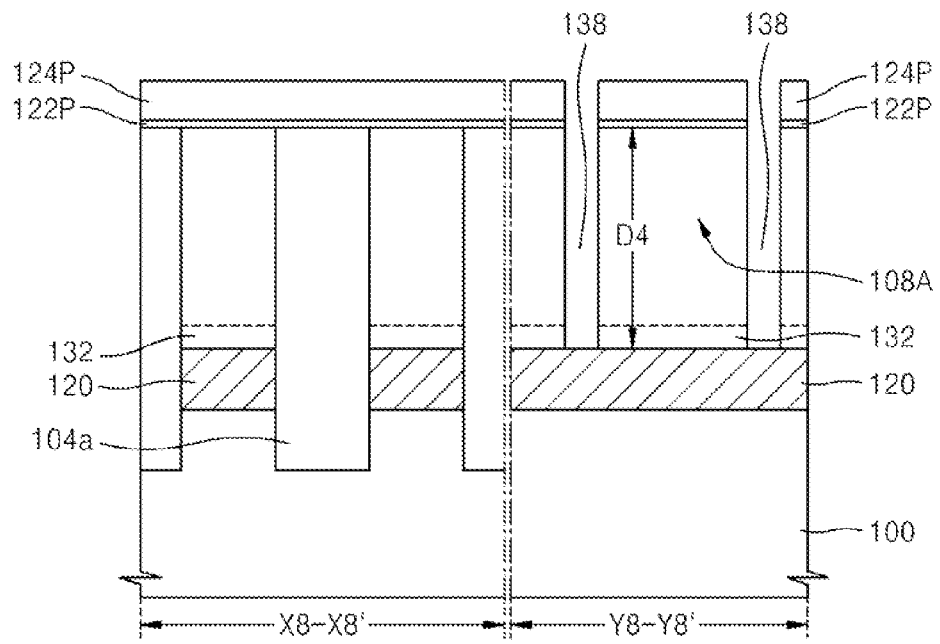
FIGS. 19A through 19I are cross-sectional views illustrating a method of manufacturing the semiconductor device of FIGS. 8A and 8B, according to another embodiment of the inventive concept.

Referring to FIG. 19A, the plurality of second trenches 138 are formed on the substrate 100 through steps described with reference to FIGS. 14A through 14E.

Figure 19B:
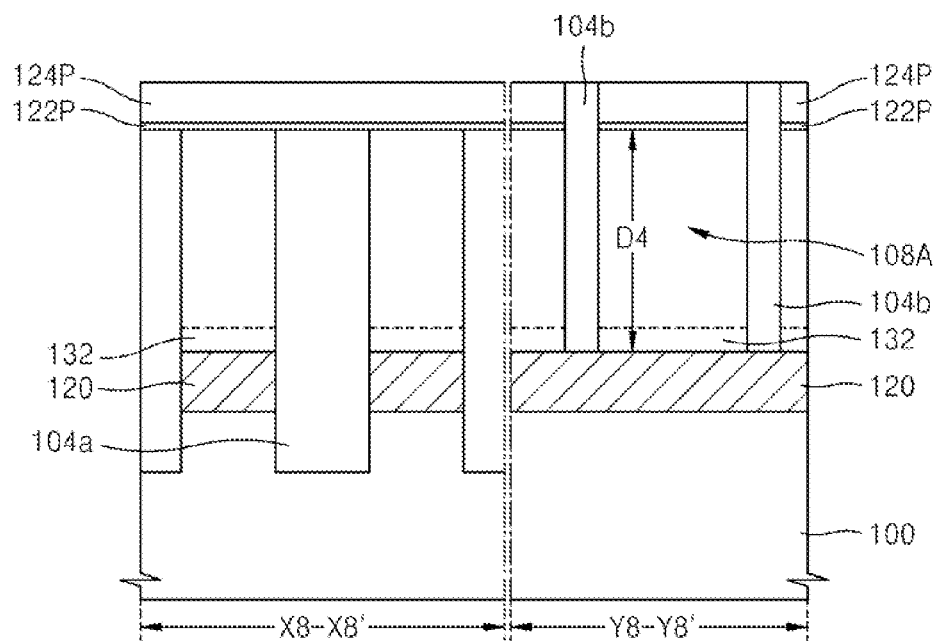

Referring to FIG. 19B, the plurality of second isolation portions 104b are formed in the plurality of second trenches 138 using a method described with reference to FIG. 14F.

The plurality of active areas 108A are defined by the plurality of first isolation portions 104a and the plurality of second isolation portions 104b.

Figure 19C:
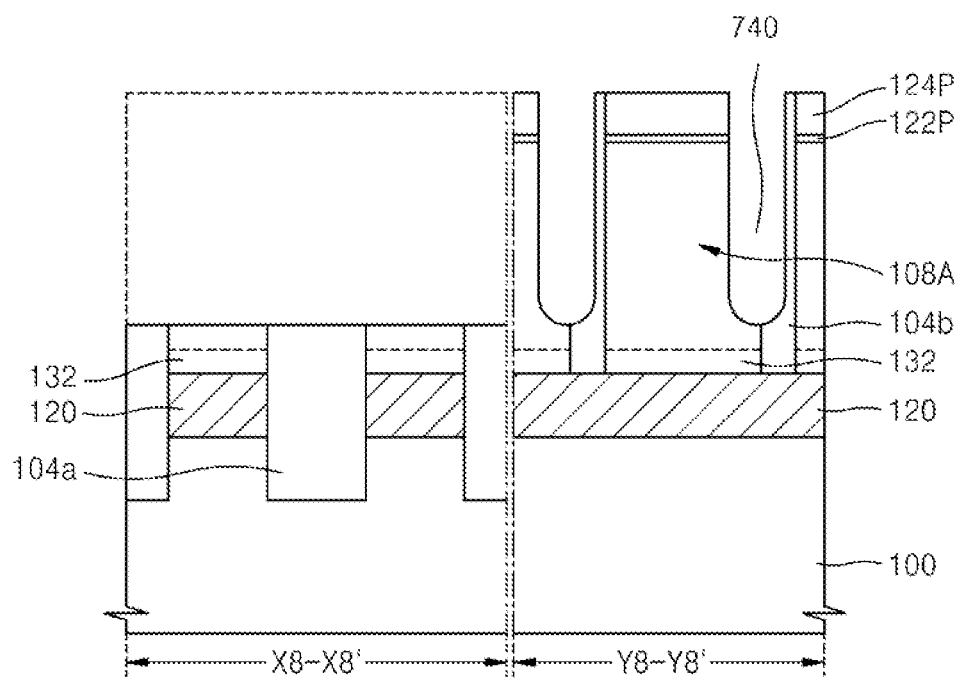

Referring to FIG. 19C, a mask pattern (not illustrated) exposes the stacked structure of the second pad oxide film pattern 122p and the second mask pattern 124p and a portion of the plurality of second isolation portions 104b. This mask pattern is used as an etching mask to etch the exposed stacked structure of the second pad oxide film pattern 122p and the second mask pattern 124p and a portion of the plurality of second isolation portions 104b. Then, the exposed substrate 100 and the plurality of second isolation portions 104b are continuously etched, forming third trenches 740 for forming word lines which simultaneously expose the active areas 108A and the second isolation portions 104b.

Figure 19D:
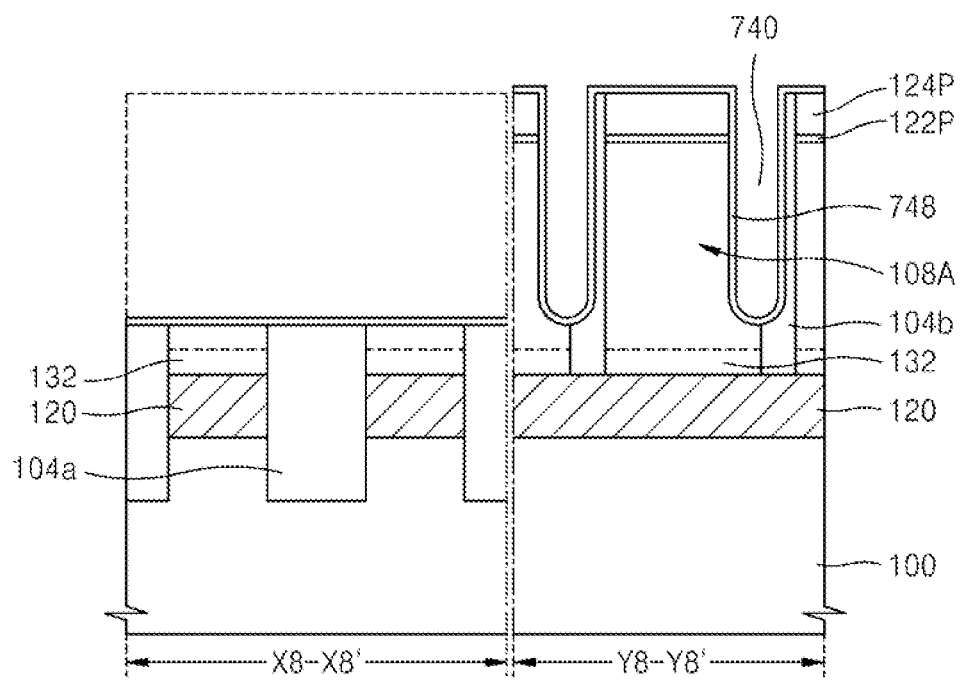

Referring to FIG. 19D, the gate dielectric films 748 are formed on the inner walls of the third trenches 740. For example, the gate dielectric films 748 may include a thermal oxide film.

Figure 19E:
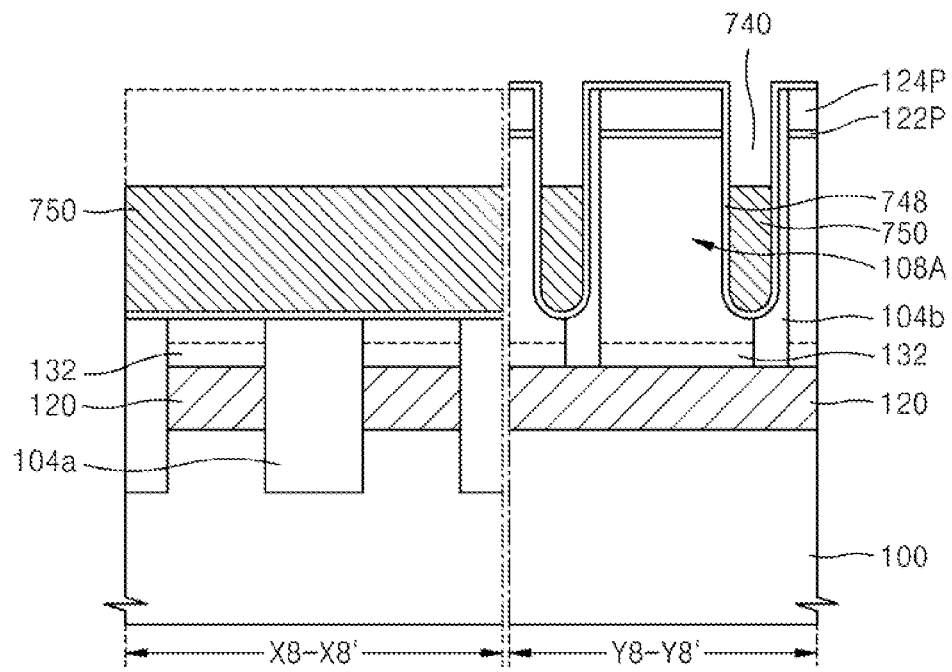

Referring to FIG. 19E, the buried word lines 750 are formed on the gate dielectric films 748 in the third trenches 740.

Upper surfaces of the buried word lines 750 are lower than the upper surface of the substrate 100 in the active area 108A. After the buried word lines 750 are formed, the upper portion of the third trenches 740 above the buried word lines 750 remains empty. The buried word lines 750 extend to be parallel to the plurality of second isolation portions 104b.

To form the buried word lines 750, a process of forming the buried word lines 150 described with reference to FIG. 14H may be used. The material for forming the buried word lines 750 is the same as the material for forming the buried word lines 150 described with reference to FIG. 14H.

Figure 19F:
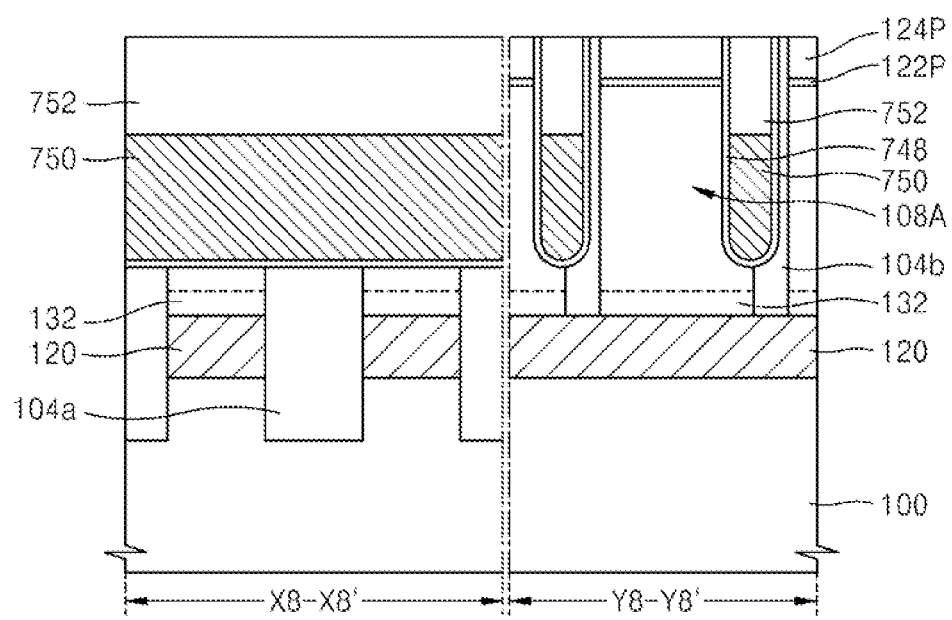

Referring to FIG. 19F, to completely fill the third trenches 740, an insulating layer is formed on the buried word lines 750, the second mask patterns 124P, and the gate dielectric films 748, and then CMP or an etch back process is performed on the insulating layer until the upper surfaces of the second mask patterns 124P are exposed, forming a capping layer 752 which completely fills the third trenches 740.

The insulating layer which forms the capping layer 752 may include an oxide or nitride.

Figure 19G:
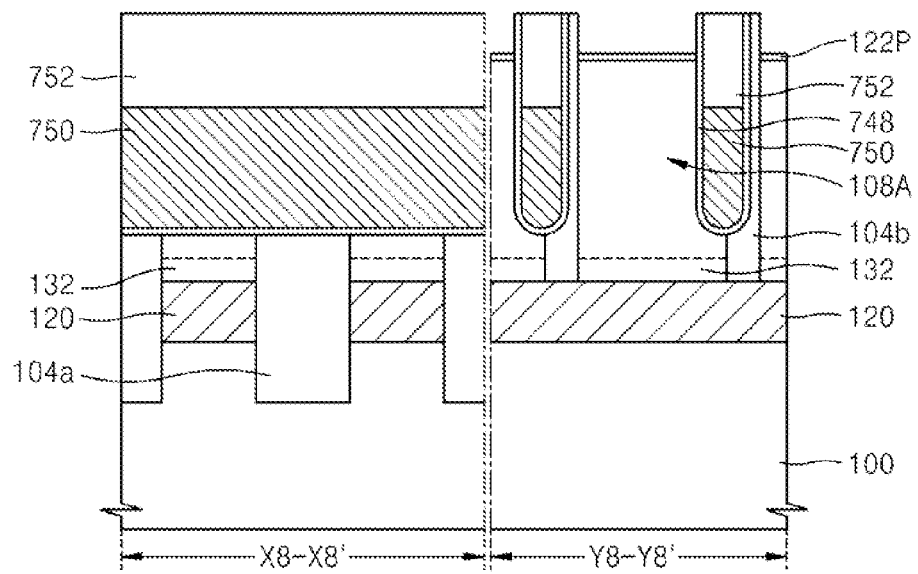

Referring to FIG. 19G, the second mask pattern 124p is removed from the structure of FIG. 19F in which the capping layer 752 is formed to expose the second pad oxide film pattern 122p.

Figure 19H:
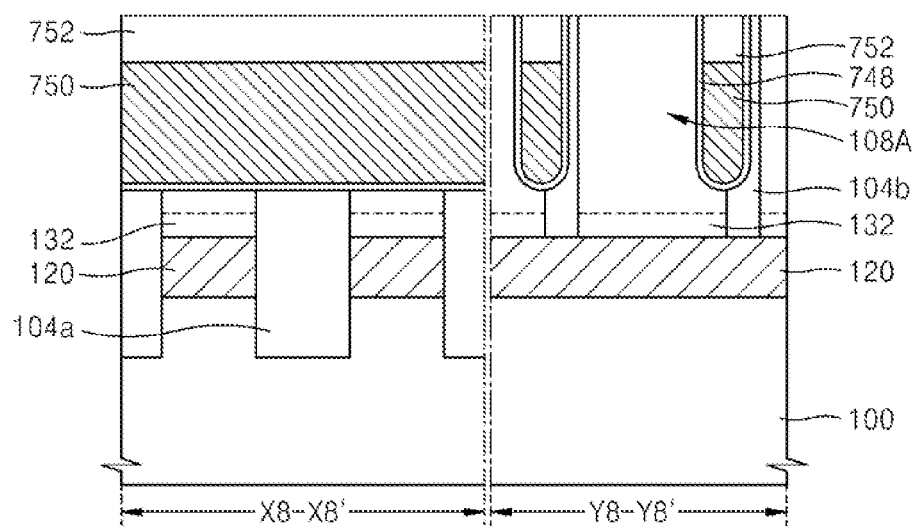

Referring to FIG. 19H, the second pad oxide film pattern 122p may be removed using wet etching. When the second isolation portions 104b and the capping layer 752 each include an oxide film, the second isolation portions 104b and the capping layer 752 are etched a predetermined thickness from the upper surfaces thereof when the second pad oxide film pattern 122p is removed, and thus the upper surfaces of the second isolation portions 104b and the capping layer 752 have the same level as that of the level of the upper surface of the substrate 100.

The second pad oxide film pattern 122p, the second isolation portions 104b, and the capping layer 752 may be wet etched using a process described with reference to FIG. 14K.

Figure 19I:
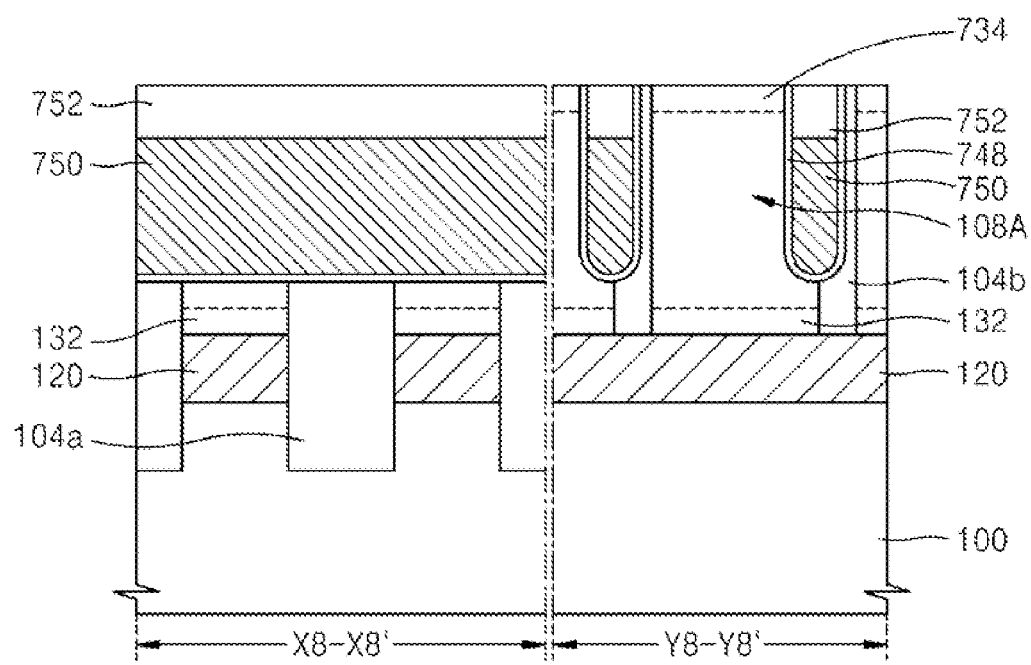

Referring to FIG. 19I, impurity ions are implanted from the upper surface of the substrate 100 and a second source/drain area 734 is formed on the active area 108A.

An ion implantation process for forming the second source/drain area 734 may be performed simultaneously with an ion implantation process for forming a source/drain area of a transistor (not illustrated) for a peripheral circuit formed in a peripheral area (not illustrated) of the substrate 100.

A process of forming the second source/drain area 734 is similar to a process of forming the second source/drain area 134 described with reference to FIG. 14L.

Then, steps described with reference to FIGS. 14M through 14O are sequentially performed.

A surface area of the second source/drain area 734 formed on the active area 108A on the upper surface of the substrate 100 may increase relative to the surface area of second source/drain areas formed in other embodiments. For example, the surface area occupied by the second source/drain area 734 in the active area 108A may be greater than the surface area occupied by the second source/drain area 134 in the active area 108, including two active areas spaced apart from each other, formed during a process illustrated in FIG. 14L. In this case, the contact area between the second source/drain area 734 and the lower electrodes 192 formed on the second source/drain area 734 increases and as a result, resistance therebetween may be reduced.

A semiconductor device 1800 of FIGS. 9A and 9B, a semiconductor device 1900 of FIGS. 10A and 10B, a semiconductor device 2000 of FIGS. 11A and 11B, a semiconductor device 2100 of FIGS. 12A and 12B, and a semiconductor device 2200 of FIGS. 13A and 13B may be manufactured through processes of manufacturing semiconductor devices described with reference to FIGS. 14A through 14O, FIGS. 15A through 15C, FIGS. 16A through 16H, FIG. 17, FIGS. 18A through 18D, and FIGS. 19A through 19I, or combinations thereof.

According to the inventive concept, a highly-scaled integrated semiconductor device may be realized without having a separate conductive contact plug for electrically connecting the source/drain area with the bit lines and a separate conductive contact plug for electrically connecting the source/drain area with the lower electrode of the capacitor. Accordingly, possibility of causing defects due to short circuits between conductive layers by a repeating pitch may be reduced and high integration may be easily accomplished, thereby providing high reliability.

While embodiments of the inventive concept have been particularly shown and described with reference to exemplary embodiments thereof, it will be understood that various changes in form and details may be made therein without departing from the spirit and scope of the following claims.

What is claimed is:

1. A semiconductor device comprising:
   an isolation layer for defining a plurality of active areas of a substrate, wherein the isolation layer is disposed on the substrate;
   a plurality of buried word lines having upper surfaces lower than the upper surfaces of the active areas, being surrounded by the active areas, and extending in a first direction parallel to a main surface of the substrate;
   a gate dielectric film interposed between the buried word lines and the active areas; and
   a plurality of buried bit lines having upper surfaces lower than the upper surfaces of the plurality of buried word lines, being parallel to the main surface of the substrate, and extending in a second direction that differs from the first direction,
   wherein the isolation layer has a network structure comprising a plurality of first isolation portions and a plurality of second isolation portions,
   the plurality of first isolation portions extending in the second direction and the plurality of second isolation portions crossing the plurality of first isolation portions and extending in the first direction, and
   the distance from the upper surfaces of the active areas to the lower surfaces of the first isolation portions is greater than the distance from the upper surfaces of the active areas to the lower surfaces of the second isolation portions.

2. The semiconductor device of claim 1, wherein the width of the first isolation portions is greater than the width of the second isolation portions.

3. The semiconductor device of claim 1, wherein, when viewed from the upper surface of the substrate, any one buried bit line of the plurality of buried bit lines overlaps the plurality of active areas arranged in a line in the second direction and the plurality of second isolation portions arranged in a line and interposed between the plurality of active areas.

4. The semiconductor device of claim 1, wherein, when viewed from the upper surface of the substrate, any one buried bit line selected from the plurality of buried bit lines comprises a first bit line portion and a second bit line portion,
   the first bit line portion being overlapped with the plurality of active areas arranged in a line in the second direction and the plurality of second isolation portions arranged in a line and interposed between the plurality of active areas, and
   the second bit line portion extending in the first direction from the first bit line portion and being surrounded by the first isolation portions.

5. The semiconductor device of claim 4, wherein the first bit line portion and the second bit line portion comprise materials that differ from each other.

6. The semiconductor device of claim 5, wherein the buried bit lines further comprise a metal silicide layer interposed between the first bit line portion and the second bit line portion.

7. The semiconductor device of claim 1, further comprising:
- a first source/drain area in the active areas connected to the buried bit lines;
- a second source/drain area formed in an upper surface of the active areas; and
- a channel area formed in the active areas between the first source/drain area and the second source/drain area.

8. The semiconductor device of claim 7, further comprising capacitors each comprising lower electrodes formed on the substrate and electrically connected to the second source/drain area.

9. The semiconductor device of claim 8, wherein both sidewalls of the buried word lines are surrounded by the active areas.

10. The semiconductor device of claim 9, wherein the upper surface of any one of the plurality of active areas comprises a first upper surface and a second upper surface disposed at both sides of the buried word lines and spaced apart from each other,
- wherein each of the upper surfaces of the active areas extends to the isolation layer from gate dielectric films formed on the sidewalls of the buried word lines, and
- wherein said second source/drain area is formed in each of the first and second surfaces.

11. The semiconductor device of claim 8, wherein each of the buried word lines comprises first sidewalls and second sidewalls opposite to the first side walls,
- the first sidewalls being surrounded by the active areas and the second sidewalls being surrounded by the isolation layer.

12. The semiconductor device of claim 11, wherein each of the upper surfaces of the active areas extends to the isolation layer from gate dielectric films formed on the first sidewalls of the buried word lines.

13. The semiconductor device of claim 10, wherein each of the lower electrodes directly contacts the second source/drain area formed on the first upper surface and the second upper surface.

14. The semiconductor device of claim 10, wherein each of the lower electrodes is electrically connected to the second source/drain area formed on the first upper surface and the second upper surface through conductive landing pads formed on the buried word lines.

15. The semiconductor device of claim 11, wherein each of the lower electrodes directly contacts the second source/drain area on the upper surfaces of the active areas.

16. The semiconductor device of claim 11, wherein each of the lower electrodes is electrically connected to the second source/drain area formed on the upper surfaces of the active areas through conductive landing pads formed on the buried word lines.

17. The semiconductor device of claim 1, wherein the width of the buried word lines in the second direction is less than the width of the buried bit lines in the first direction.

18. The semiconductor device of claim 1, wherein the width of the active areas in the first direction is less than a repeating pitch of the plurality of buried word lines in the second direction.

19. The semiconductor device of claim 5, wherein said first bit line portion is an ion implantation area in the substrate into which ion impurities are implanted.

20. The semiconductor device of claim 1, wherein the buried bit lines comprise a metal containing film extending in the first direction from the active areas and surrounded by the isolation layer.

* * * * *